(12) United States Patent
Liao et al.

(10) Patent No.: US 12,235,556 B2
(45) Date of Patent: Feb. 25, 2025

(54) DISPLAY SUBSTRATE, DISPLAY PANEL AND DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Yanping Liao, Beijing (CN); Yingmeng Miao, Beijing (CN); Dong Liu, Beijing (CN); Xibin Shao, Beijing (CN); Peng Jiang, Beijing (CN); Dongchuan Chen, Beijing (CN); Panhui Zhao, Beijing (CN); Jiantao Liu, Beijing (CN); Tao Yang, Beijing (CN); Yingying Qu, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/580,137

(22) PCT Filed: Dec. 23, 2022

(86) PCT No.: PCT/CN2022/141588
§ 371 (c)(1),
(2) Date: Jan. 17, 2024

(87) PCT Pub. No.: WO2024/011858
PCT Pub. Date: Jan. 18, 2024

(65) Prior Publication Data
US 2024/0319552 A1 Sep. 26, 2024

(30) Foreign Application Priority Data
Jul. 12, 2022 (CN) .......................... 202210817485.8

(51) Int. Cl.
G02F 1/1362 (2006.01)
G02F 1/1368 (2006.01)
H01L 27/12 (2006.01)

(52) U.S. Cl.
CPC .... *G02F 1/13629* (2021.01); *G02F 1/136213* (2013.01); *G02F 1/136227* (2013.01);
(Continued)

(58) Field of Classification Search
CPC ................................................... G02F 1/1362
See application file for complete search history.

(56) References Cited

U.S. PATENT DOCUMENTS

2007/0024789 A1* 2/2007 Itou .................. G02F 1/134363
349/139
2011/0149178 A1* 6/2011 Uno .................. G02F 1/136259
348/790

(Continued)

FOREIGN PATENT DOCUMENTS

CN 100466266 C 3/2009
CN 103199094 A 7/2013
(Continued)

*Primary Examiner* — Sang V Nguyen
(74) *Attorney, Agent, or Firm* — Nath, Goldberg & Meyer; Joshua B. Goldberg

(57) ABSTRACT

A display substrate, including: a base substrate; a plurality of data lines on the base substrate; a first insulating layer on a side of the plurality of data lines away from the base substrate; a plurality of gate lines on a side of the first insulating layer away from the plurality of data lines, where extension directions of the gate and data lines are intersected; a second insulating layer on a side of the plurality of gate lines away from the first insulating layer; and a first electrode on a side of the second insulating layer away from the plurality of gate lines, where at least a portion of an orthographic projection of the first electrode on the base substrate is within an region surrounded by orthographic
(Continued)

projections of two adjacent data lines on the base substrate and orthographic projections of two adjacent gate lines on the base substrate.

18 Claims, 46 Drawing Sheets

(52) U.S. Cl.
CPC .......... *G02F 1/1368* (2013.01); *H01L 27/124* (2013.01); *H01L 27/1248* (2013.01); *H01L 27/1255* (2013.01)

(56) References Cited

U.S. PATENT DOCUMENTS

| | | | | |
|---|---|---|---|---|
| 2011/0291126 | A1* | 12/2011 | Nakahara | .......... G02F 1/136213 257/E27.12 |
| 2015/0028341 | A1* | 1/2015 | Sun | ..................... H01L 27/1288 438/151 |
| 2015/0028342 | A1 | 1/2015 | Kim et al. | |
| 2021/0157188 | A1* | 5/2021 | Liu | ........................ G06F 3/0412 |
| 2021/0327958 | A1* | 10/2021 | Li | ............................ H01L 33/42 |
| 2022/0320217 | A1* | 10/2022 | Han | ..................... H10K 59/126 |

FOREIGN PATENT DOCUMENTS

| | | | | |
|---|---|---|---|---|
| CN | 104238207 | A | | 12/2014 |
| CN | 105116648 | A | | 12/2015 |
| CN | 111146267 | A | | 5/2020 |
| CN | 112639598 | A | | 4/2021 |
| CN | 215895193 | U | | 2/2022 |
| CN | 114594639 | | * 6/2022 | ........... G02F 1/1362 |
| CN | 114594639 | A | | 6/2022 |
| CN | 115016185 | A | | 9/2022 |
| TW | I281586 | B | | 5/2007 |

* cited by examiner

DISPLAY SUBSTRATE, DISPLAY PANEL AND DISPLAY DEVICE

This is a National Phase Application filed under 35 U.S.C. 371 as a national stage of PCT/CN2022/141588, filed Dec. 23, 2022, an application claiming benefit of Chinese Application No. 202210817485.8, filed Jul. 12, 2022, the content of each of which is hereby incorporated by reference in its entirety.

CROSS-REFERENCE TO RELATED APPLICATIONS

The present application claims priority of Chinese patent application No. 202210817485.8 entitled "Display Substrate and Display Device" filed with the China National Intellectual Property Administration on Jul. 12, 2022, the entire contents of which is incorporated herein by reference.

TECHNICAL FIELD

The present disclosure relates to the field of display technology, and in particular, to a display substrate, a display panel and a display device.

BACKGROUND

Thin Film Transistor Liquid Crystal Display (TFT-LCD) has seen a rapid development in recent years for the features of small size, low power consumption, high image quality, no radiation, and convenient carrying, and has gradually replaced the conventional Cathode Ray Tube (CRT) display device and taken the lead in the current flat panel display market.

At present, TFT-LCDs are widely used in various products of large, medium and small sizes, covering almost the major electronic products of the information society of today, such as liquid crystal televisions, high definition digital televisions, computers (desktops and notebooks), mobile phones, tablet computers, navigators, vehicle displays, projection displays, video cameras, digital cameras, electronic watches, calculators, electronic instruments, meters, public displays, and illusion displays.

SUMMARY

The embodiments of the present disclosure provide a display substrate, a display panel and a display device, and the specific scheme is as follows.

In one aspect, an embodiment of the present disclosure provides a display substrate, including:
a base substrate;
a plurality of data lines on the base substrate;
a first insulating layer on a side of a layer where the plurality of data lines are positioned away from the base substrate;
a plurality of gate lines on a side of the first insulating layer away from the layer where the plurality of data lines are positioned, where an extension direction of each of the plurality of gate lines and an extension direction of each of the plurality of data lines are intersected;
a second insulating layer on a side of a layer where the plurality of gate lines are positioned away from the first insulating layer; and
a first electrode on a side of the second insulating layer away from the layer where the plurality of gate lines are positioned, where an orthographic projection of the first electrode on the base substrate is at least within an region surrounded by orthographic projections of respective data lines on the base substrate and orthographic projections of respective gate lines on the base substrate.

In some embodiments, in the display substrate according to the embodiment of the present disclosure, an orthographic projection of a portion of each of at least a part of the data lines on the base substrate is within the orthographic projection of the first electrode on the base substrate, the first electrode includes a plurality of slits, and a minimum distance between each of the plurality of slits and the data line in the extension direction of the gate line is greater than 1.5 μm.

In some embodiments, the display substrate according to the embodiment of the present disclosure further includes a transistor, a gate of the transistor is in the same layer and made of the same material as the data line, a first electrode and a second electrode of the transistor are in the same layer and made of the same material as the gate line; the gate of the transistor is electrically connected to the gate line, and the first electrode of the transistor is electrically connected to the data line.

In some embodiments, the display substrate according to the embodiment of the present disclosure further includes a first transfer electrode, which is in the same layer and made of the same material as the first electrode;
the first transfer electrode is electrically connected to the gate of the transistor through a first via penetrating through the first insulating layer and the second insulating layer, and is electrically connected to the gate line through a second via penetrating through the second insulating layer.

In some embodiments, in the display substrate according to the embodiment of the present disclosure, an orthographic projection of the first via on the base substrate is within an orthographic projection of the gate of the transistor on the base substrate, an aperture of the first via in a direction away from the base substrate is gradually increased, the first via includes a first port close to the base substrate, a length of the first port in the extension direction of the gate line is greater than or equal to 3 μm, and a width of the first port in the extension direction of the data line is greater than or equal to 6 μm.

In some embodiments, in the display substrate according to the embodiment of the present disclosure, an orthographic projection of the second via on the base substrate is within the orthographic projection of the gate line on the base substrate, an aperture of the second via in the direction away from the base substrate is gradually increased, the second via includes a second port close to the base substrate, a length of the second port in the extension direction of the gate line is greater than or equal to 3 μm, and a width of the second port in the extension direction of the data line is greater than or equal to 8 μm. In some embodiments, in the display substrate according to the embodiment of the present disclosure, the gate line includes a protrusion arranged side by side with the first electrode of the transistor, the orthographic projection of the first via on the base substrate is not overlapped with an orthographic projection of the protrusion on the base substrate, and the orthographic projection of the second via on the substrate is within the orthographic projection of the protrusion on the base substrate.

In some embodiments, in the display substrate according to the embodiment of the present disclosure, the orthographic projection of the protrusion on the base substrate and the orthographic projection of the gate of the transistor on the base substrate have an overlap region, and the overlap region is configured to serve as a region to place a spacer.

In some embodiments, in the display substrate according to the embodiment of the present disclosure, a minimum distance between the first electrode of the transistor and the protrusion is greater than or equal to 5 µm.

In some embodiments, in the display substrate according to the embodiment of the present disclosure, the gate line includes a wiring portion that is integrally provided with the protrusion, a line width of the wiring portion in the extension direction of the data line is greater than or equal to 5 µm.

In some embodiments, in the display substrate according to the embodiment of the present disclosure, the wiring portion and the protrusion form an accommodating groove, the first electrode of the transistor is in the accommodating groove.

In some embodiments, in the display substrate according to the embodiment of the present disclosure, the orthographic projection of the gate of the transistor on the base substrate is partially overlapped with an orthographic projection of the accommodating groove on the base substrate.

In some embodiments, in the display substrate according to the embodiment of the present disclosure, the first electrode of the transistor includes a first subsection extending along the extension direction of the gate lines, an orthographic projection of the first subsection on the base substrate is partially overlapped with the orthographic projection of the gate of the transistor on the base substrate, and is not overlapped with the orthographic projection of the data line on the substrate, and a distance between the first subsection and the wiring portion is greater than or equal to 5 µm.

In some embodiments, in the display substrate according to the embodiment of the present disclosure, a width of the first subsection in the extension direction of the data line is greater than or equal to 3 µm.

In some embodiments, in the display substrate according to the embodiment of the present disclosure, the first via and the second via are integrally provided as a first through hole, an orthographic projection of the first through hole on the base substrate is within the orthographic projection of the first transfer electrode on the base substrate, and a one-side excess distance of the orthographic projection of the first transfer electrode on the base substrate relative to the orthographic projection of the first through hole on the base substrate in the extension direction of the data line is greater than or equal to 3 µm, and/or, a one-side excess distance of the orthographic projection of the first transfer electrode on the base substrate relative to the orthographic projection of the first through hole on the base substrate in the extension direction of the gate line is greater than or equal to 3 µm.

In some embodiments, in the display substrate according to the embodiment of the present disclosure, a minimum distance between the orthographic projection of the first electrode of the transistor on the base substrate and the orthographic projection of the first transfer electrode on the base substrate is greater than or equal to 3 µm.

In some embodiments, in the display substrate according to the embodiment of the present disclosure, the display substrate further includes: a second transfer electrode, which is in the same layer and made of the same material as the first transfer electrode;
the second transfer electrode is electrically connected to the data line through a third via penetrating through the first insulating layer and the second insulating layer, and is electrically connected to the first electrode of the transistor through a fourth via penetrating through the second insulating layer.

In some embodiments, in the display substrate according to the embodiment of the present disclosure, the data line includes a widened portion, an orthographic projection of the third via on the base substrate is within an orthographic projection of the widened portion on the base substrate, an aperture of the third via in a direction away from the base substrate is gradually increased, the third via includes a third port close to the base substrate, a length of the third port in the extension direction of the gate line is greater than or equal to 6 µm, and a width of the third port in the extension direction of the data line is greater than or equal to 3 µm.

In some embodiments, in the display substrate according to the embodiment of the present disclosure, the first electrode of the transistor includes a second subsection, an orthographic projection of the second subsection on the base substrate is within the orthographic projection of the widened portion on the base substrate, an orthographic projection of the fourth via on the base substrate is within the orthographic projection of the second subsection on the base substrate, an aperture of the fourth via in the direction away from the base substrate is gradually increased, the fourth via includes a fourth port close to the base substrate, a length of the fourth port in the extension direction of the date line is greater than or equal to 8 µm, and a width of the fourth port in the extension direction of the data line is greater than or equal to 3 µm.

In some embodiments, in the display substrate according to the embodiment of the present disclosure, a distance between the widened portion and the gate of the transistor electrically connected to the widened portion is greater than or equal to 4.8 µm.

In some embodiments, in the display substrate according to the embodiment of the present disclosure, a distance between the widened portion and the gate of a transistor adjacent to and not connected to the widened portion is greater than or equal to 11 µm.

In some embodiments, in the display substrate according to the embodiment of the present disclosure, an orthographic projection of the second transfer electrode on the base substrate is within the orthographic projection of the widened portion on the base substrate.

In some embodiments, in the display substrate according to the embodiment of the present disclosure, the gate line includes a wiring portion having a substantially uniform line width and a protrusion integrally provided with the wiring portion, the wiring portion and the protrusion form an accommodating groove, and the orthographic projection of the widened portion on the base substrate is within an orthographic projection of the accommodating groove on the base substrate.

In some embodiments, in the display substrate according to the embodiment of the present disclosure, the third via and the fourth via are integrally provided as a second through hole, an orthographic projection of the second through hole on the base substrate is within the orthographic projection of the second transfer electrode on the base substrate, and a one-side excess distance of the orthographic projection of the second transfer electrode on the base substrate relative to the orthographic projection of the second through hole on the base substrate in the extension direction of the data line is greater than or equal to 3 µm, and/or, a one-side excess distance of the orthographic projection of the second transfer electrode on the base substrate relative to the orthographic projection of the second through hole on the base substrate in the extension direction of the gate line is greater than or equal to 3 μm.

In some embodiments, the display substrate according to the embodiment of the present disclosure further includes a second electrode, which forms a capacitor together with the first electrode, the capacitor is a storage capacitor or a liquid crystal capacitor, the first electrode of the storage capacitor is a pixel electrode, the first electrode or the second electrode of the liquid crystal capacitor is a pixel electrode, and the pixel electrode is electrically connected to the second electrode of the transistor.

In some embodiments, in the display substrate according to the embodiment of the present disclosure, an orthographic projection of the second electrode on the base substrate is within an region surrounded by orthographic projections of respective data lines on the base substrate and orthographic projections of respective gate lines on the base substrate, and a distance between the orthographic projection of the second electrode on the base substrate and the orthographic projection of the data lines on the substrate is greater than or equal to 6.4 μm.

In some embodiments, in the display substrate according to the embodiment of the present disclosure, the second electrode is in the same layer as the data lines and is made of a different material from the data line.

In some embodiments, the display substrate according to the embodiment of the present disclosure further includes a resistance reduction line, which is in the same layer and made of the same material as the second electrode, the resistance reduction line being electrically connected to the data line in a contact manner, and a distance between an orthographic projection of the resistance reduction line on the base substrate and the orthographic projection of the second electrode on the base substrate is greater than or equal to 4.8 μm.

In some embodiments, in the display substrate according to the embodiment of the present disclosure, the second electrode is a pixel electrode, and the display substrate further includes: a third transfer electrode, which is in the same layer and made of the same material as the first electrode; and the third transfer electrode is electrically connected to the second electrode through a fifth via penetrating through the first insulating layer and the second insulating layer, and is electrically connected to the second electrode of the transistor through a sixth via penetrating through the second insulating layer.

In some embodiments, in the display substrate according to the embodiment of the present disclosure, an orthographic projection of the fifth via on the base substrate is within the orthographic projection of the second electrode on the base substrate, an aperture of the fifth via in a direction away from the base substrate is gradually increased, the fifth via includes a fifth port close to the base substrate, a length of the fifth port in the extension direction of the gate line is greater than or equal to 3 μm, and a width of the fifth port in the extension direction of the data line is greater than or equal to 6 μm.

In some embodiments, in the display substrate according to the embodiment of the present disclosure, an orthographic projection of the sixth via on the base substrate is within an orthographic projection of the second electrode of the transistor on the base substrate, an aperture of the sixth via in a direction away from the base substrate is gradually increased, the sixth via includes a sixth port close to the base substrate, a length of the sixth port in the extension direction of the gate line is greater than or equal to 3 μm, and a width of the sixth port in the extension direction of the data line is greater than or equal to 8 μm.

In some embodiments, in the display substrate according to the embodiment of the present disclosure, the fifth via and the sixth via are integrally provided as a third through hole, an orthographic projection of the third through hole on the base substrate is within an orthographic projection of the third transfer electrode on the base substrate, and a one-side excess distance of the orthographic projection of the third transfer electrode on the base substrate relative to the orthographic projection of the third through hole on the base substrate in the extension direction of the data line is greater than or equal to 3 μm, and/or, a one-side excess distance of the orthographic projection of the third transfer electrode on the base substrate relative to the orthographic projection of the third through hole on the base substrate in the extension direction of the gate line is greater than or equal to 3 μm.

In some embodiments, in the display substrate according to the embodiment of the present disclosure, the first electrode includes an avoidance slot, the third transfer electrode is in the avoidance slot, and a distance between the third transfer electrode and the avoidance slot is greater than or equal to 4 μm.

In some embodiments, the display substrate according to the embodiment of the present disclosure further includes a connection line, which is in the same layer and made of the same material as the first electrode, and the connection line is electrically connected to a non-pixel electrode in the extension direction of the data line.

In some embodiments, in the display substrate according to the embodiment of the present disclosure, the gate line includes a wiring portion having a substantially uniform line width and a protrusion integrally provided with the wiring portion, the wiring portion and the protrusion form an accommodating groove, and the connection line crosses over the accommodating groove along the extension direction of the data line.

In some embodiments, in the display substrate according to the embodiment of the present disclosure, a distance between an orthographic projection of the connection line on the base substrate and an orthographic projection of the protrusion closest to the wiring portion on the base substrate is greater than or equal to 3 μm.

In some embodiments, in the display substrate according to the embodiment of the present disclosure, a distance between the orthographic projection of the connection line on the base substrate and the orthographic projection of the data line closest to the connection line on the base substrate is greater than or equal to 4 μm.

In some embodiments, in the display substrate according to the embodiment of the present disclosure, a width of the connection line in the extension direction of the gate line is greater than or equal to 4 μm.

In some embodiments, in the display substrate according to the embodiment of the present disclosure, the gate of the transistor is electrically connected to the gate line through a seventh via penetrating through the first insulating layer.

In some embodiments, in the display substrate according to the embodiment of the present disclosure, the first electrode of the transistor is electrically connected to the data line through an eighth via penetrating through the first insulating layer.

In some embodiments, in the display substrate according to the embodiment of the present disclosure, the second electrode of the transistor is electrically connected to the pixel electrode through a ninth via penetrating through the first insulating layer.

In some embodiments, in the display substrate according to the embodiment of the present disclosure, the first insulating layer has a thickness greater than or equal to 3500 Å and less than or equal to 4500 Å, and the second insulating layer has a thickness greater than or equal to 2000 Å and less than or equal to 7000 Å.

In another aspect, an embodiment of the present disclosure provides a display panel. The display panel includes: a display substrate and an opposite substrate which are opposite to each other, and a liquid crystal layer between the display substrate and the opposite substrate, the display substrate being the display substrate of claims 1.

In some embodiments, in the display panel according to the embodiment of the present disclosure, the first electrode includes an electrode strip, an orthographic projection of the electrode strip is overlapped with the data line; the opposite substrate includes a black matrix, the black matrix including a black matrix strip extending in the extension direction of the data line, an orthographic projection of a part of the black matrix strip on the base substrate is within the orthographic projection of the electrode strip on the base substrate, and a width of the black matrix strip in the extension direction of the gate line is greater than or equal to 8 μm.

In another aspect, an embodiment of the present disclosure provides a display device including the display panel according to the embodiment of the present disclosure.

DETAIL DESCRIPTION OF EMBODIMENTS

Figure 1:
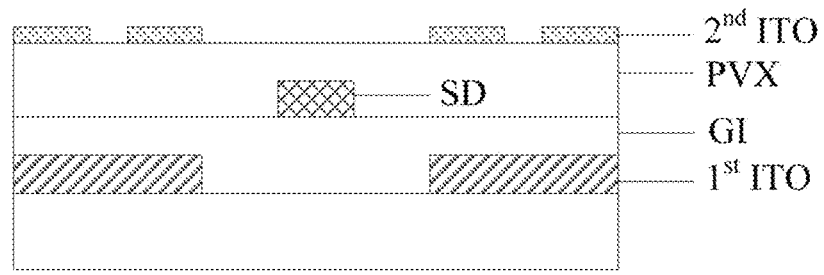
FIG. 1 is a schematic diagram illustrating a structure of a display substrate in an advanced super dimension switch type liquid crystal display panel in the existing technology.

In order to illustrate the objects, technical schemes and advantages of the embodiments of the present disclosure more clearly, the technical schemes of the embodiments of the present disclosure will be described clearly and completely below with reference to the drawings of the embodiments of the present disclosure. It is noted that in the drawings, the thickness of the layers, films, panels, regions, etc. have been enlarged for clarity. Exemplary embodiments are described in the present disclosure with reference to the cross-sectional views of the schematic diagrams of the idealized embodiments. In this way, deviations from the shape of the figures as a result of, for example, manufacturing techniques and/or tolerances, are to be expected. Thus, embodiments described in the present disclosure should not be construed as limited to the particular shapes of regions as illustrated in present disclosure, and are to include deviations in shapes that result, for example, from manufacturing. For example, regions illustrated or described as flat may typically have rough and/or nonlinear features; the sharp corners illustrated may be rounded, etc. Thus, the regions illustrated in the figures are schematic in nature and their sizes and shapes are not intended to illustrate the precise shape of a region, not to reflect a true scale, and are merely intended to illustrate the present disclosure. The same or similar reference numerals are used throughout the drawings to refer to the same or similar elements or elements having the same or similar functions. For a clear and concise description of the embodiments of the present disclosure, a detailed description of known functions and known components is omitted from the present disclosure.

Unless defined otherwise, technical or scientific terms used herein shall have the ordinary meaning as understood by those of ordinary skill in the art to which the present disclosure belongs. The terms "first," "second," and the like, as used in the description and the claims, are not intended to indicate any order, quantity, or importance, and rather to distinguish one component from other components. The term "including" or "including", or the like, means that the element or item preceding the word includes the element or item listed after the word and its equivalent, and does not exclude other elements or items. The terms "connected" or "coupled" and the like are not restricted to physical or mechanical connections, and may include electrical connections, whether direct or indirect. The terms "inner", "outer", "upper", "lower", and the like are used merely to indicate relative positional relationships, and when the absolute position of the object being described is changed, the relative positional relationships may also be changed accordingly.

In the following description, when an element or layer is referred to as being "on" or "connected to" another element or layer, it may be directly on or connected to the another element or layer, or intervening elements or layers may be present. When an element or layer is referred to as being "disposed on" a side of another element or layer, the element or layer may be directly on the side of the another element or layer, or may be directly connected to the another element or layer, or intervening elements or layers may be present. However, when an element or layer is referred to as being "directly on" or "directly connected to" another element or layer, no intervening elements or layers are present. The term "and/or" encompasses any and all combinations of one or more of the associated listed items.

Figure 2:
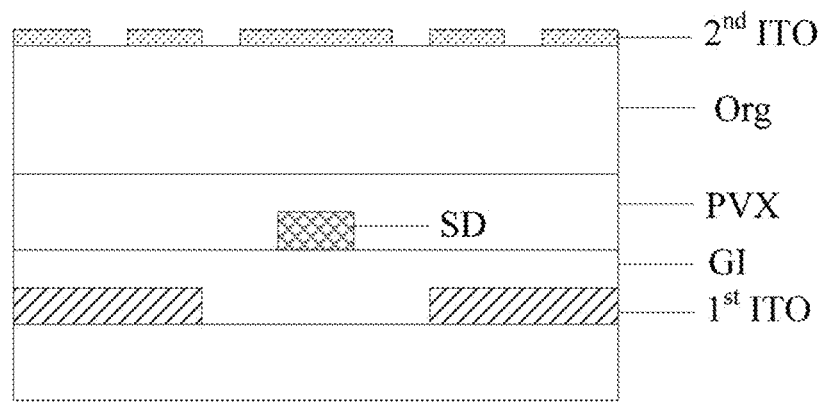
FIG. 2 is a schematic diagram illustrating a structure of a display substrate in a high aperture ratio-advanced super dimension switch type liquid crystal display panel in the existing technology.
Figure 3:
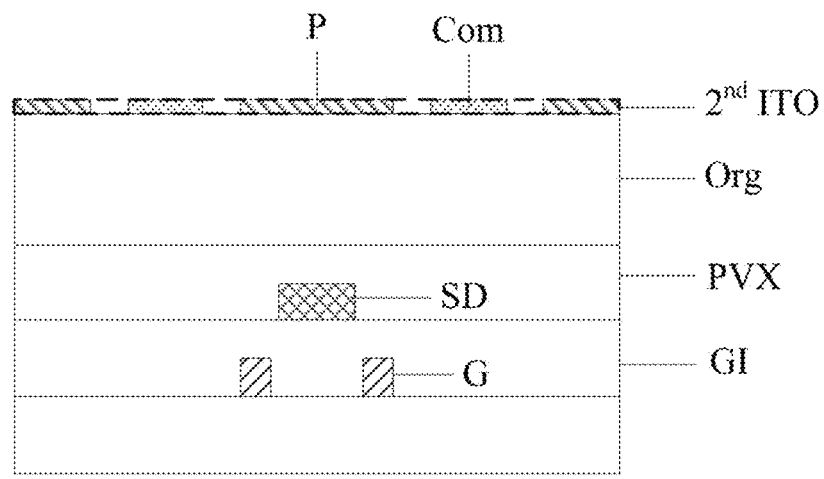
FIG. 3 is a schematic diagram illustrating a structure of a display substrate in an in-plane switch type liquid crystal display panel in the existing technology.
Figure 4:
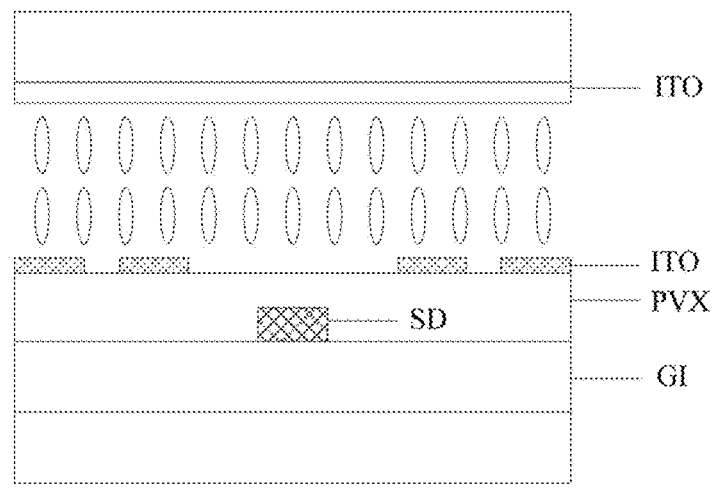
FIG. 4 is a schematic diagram illustrating a structure of a vertical alignment liquid crystal display panel in the existing technology.

The liquid crystal display devices in the existing technology include advanced super dimension switch (ADS) type liquid crystal displays, high aperture-advanced super dimension switch (HADS) type liquid crystal displays, in-plane switch (IPS) type liquid crystal displays, and vertical alignment (VA) type liquid crystal displays. FIG. 1 shows a display substrate of an advanced super dimension switch type liquid crystal display, FIG. 2 shows a display substrate of a high aperture-advanced super dimension switch type liquid crystal display, FIG. 3 shows a display substrate of an in-plane switch type liquid crystal display, and FIG. 4 shows a vertical alignment type liquid crystal display. As can be seen from FIGS. 1 and 4, only an inorganic insulating layer (PVX) is provided between the data line (SD) and the electrode (ITO) in a layer above the data line, resulting in a small distance between the data line (SD) and the electrode (ITO), a large coupling capacitance, and a large load on the data line. As can be seen from FIGS. 2 and 3, not only the inorganic insulating layer (PVX) and also an organic insulating layer (Org) is added between the data line (SD) and the electrode (ITO) in a layer above the data line, such that the distance between the data line (SD) and the electrode (ITO) in the layer above the data line is increased by the organic insulating layer (Org), thus the coupling capacitance between the data line (SD) and the electrode (ITO) in the layer above the data line is reduced and the load on the data line (SD) is decreased, however, the process for manufacturing the organic insulating layer (Org) is added, thereby increasing the process complexity.

In order to improve the above technical problems in the existing technology, an embodiment of the present disclosure provides a display substrate, as shown in FIGS. 5 to 22, the display substrate includes:

- a base substrate 101, where, optionally, the base substrate 101 is a rigid substrate made of glass or the like, or a flexible substrate made of polyimide or the like;
- a plurality of data lines (SD) 102, which are positioned on the base substrate 101, where, optionally, the data lines 102 are made of a material including a metal material, such as a single-layer or multi-layer structure made of molybdenum, aluminum, titanium, copper, alloy, and the like, and exemplarily, the data lines 102 are each of a stacked structure of titanium metal layer/aluminum metal layer/titanium metal layer;
- a first insulating layer 103, which is positioned on a side of a layer where the data lines 102 are positioned away from the base substrate 101, where, optionally, the first insulating layer 103 is a gate insulating layer (GI), and the first insulating layer 103 may be made of an inorganic insulating material such as silicon oxide, silicon nitride, or silicon oxynitride;
- a plurality of gate lines (G) 104, which are positioned on a side of the first insulating layer 103 away from the layer where the plurality of data lines 102 are positioned, and an extension direction of each of the plurality of gate lines 104 and an extension direction of each of the plurality of data lines 102 are intersected, optionally, the gate lines 104 are made of a material including a metal material, such as a single-layer or multi-layer structure made of molybdenum, aluminum, titanium, copper, an alloy, and the like, and exemplarily, the gate lines 104 are each of a stacked structure made of titanium metal layer/aluminum metal layer/titanium metal layer;
- a second insulating layer 105, which is positioned on a side of a layer where the plurality of gate lines 104 are positioned away from the first insulating layer 103; where, optionally, the first insulating layer 103 is an inorganic insulating layer (PVX), and the second insulating layer 105 is made of an inorganic insulating material such as silicon oxide, silicon nitride, or silicon oxynitride;
- a first electrode 106, which is positioned on a side of the second insulating layer 105 away from a layer where the gate lines 104 are positioned, an orthographic projection of the first electrode 106 on the base substrate 101 is positioned in at least an region surrounded by orthographic projections of respective data lines 102 on the base substrate 101 and orthographic projections of respective gate lines 104 on the base substrate 101; optionally, the first electrode 106 may be made of a transparent conductive material such as indium tin oxide (ITO), indium zinc oxide (IZO), or zinc oxide (ZnO).

In the display substrate according to the embodiment of the present disclosure, by sequentially arranging a layer of data lines 102, a first insulating layer 103, a layer of gate lines 104, a second insulating layer 105 and a layer of the first electrode 106 on the base substrate 101, two insulating layers, i.e., the first insulating layer 103 and the second insulating layer 105, are simultaneously present between the layer where the data lines 102 are positioned and the layer where the first electrode 106 is positioned that is farther away from the base substrate 101. By doing so, the distance between the layer where the data lines 102 are positioned and the layer where the first electrode 106 is positioned is larger, the coupling capacitance between the data line 102 and the first electrode 106 can be reduced, the load on the data line 102 caused by the coupling capacitance is reduced, the pixel charging rate is favorably improved, and the temperature of a driving chip (IC) is reduced. Also, since the present disclosure reduces the coupling capacitance between the data line 102 and the first electrode 106 utilizing the first insulating layer 103 and the second insulating layer 105 in the related technology, it is not necessary to add an organic insulating layer to reduce the coupling capacitance between the data line 102 and the first electrode 106, and based on this, the process complexity would not be increased.

In some embodiments, in the display substrate according to the embodiment of the present disclosure, the thickness of the first insulating layer 103 is greater than or equal to 3500 Å and less than or equal to 4500 Å, the thickness of the second insulating layer 105 is greater than or equal to 2000 Å and less than or equal to 7000 Å. Optionally, the thickness of the first insulating layer 103 is 4500 Å and the thickness of the second insulating layer 105 is 7000 Å, in which case the thickness of the insulating layer between the data line 102 and the first electrode 106 may be 11500 Å, greatly reducing the load on the data lines 102, and improving the pixel charging rate.

In some embodiments, in the display substrate according to the embodiment of the present disclosure, as shown in FIGS. 5, 7, 8 and 10, an orthographic projection of a portion of each of at least a part of the data lines 102 on the base substrate 101 is positioned within the orthographic projection of the first electrode 106 on the base substrate 101. The first electrode 106 includes a plurality of slits S, and a minimum distance d1 from the slit S to the data line 102 in the extension direction X of the gate line 104 is greater than 1.5 μm, in other words, the first electrode 106 may include an electrode strip 106' between two slits S closest to the data line 102, and an orthographic projection of the electrode strip 106' on the base substrate 101 exceeds by at least 1.5 μm, for example, 2.2 μm, relative to the orthographic projection of the data line 102 on the base substrate 101. With this arrangement, the electrode strip 106' can cover the data line 102 even after process fluctuation occurs. In addition, in a case where the orthographic projection of the electrode strip 106' on the base substrate 101 exceeds by 2.2 μm relative to the orthographic projection of the data line 102 on the base substrate 101, the optimal luminous efficiency design effect of the first electrode 106 can still be achieved.

In some embodiments, in the display substrate according to the embodiment of the present disclosure, as shown in FIGS. 5 to 7, 9, 12, 13, 16, 17, 20, 21, 30, 33, 34, 36, 38, 39, 41 to 43, 45 to 47, 49 to 51, and 53 to 55, the display substrate may further include a transistor 107, where a gate 71 of the transistor 107 is disposed in the same layer and made of the same material as the data line 102, a first electrode 72 and a second electrode 73 of the transistor 107 are disposed in the same layer and made of the same material as the gate line 104, so that the transistor 107 is a bottom gate transistor, and light is shielded by the gate 71 of the transistor 107, thereby preventing the light from irradiating the channel of the transistor 107 to affect the stability of the transistor 107. Optionally, the gate 71 of the transistor 107 is electrically connected to a gate line 104, the first electrode 72 of the transistor 107 is electrically connected to a data line 102, and the second electrode 73 of the transistor 107 is electrically connected to a pixel electrode. In some embodiments, an active layer 74 of the transistor 107 may be made of a material such as amorphous silicon, polysilicon, oxide, or the like; the first electrode 72 of the transistor 107 may be a source and the second electrode 73 of the transistor 107 is a drain, or the first electrode 72 of the transistor 107 is a drain and the second electrode 73 is a source; the transistor 107 may be a P-type transistor or an N-type transistor, which is not limited herein.

Figure 27:
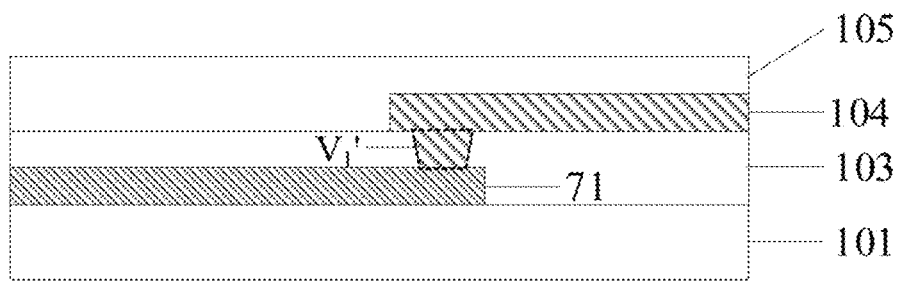
FIG. 27 is a schematic diagram illustrating a gate line electrically connected to a gate of a transistor according to an embodiment of the present disclosure.

In some embodiments, in the display substrate according to the embodiment of the present disclosure, as shown in FIGS. 5 to 7, 14, 18, 22, 23, 24, 30, 35, 36, 40, 41, 44, 45, 48, 49, 52, 53, and 56, the display substrate may further include a first transfer electrode 108, which is disposed in the same layer and made of the same material as the first electrode 106; the first transfer electrode 108 is electrically connected to the gate 71 of the transistor 107 through a first via $V_{11}$ penetrating through the first insulating layer 103 and the second insulating layer 105, and is electrically connected to the gate line 104 through a second via $V_{12}$ penetrating through the second insulating layer 105, that is, electrical connection between the gate line 104 and the gate 71 of the transistor 107 is achieved utilizing the first transfer electrode 108. In this case, the fabrication of the first transfer electrode 108 can be completed at the same time of fabricating the first electrode 106, thereby avoiding an additional process for fabricating the first transfer electrode 108. Furthermore, a second via $V_{12}$ penetrating through the second insulating layer 105 and used for electrically connecting the first transfer electrode 108 and the gate line 104 and a first via Vu penetrating through the first insulating layer 103 and the second insulating layer 105 and used for electrically connecting the first transfer electrode 108 and the gate 71 of the transistor 107 can be simultaneously formed in one single patterning process, thereby avoiding an additional process of patterning the first insulating layer 103. It should be understood that in some embodiments, as shown in FIG. 27, the gate line 104 may alternatively be electrically connected to the gate 71 of the transistor 107 through a seventh via $V_1'$ penetrating through the first insulating layer 103.

Figure 23:
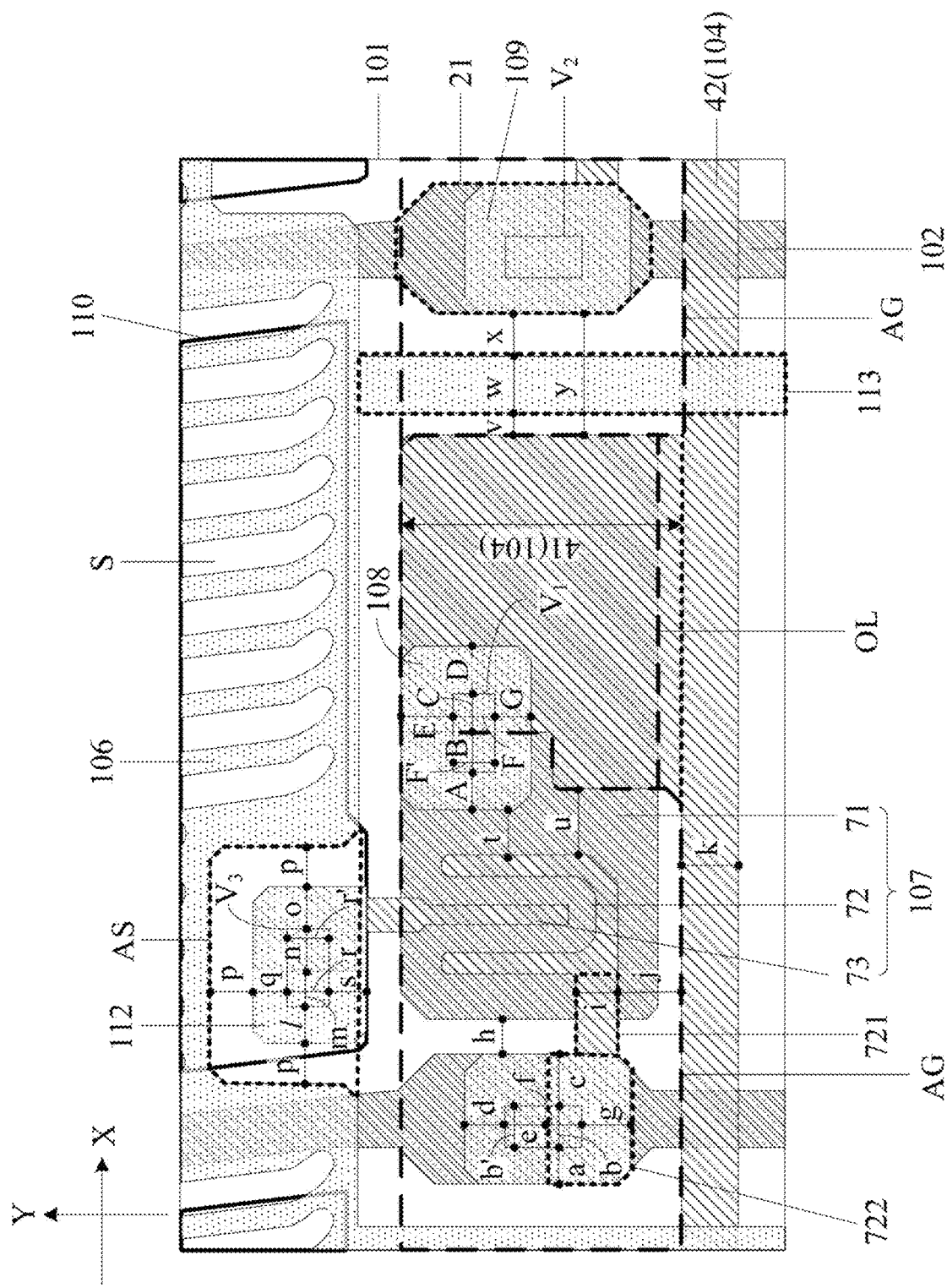
FIG. 23 is a schematic diagram illustrating another structure of the display substrate according to an embodiment of the present disclosure.
Figure 24:
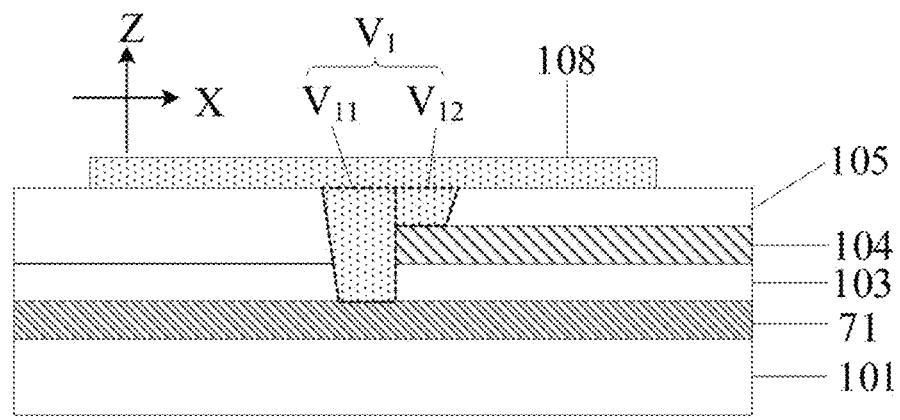
FIG. 24 is a cross-sectional view taken along line IV-IV' in FIG. 7.

In some embodiments, in the display substrate according to the embodiment of the present disclosure, as shown in FIGS. 23 and 24, an orthographic projection of the first via Vu on the base substrate 101 is positioned within the orthographic projection of the gate 71 of the transistor 107 on the base substrate 101, an aperture of the first via $V_{11}$ in a direction Z away from the base substrate 101 is gradually increased, and the first via $V_{11}$ includes a first port close to the base substrate 101. In order to ensure a small lap resistance between the first transfer electrode 108 and the gate 71 of the transistor 107 and a good topography of the first via $V_{11}$, a length B of the first port in an extension direction X of the gate line 104 may be set to be greater than or equal to 3 µm, and a width F' of the first port in an extension direction Y of the data line 102 is set to be greater than or equal to 6 µm. Optionally, the length B is 5.75 µm, and the width F' is 6 µm.

In some embodiments, in the display substrate according to the embodiment of the present disclosure, as shown in FIGS. 23 and 24, an orthographic projection of the second via $V_{12}$ on the base substrate 101 is positioned within the orthographic projection of the gate line 104 on the base substrate 101, an aperture of the second via $V_{12}$ in a direction Z away from the base substrate 101 is gradually increased, and the second via $V_{12}$ includes a second port close to the base substrate 101. In order to ensure a small lap resistance between the first transfer electrode 108 and the gate line 104 and a good topography of the second via $V_{12}$, a length C of the second port in the extension direction X of the gate line 104 may be set to be greater than or equal to 3 µm, and a width F of the second port in the extension direction Y of the data line 102 is set to be greater than or equal to 8 µm. Optionally, the length C is 6.25 µm, and the width F is 8 µm.

In some embodiments, in the display substrate according to the embodiment of the present disclosure, as shown in FIGS. 23 and 24, the gate line 104 includes a protrusion 41 disposed side by side with the first electrode 72 of the transistor 107, the orthographic projection of the first via $V_{11}$ on the base substrate 101 is not overlapped with an orthographic projection of the protrusion 41 on the base substrate 101, and the orthographic projection of the second via $V_{12}$ on the base substrate 101 is positioned within the orthographic projection of the protrusion 41 on the base substrate 101. As can be seen from FIG. 23, an area of the protrusion 41 is larger, which facilitates the lap joint of the protrusion 41 with the first transfer electrode 108 through the second via $V_{12}$. Meanwhile, a line width of the gate line 104 is increased at only the protrusion 41, so that an overall line width of the gate line 104 is avoided to be larger, and the shielding of the backlight by the gate line 104 is reduced, thus the transmittance is improved.

In some embodiments, in the display substrate according to the embodiment of the present disclosure, as shown in FIGS. 23 and 24, to simplify the design of the via, the first via $V_{11}$ and the second via $V_{12}$ may be integrally provided as a first through hole $V_1$. Optionally, an orthographic projection of the first through hole $V_1$ on the base substrate 101 is positioned within the orthographic projection of the first transfer electrode 108 on the base substrate 101, and a one-side excess distance A/D/E/G of the orthographic projection of the first transfer electrode 108 on the base substrate 101 relative to the orthographic projection of the first through hole $V_1$ on the base substrate 101 in the extension direction Y of the data line 102 and/or the extension direction X of the gate line 104 is greater than or equal to 3 µm, for example, the one-side excess distances A, D, E, G are 5.55 µm, 5.75 µm, 5.5 µm, respectively. In a case where the one-side excess distance A/D/E/G of the orthographic projection of the first transfer electrode 108 on the base substrate 101 relative to the orthographic projection of the first through hole $V_1$ on the base substrate 101 in the extension direction Y of the data line 102 and/or the extension direction X of the gate line 104 is greater than or equal to 3 µm, even if process fluctuation occurs, the first transfer electrode 108 can still cover the first through hole $V_1$ well, which reduces the risk of corrosion of the protrusion 41 and the gate 71 caused by moisture contact through the first through hole $V_1$.

Figure 5:
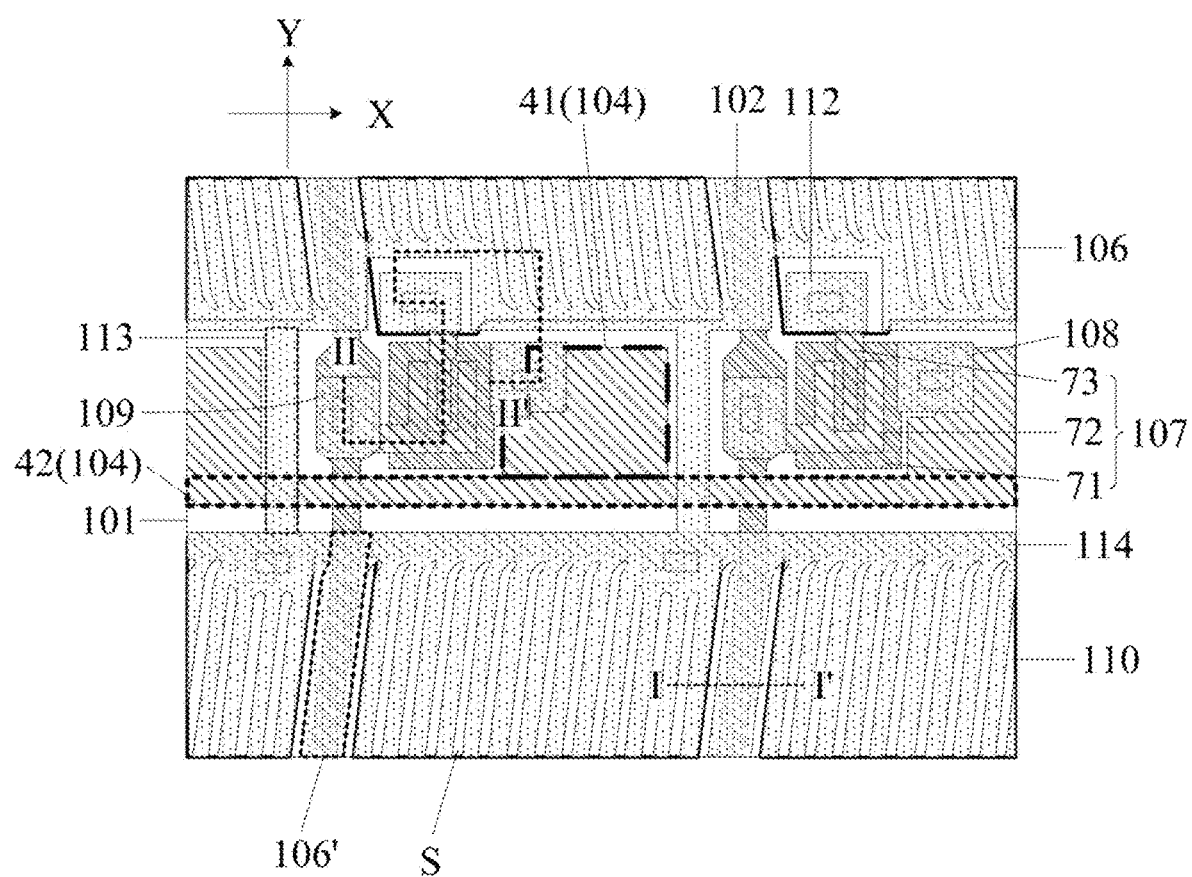
FIG. 5 is a schematic diagram illustrating a structure of a display substrate according to an embodiment of the present disclosure.

In some embodiments, as shown in FIG. 23, in the display substrate according to the embodiment of the present disclosure, an overlapping region OL is formed between the orthographic projection of the protrusion 41 on the base substrate 101 and the orthographic projection of the gate 71 of the transistor 107 on the base substrate 101, and the overlapping region OL is relatively flat to hold a spacer (PS), so that the supporting effect for the spacer (PS) is improved, and the spacer (PS) can be prevented from sliding due to an uneven supporting surface to cause light leakage and the like phenomena. Of course, in some embodiments, the spacer (PS) may alternatively be disposed in other relatively flat regions, and in this case, as shown in FIG. 5, the orthographic projection of the protrusion 41 on the base substrate 101 and the orthographic projection of the gate 71 of the transistor 107 on the base substrate 101 may not be overlapped.

In some embodiments, in the display substrate according to the embodiment of the present disclosure, as shown in FIG. 23, a minimum distance u between the first electrode 72 of the transistor 107 and the protrusion 41 may be greater than or equal to 5 μm, for example, 9.55 μm. Since the first electrode 72 of the transistor 107 and the protrusion 41 are disposed in the same layer and made of the same material, in a case where the minimum distance u between the first electrode 72 of the transistor 107 and the protrusion 41 is greater than or equal to 5 μm, a short circuit caused by process fluctuation, residual conductive foreign matters (particle), etc. can be avoided.

In some embodiments, in the display substrate according to the embodiment of the present disclosure, as shown in FIG. 23, the gate line 104 may further include a wiring portion 42 integrally provided with the protrusion 41, and a line width k of the wiring portion 42 in the extension direction Y of the data line 102 is greater than or equal to 5 μm, for example, 8 μm, so as to prevent the gate line 104 from breaking.

In some embodiments, as shown in FIG. 23, in the display substrate according to the embodiment of the present disclosure, the wiring portion 42 and the protrusion 41 form an accommodating groove AG, and the first electrode 72 of the transistor 107 is positioned in the accommodating groove AG, so as to prevent the transistor 107 from occupying too much pixel area, and to improve the pixel aperture ratio, and meanwhile to effectively prevent the first electrode 72 of the transistor 107 from being shorted with the gate line 104 disposed in the same layer and made of the same material. Optionally, an opening of the accommodating groove AG faces the pixel electrode controlled, by means of the transistor 107, by the gate line 104 to which the accommodating groove AG belongs, so that the second electrode 73 of the transistor 107 is electrically connected to the pixel electrode at an opening side of the accommodating groove AG.

In some embodiments, in the above display substrate according to the embodiment of the present disclosure, as shown in FIG. 23, the orthographic projection of the gate 71 of the transistor 107 on the base substrate 101 and the orthographic projection of the accommodating groove AG on the base substrate 101 are partially overlapped, so as to facilitate the overlapping of the orthographic projection of the gate 71 of the transistor 107 on the base substrate 101 and the orthographic projection of the first electrode 72 on the base substrate 101 in the accommodating groove AG, thus a channel region in a U-shaped structure of the first electrode 72 forms a conductive channel under the driving of the electric fields of the gate 71 and the first electrode 72.

In some embodiments, in the display substrate according to the embodiment of the present disclosure, as shown in FIG. 23, the first electrode 72 of the transistor 107 includes a first subsection 721 extending along the extension direction X of the gate line 104, an orthographic projection of the first subsection 721 on the base substrate 101 is partially overlapped with the orthographic projection of the gate 71 of the transistor 107 on the base substrate 101, and is not overlapped with the orthographic projection of the data line 102 on the base substrate 101. In order to prevent the first subsection 721 from being shorted with the wiring portion 42 that is disposed in the same layer and made of the same material, a distance j between the first subsection 721 and the wiring portion 42 may be set to be greater than or equal to 5 μm, for example, 9.25 μm.

In some embodiments, in the display substrate according to the embodiment of the present disclosure, in order to prevent the first subsection 721 from breaking, as shown in FIG. 23, the width i of the first subsection 721 in the extension direction Y of the data line 102 may be set to be greater than or equal to 3 μm, for example, 6 μm.

In some embodiments, in the display substrate according to the embodiment of the present disclosure, as shown in FIG. 23, a minimum distance t between the orthographic projection of the first electrode 72 of the transistor 107 on the base substrate 101 and the orthographic projection of the first transfer electrode 108 on the base substrate 101 is greater than or equal to 3 μm, for example, 6.55 μm, so as to prevent the first transfer electrode 108 from being overlapped with the channel region in the U-shaped structure of the first electrode 72 due to factors such as process fluctuations to influence the switching characteristics of the transistor 107.

Figure 28:
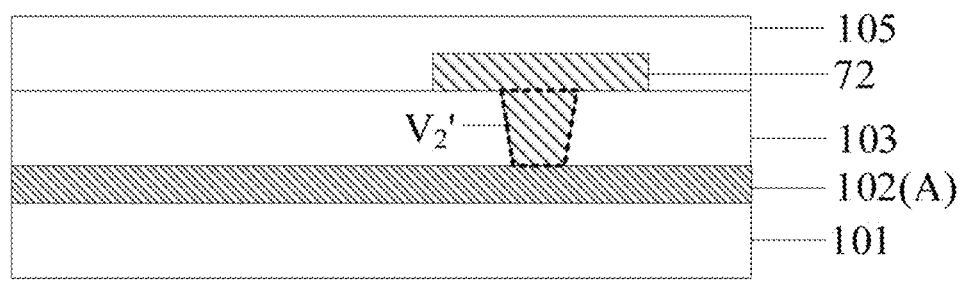
FIG. 28 is a schematic diagram illustrating a data line electrically connected to a first electrode of the transistor according to an embodiment of the present disclosure.

In some embodiments, in the display substrate according to the embodiment of the present disclosure, as shown in FIGS. 5 to 7, 14, 18, 22, 23, 25, 30, 35, 36, 40, 41, 44, 45, 48, 49, 52, 53, and 56, the display substrate may further include a second transfer electrode 109, which is disposed in the same layer and made of the same material as the first electrode 106; the second transfer electrode 109 is electrically connected to the data line 102 through a third via $V_{21}$ penetrating through the first insulating layer 103 and the second insulating layer 105, and is electrically connected to the first electrode 72 of the transistor 107 through a fourth via $V_{22}$ penetrating through the second insulating layer 105, i.e., the electrical connection of the data line 102 and the first electrode 72 of the transistor 107 is achieved utilizing the second transfer electrode 109. In this case, the fabrication of the second transfer electrode 109 can be completed at the same time of fabricating the first electrode 106, thereby avoiding an additional process for fabricating the second transfer electrode 109. A via penetrating through the second insulating layer 105 and used for electrically connecting the second transfer electrode 109 and the first electrode 72 of the transistor 107 and a via penetrating through the first insulating layer 103 and the second insulating layer 105 and used for electrically connecting the second transfer electrode 109 and the data line 102 can be simultaneously formed by one patterning process, thereby avoiding an additional process of patterning the first insulating layer 103. It should be understood that in some embodiments, as shown in FIG. 28, the first electrode 72 of the transistor 107 may alternatively be electrically connected to the data line 102 through an eighth via $V_2'$ penetrating through the first insulating layer 103.

Figure 25:
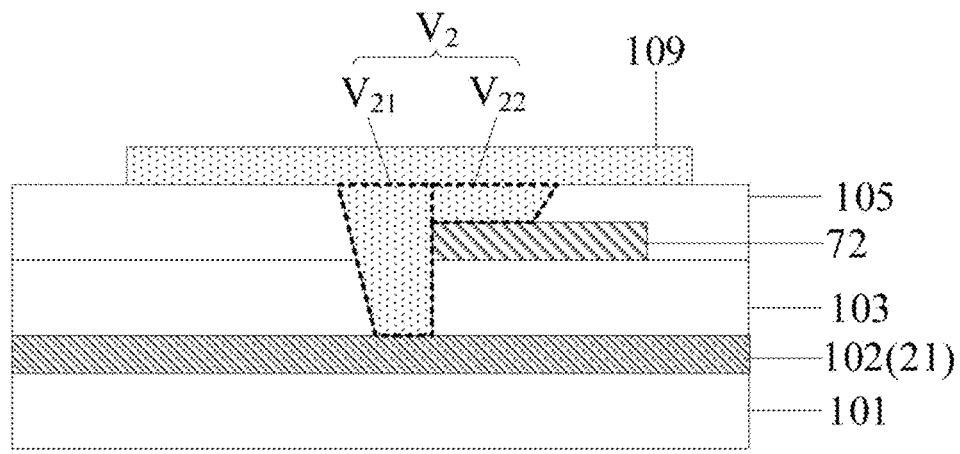
FIG. 25 is a cross-sectional view taken along line V-V' in FIG. 7.

In some embodiments, in the display substrate according to the embodiment of the present disclosure, as shown in FIGS. 23 and 25, the data line 102 includes a widened portion 21. In order to reduce the lap resistance between the data line 102 and the second transfer electrode 109 and to ensure a good topography of the third via $V_{21}$, an orthographic projection of the third via $V_{21}$ on the base substrate 101 may be positioned within an orthographic projection of the widened portion 21 on the base substrate 101. An aperture of the third via $V_{21}$ in a direction Z away from the base substrate 101 is gradually increased. The third via $V_{21}$ includes a third port close to the base substrate 101, a length b' of the third port in the extension direction X of the gate line 104 is greater than or equal to 6 μm, and a width e of the third port in the extension direction Y of the data line 102 is greater than or equal to 3 μm. Optionally, the length b' is 8 μm, and the width e is 5.75 μm. As can be seen from FIG. 23, an area of the widened portion 21 is relatively larger, which facilitates the lap joint of the widened portion 21 with the second transfer electrode 109 through the third via $V_{21}$. Meanwhile, a line width of the data line 102 is increased at only the widened portion 21, so that an overall line width of the data line 102 is avoided to be larger, and the shielding of the backlight by the data line 102 is reduced, thus the transmittance is improved.

In some embodiments, in the display substrate according to the embodiment of the present disclosure, as shown in FIGS. 23 and 25, the first electrode 72 of the transistor 107 includes a second subsection 722, an orthographic projection of the second subsection 722 on the base substrate 101 is positioned within the orthographic projection of the widened portion 21 on the base substrate 101. In order to reduce the lap resistance between the first electrode 72 and the second transfer electrode 109 and to ensure a good topography of the fourth via $V_{22}$, an orthographic projection of the fourth via $V_{22}$ on the base substrate 101 is positioned within the orthographic projection of the second subsection 722 on the base substrate 101. An aperture of the fourth via $V_{22}$ in a direction Z away from the base substrate 101 is gradually increased. The fourth via $V_{22}$ includes a fourth port close to the base substrate 101, a length b of the fourth port in the extension direction X of the data line 104 is greater than or equal to 8 μm, and a width f of the fourth port in the extension direction Y of the data line 102 is greater than or equal to 3 μm. Optionally, the length b is 8 μm, and the width f is 6.25 μm.

In some embodiments, in the display substrate according to the embodiment of the present disclosure, in order to simplify the design of the via, as shown in FIG. 23, the third via $V_{21}$ and the fourth via $V_{22}$ may be integrally provided as a second through hole $V_2$. Optionally, an orthographic projection of the second through hole $V_2$ on the base substrate 101 is positioned within the orthographic projection of the second transfer electrode 109 on the base substrate 101, and a one-side excess distance a/c/d/g of the orthographic projection of the second transfer electrode 109 on the base substrate 101 relative to the orthographic projection of the second through hole $V_2$ on the base substrate 101 in the extension direction Y of the data line 102 and/or the extension direction X of the gate line 104 is greater than or equal to 3 μm. In the case where the one-side excess distance a/c/d/g of the orthographic projection of the second transfer electrode 109 on the base substrate 101 relative to the orthographic projection of the second through hole $V_2$ on the base substrate 101 in the extension direction Y of the data line 102 and/or the extension direction X of the gate line 104 is greater than or equal to 3 μm, even if process fluctuation occurs, the second transfer electrode 109 can still cover the second through hole $V_2$ well, which reduces the risk of corrosion of the widened portion 21 and the first electrode 72 caused by moisture contact through the second through hole $V_2$.

In some embodiments, in the display substrate according to the embodiment of the present disclosure, in order to prevent short circuit between the widened portion 21 and the gate 71 that is disposed in the same layer and made of the same material as the widened portion 21, and to make the structure of the transistor 107 more compact, as shown in FIG. 23, a distance h between the widened portion 21 and the gate 71 of the transistor 107 electrically connected to the widened portion 21 may be set to be greater than or equal to 4.8 μm, for example, 5 μm.

In some embodiments, in the display substrate according to the embodiment of the present disclosure, as shown in FIG. 23, in the case where the wiring space is sufficient, in order to better prevent short circuit between the widened portion 21 and the gate 71 of the transistor 107 adjacent to and unconnected to the widened portion 21, the distance between the widened portion 21 and the gate 71 of the transistor 107 adjacent to and unconnected to the widened portion 21 may be increased. For example, a distance h between the widened portion 21 and the gate 71 of the transistor 107 adjacent to and unconnected to the widened portion 21 is set to be equal to or greater than 11 μm, and optionally, the distance h is 13 μm.

In some embodiments, in the display substrate according to the embodiment of the present disclosure, as shown in FIG. 23, the orthographic projection of the second transfer electrode 109 on the base substrate 101 is positioned within the orthographic projection of the widened portion 21 on the base substrate 101, so that a sufficient overlap region is present between the data line 102 and the second transfer electrode 109, and a good electrical connection effect between the data line 102 and the second transfer electrode 109 is ensured.

In a case where the data line 102 is provided with the widened portion 21, if the widened portion 21 and the gate line 104 are overlapped, the coupling capacitance between the data line 102 and the gate line 104 would be large. Based on this, in order to reduce the coupling capacitance between the data line 102 and the gate line 104 and to reduce the mutual interference between signals on the data line 102 and the gate line 104, in some embodiments, in the display substrate according to the embodiment of the present disclosure, as shown in FIG. 23, the orthographic projection of the widened portion 21 on the base substrate 101 may be positioned within the orthographic projection of the accommodating groove AG on the base substrate 101.

In some embodiments, in the display substrate according to the embodiment of the present disclosure, as shown in FIGS. 5 to 7, 11, 15, 19, 23, 24, 32, 36, 37, 40, 41, 44, 45, 48 to 50, 52 to 54, and 56, the display substrate may further include a second electrode 110, which forms a capacitor together with the first electrode 106, the capacitor being a storage capacitor (Cst) or a liquid crystal capacitor (Clc). The first electrode 106 of the storage capacitor (Cst) is a pixel electrode, the first electrode 106 or the second electrode 110 of the liquid crystal capacitor (Clc) is a pixel electrode (P), and the pixel electrode is electrically connected to the second electrode 73 of the transistor 107. Optionally, the pixel electrode is positioned in a pixel region surrounded by the orthographic projection of the data lines 102 on the base substrate 101 and the orthographic projection of the gate lines 104 on the base substrate 101. In order to facilitate the lap joint of the pixel electrode with the second electrode 73 of the transistor 107, the orthographic projection of the second electrode 73 of the transistor 107 on the base substrate 101 may be configured to extend from the U-shaped structure of the base substrate 101 till to overlap a part of the of the pixel electrode in the pixel region.

Figure 8:
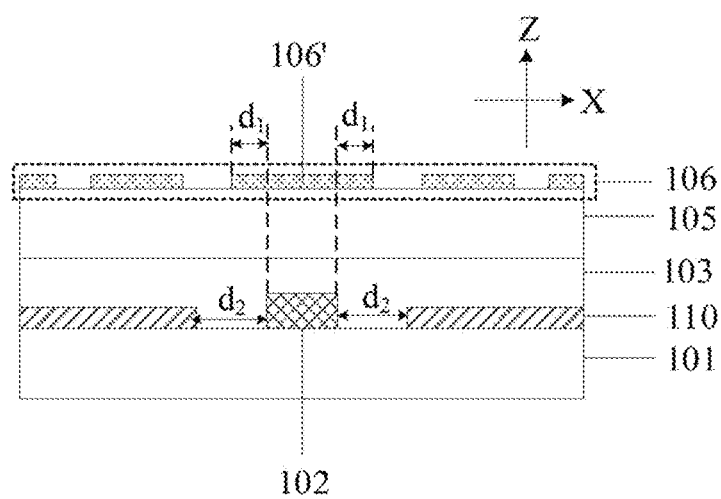
FIG. 8 is a cross-sectional view taken along line I-I' in FIG. 1.
Figure 9:
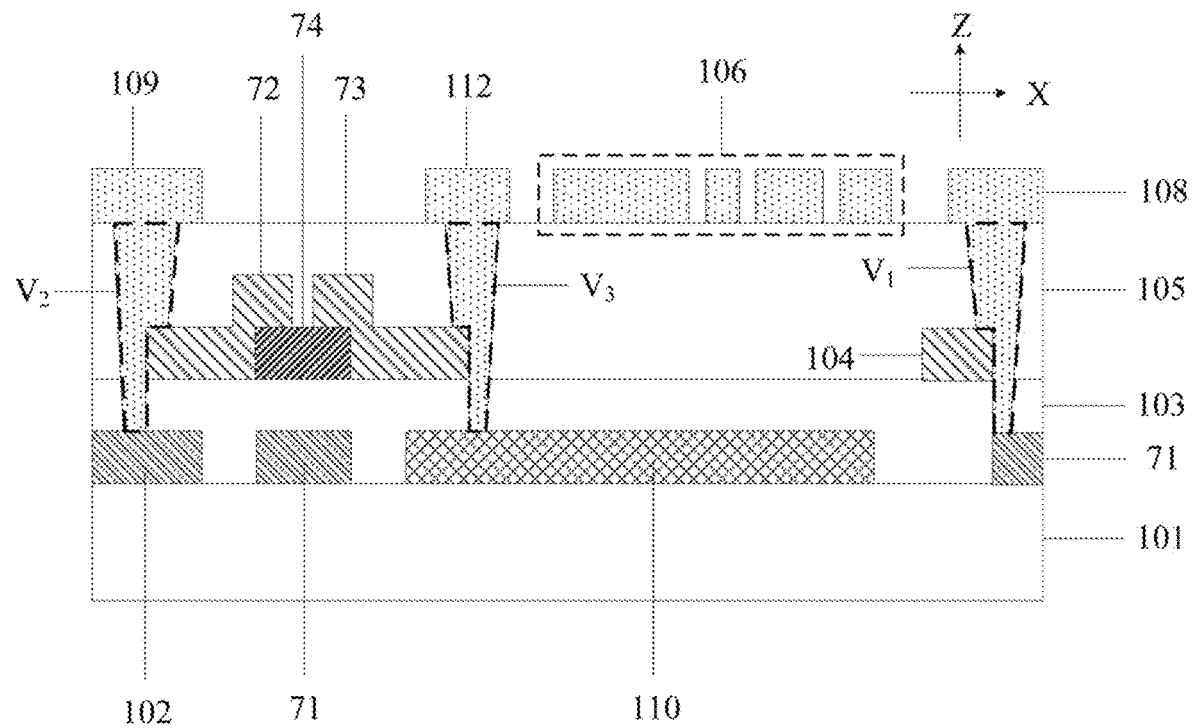
FIG. 9 is a cross-sectional view taken along line II-II' in FIG. 1.
Figure 10:
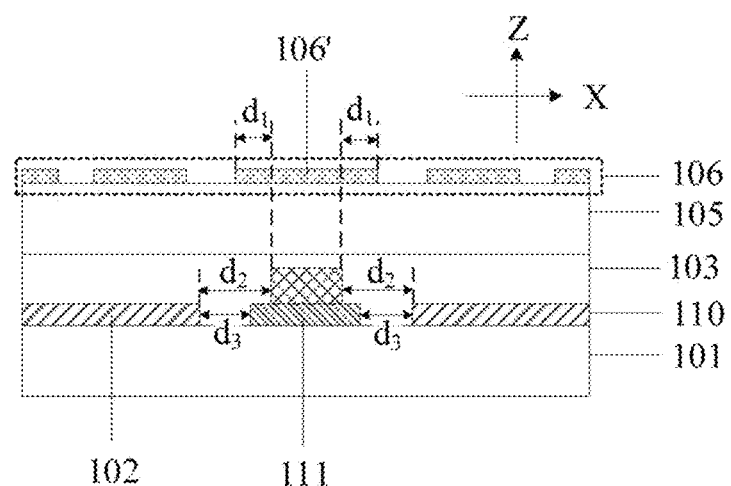
FIG. 10 is a cross-sectional view taken along line III-III' in FIG. 7.
Figure 11:
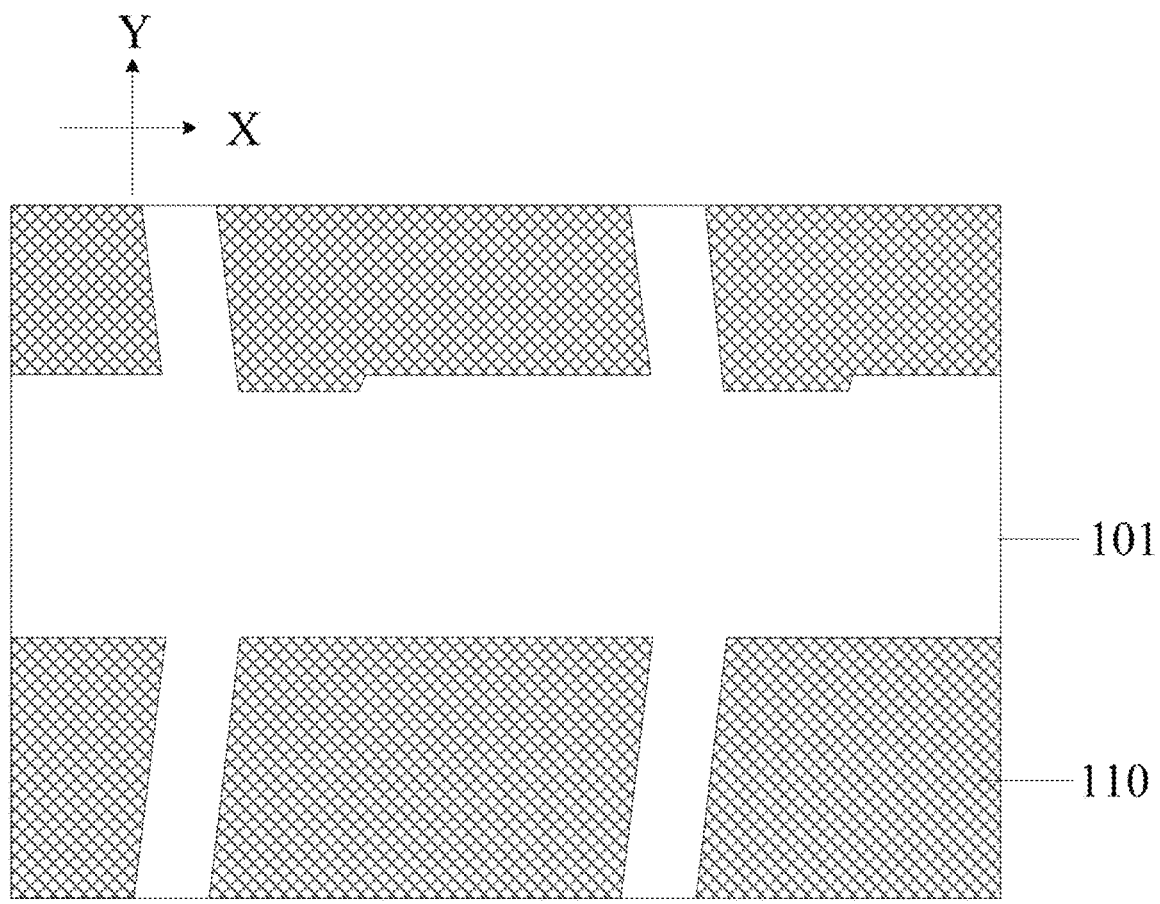
FIG. 11 is a schematic diagram illustrating a structure of a layer where the second electrode is positioned shown in FIG. 5.
Figure 12:
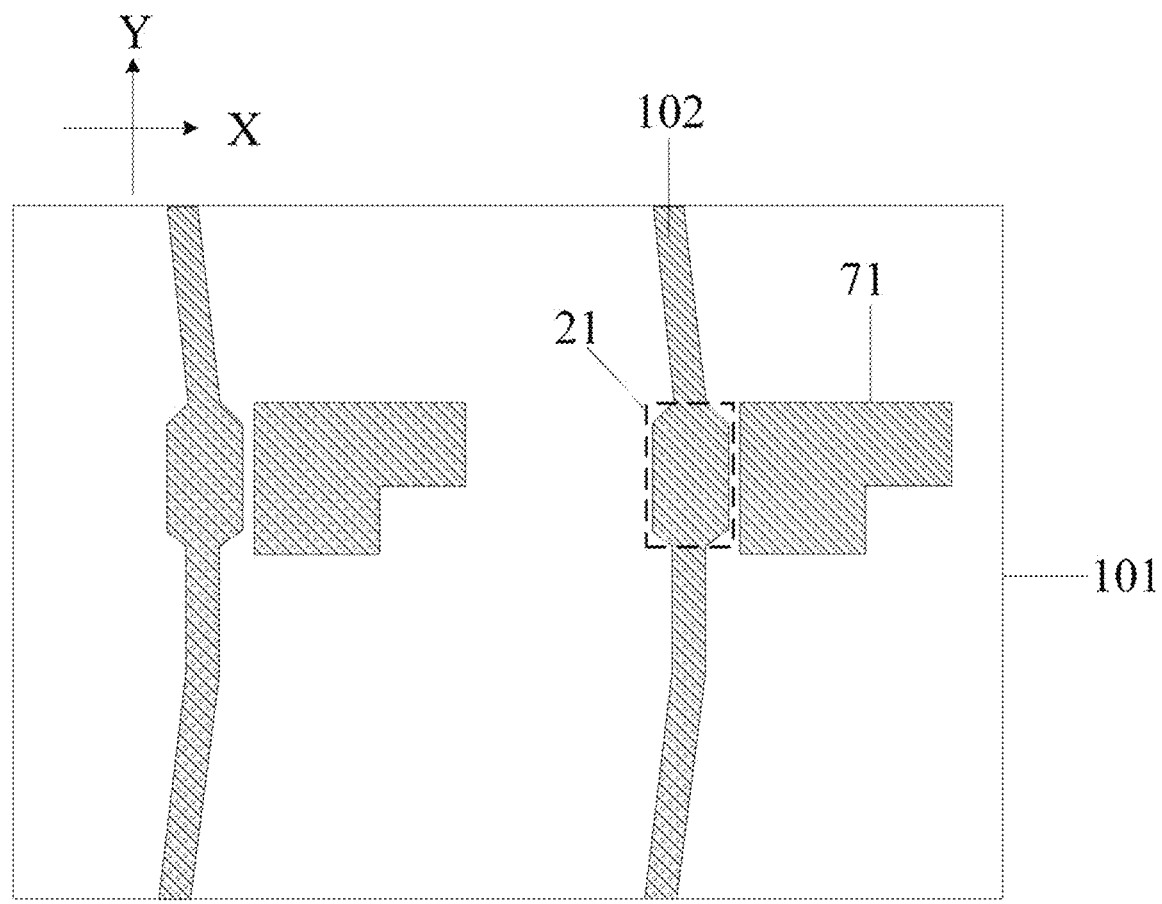
FIG. 12 is a schematic diagram illustrating a structure of a layer where the data lines are positioned shown in FIG. 5.
Figure 13:
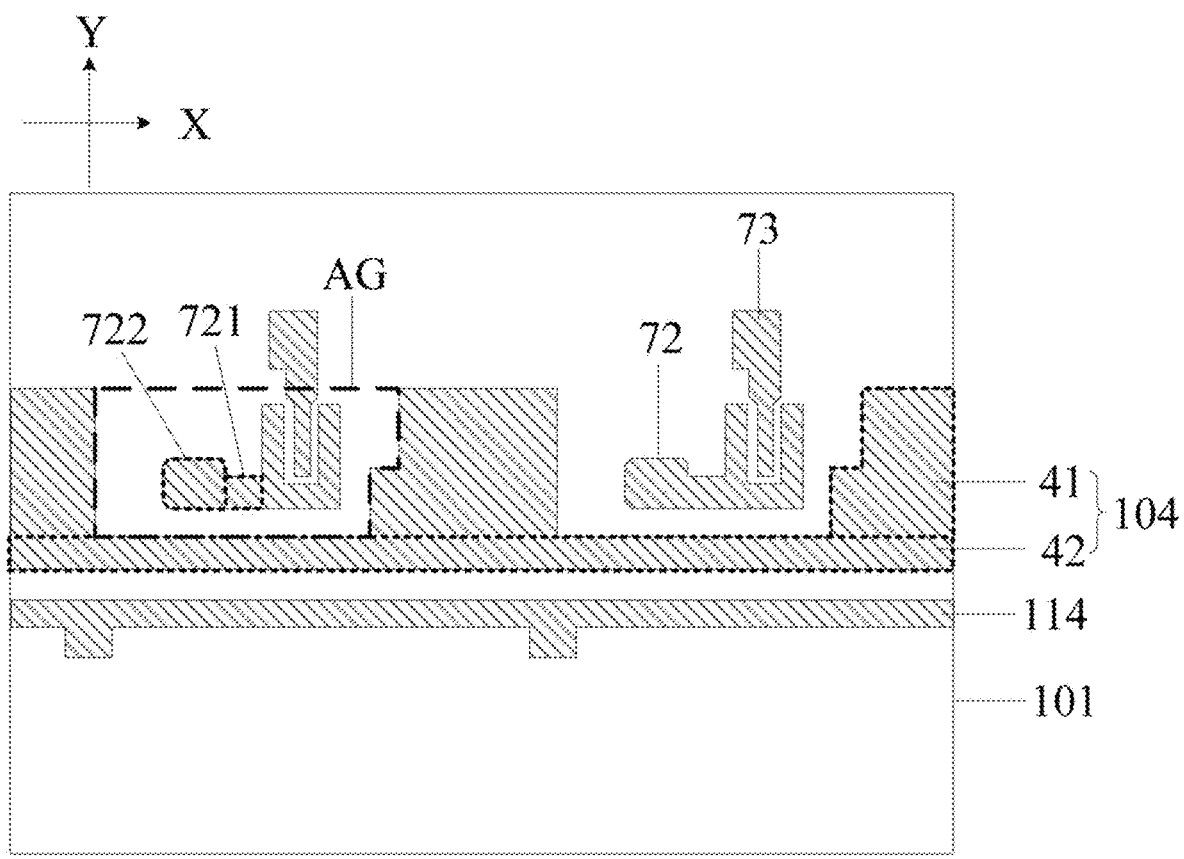
FIG. 13 is a schematic diagram illustrating a structure of a layer where the gate lines are positioned shown in FIG. 5.
Figure 14:
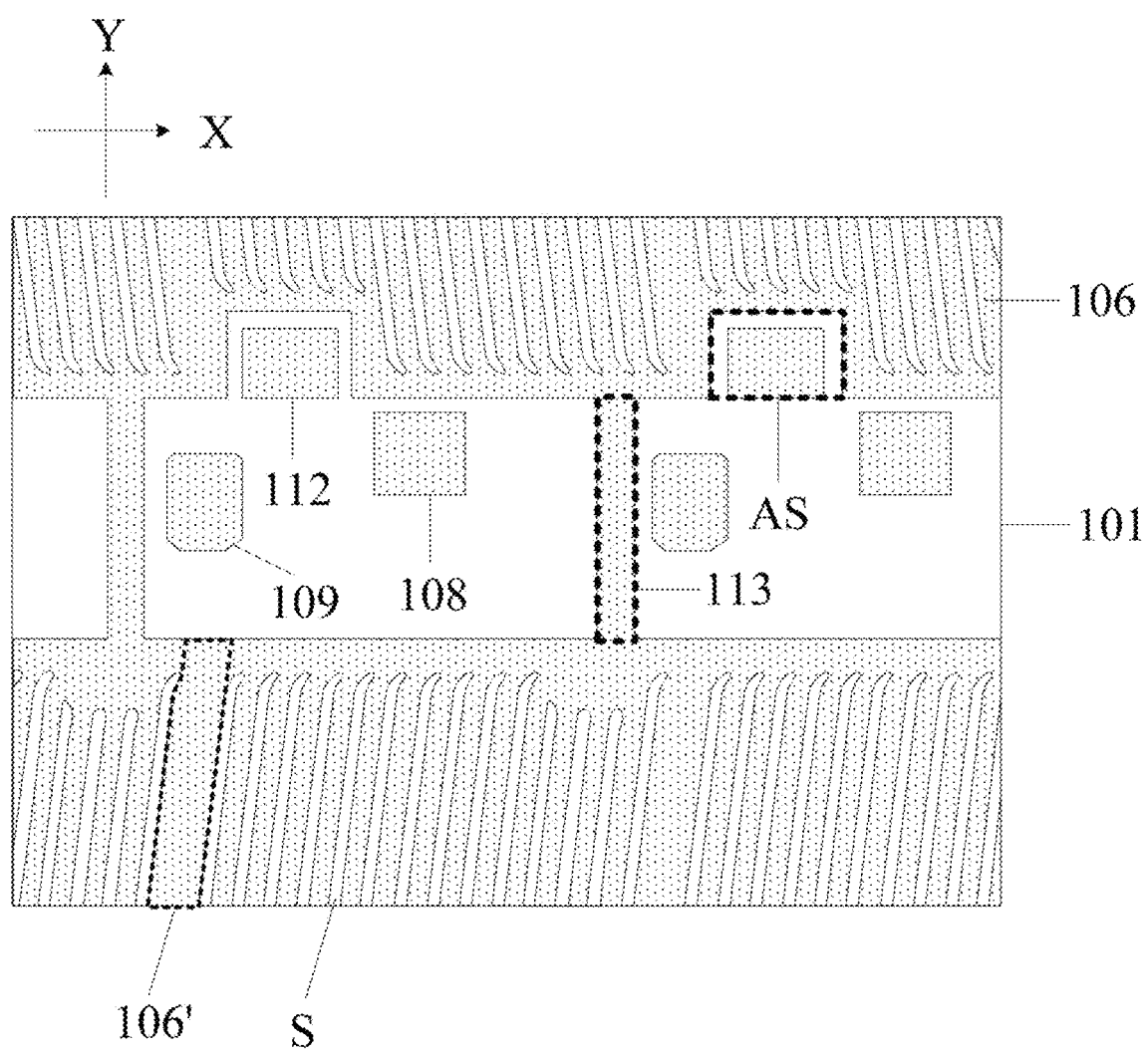
FIG. 14 is a schematic diagram illustrating a structure of a layer where the first electrode is positioned shown in FIG. 5.
Figure 15:
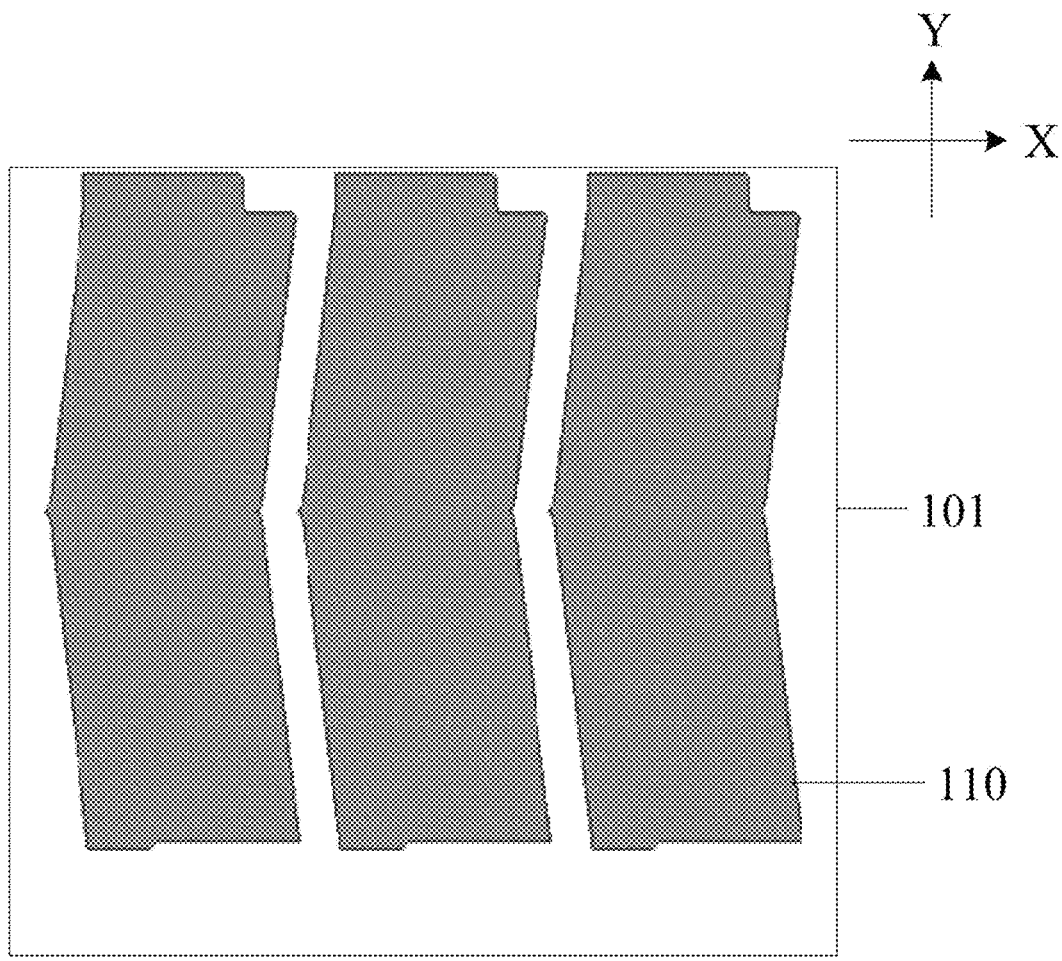
FIG. 15 is a schematic diagram illustrating a structure of a layer where the second electrode is positioned shown in FIG. 6.
Figure 16:
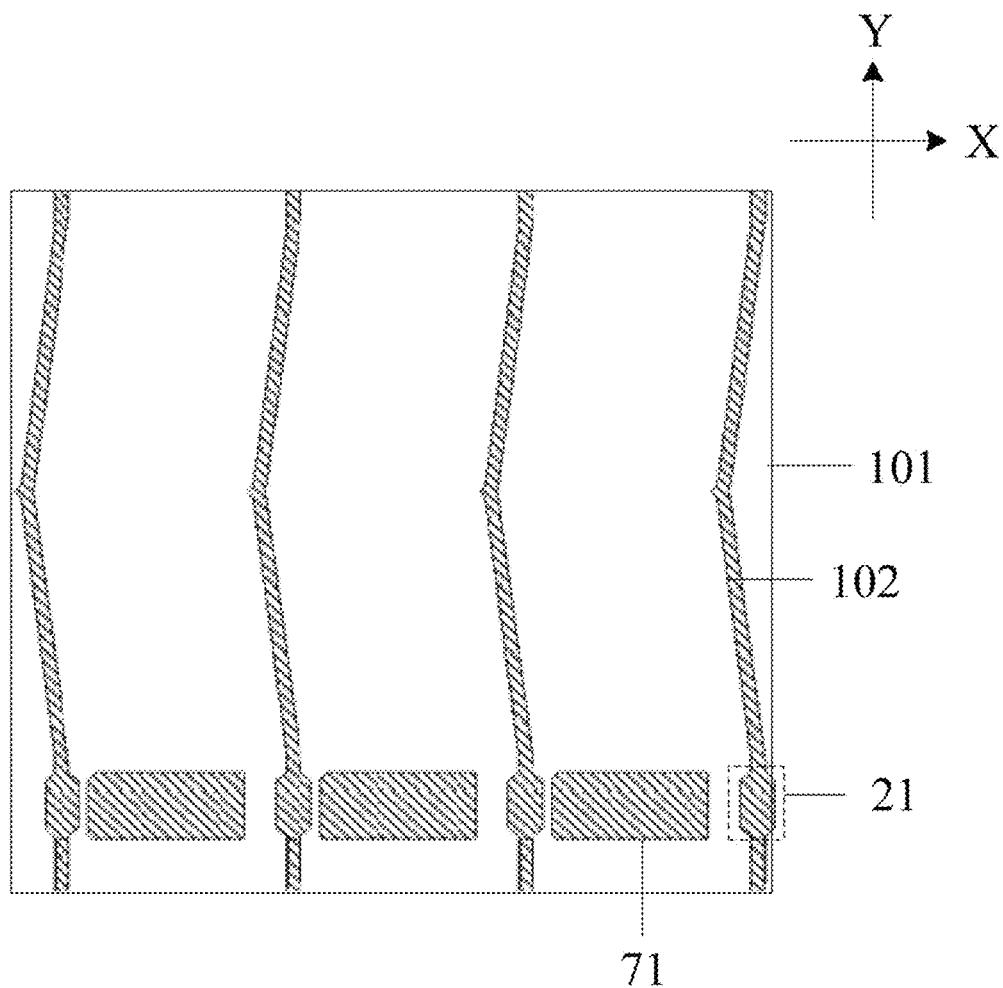
FIG. 16 is a schematic diagram illustrating a structure of a layer where the data lines are positioned shown in FIG. 6.
Figure 17:
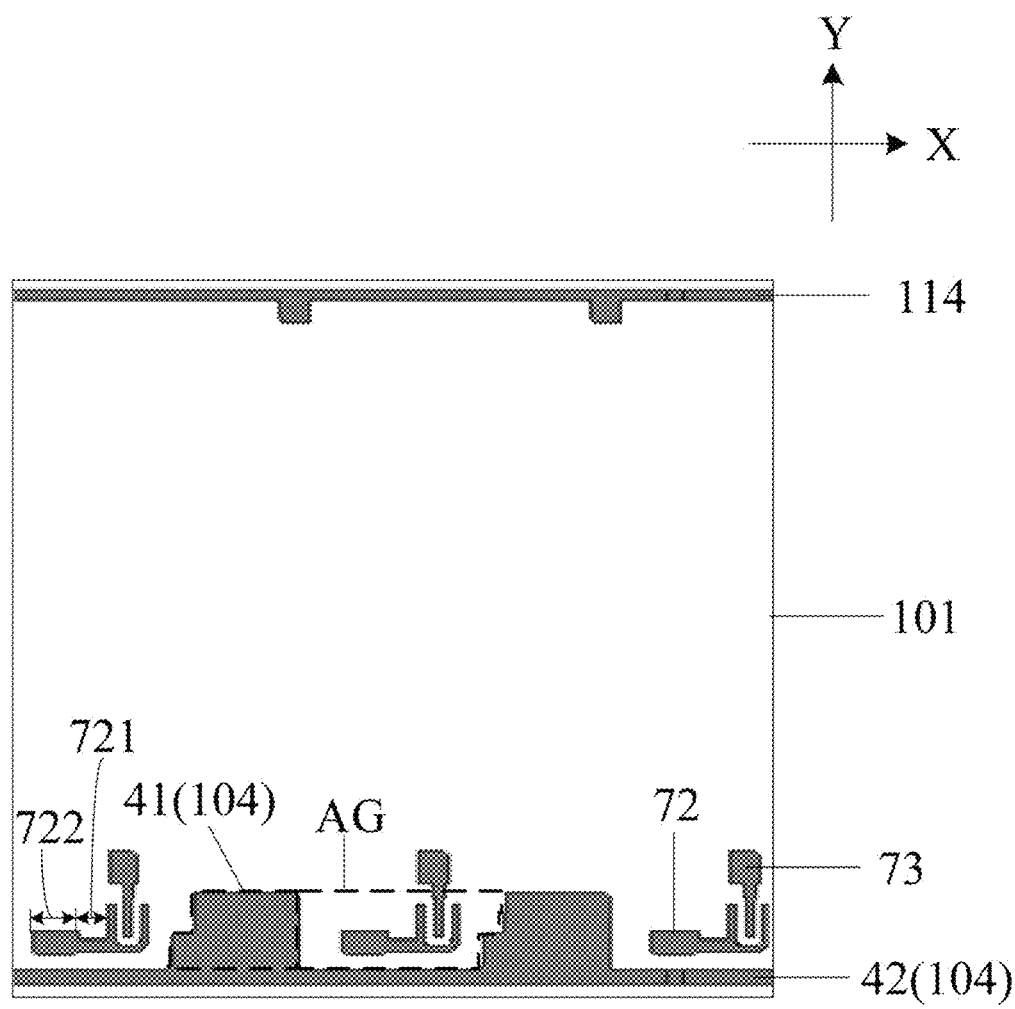
FIG. 17 is a schematic diagram illustrating a structure of a layer where the gate lines are positioned shown in FIG. 6.
Figure 18:
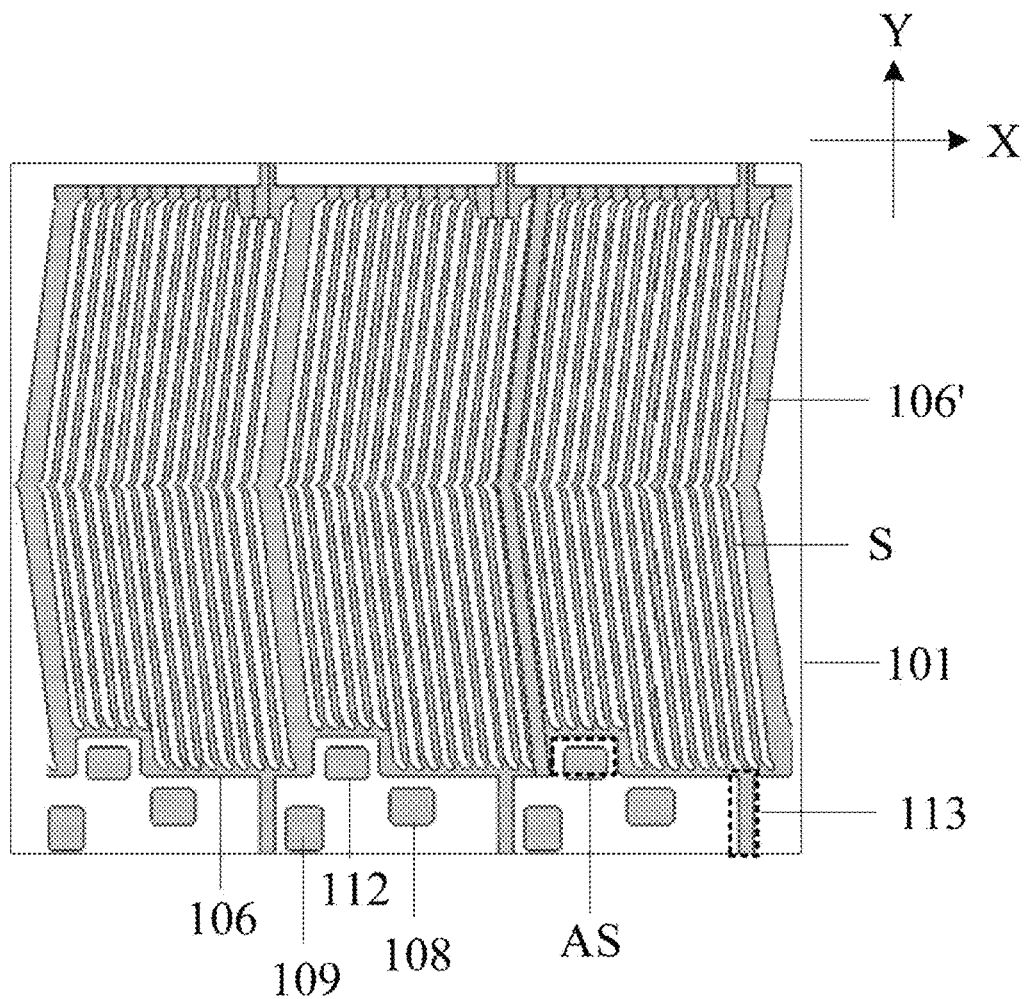
FIG. 18 is a schematic diagram illustrating a structure of a layer where the first electrode is positioned shown in FIG. 6.
Figure 19:
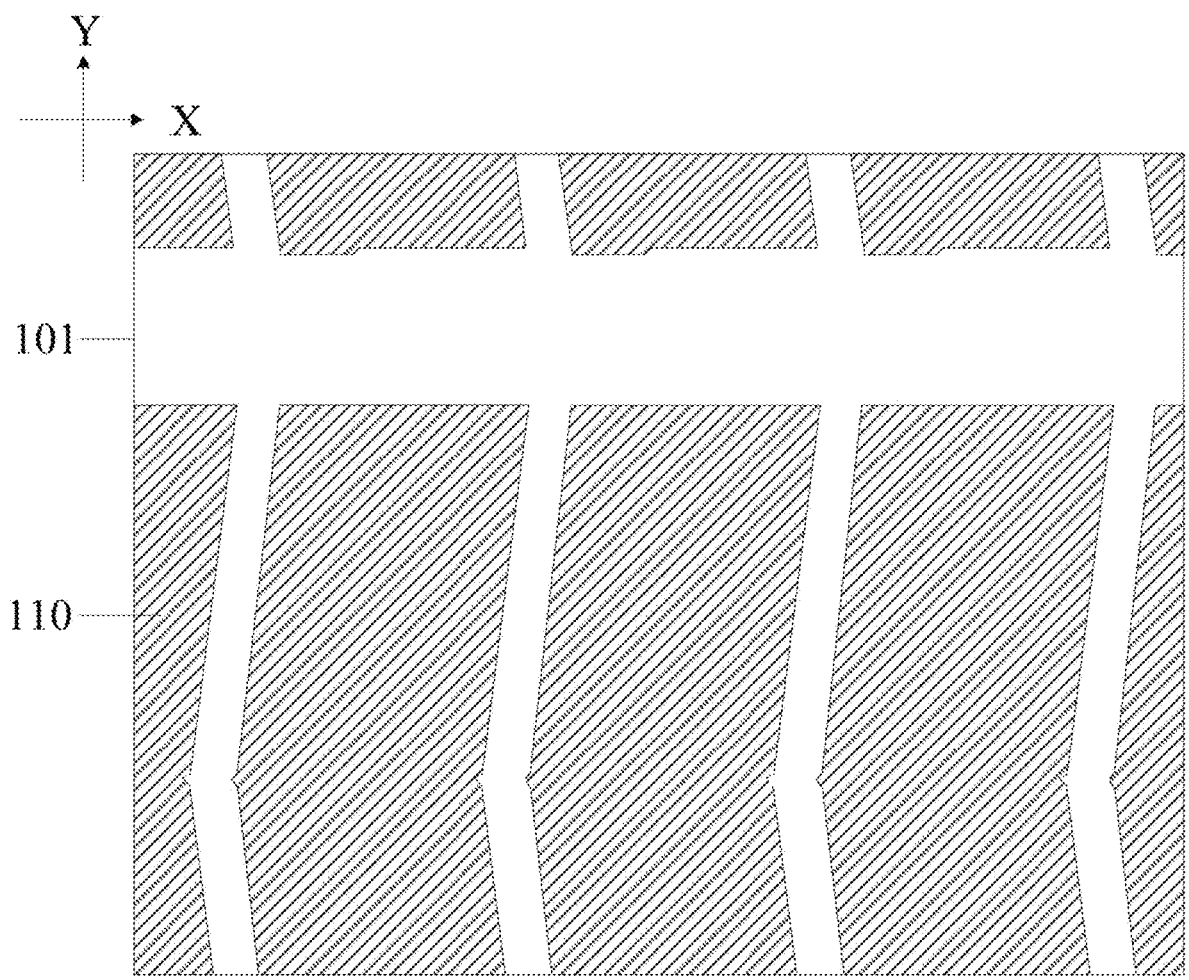
FIG. 19 is a schematic diagram illustrating a structure of a layer where the second electrode is positioned shown in FIG. 7.
Figure 20:
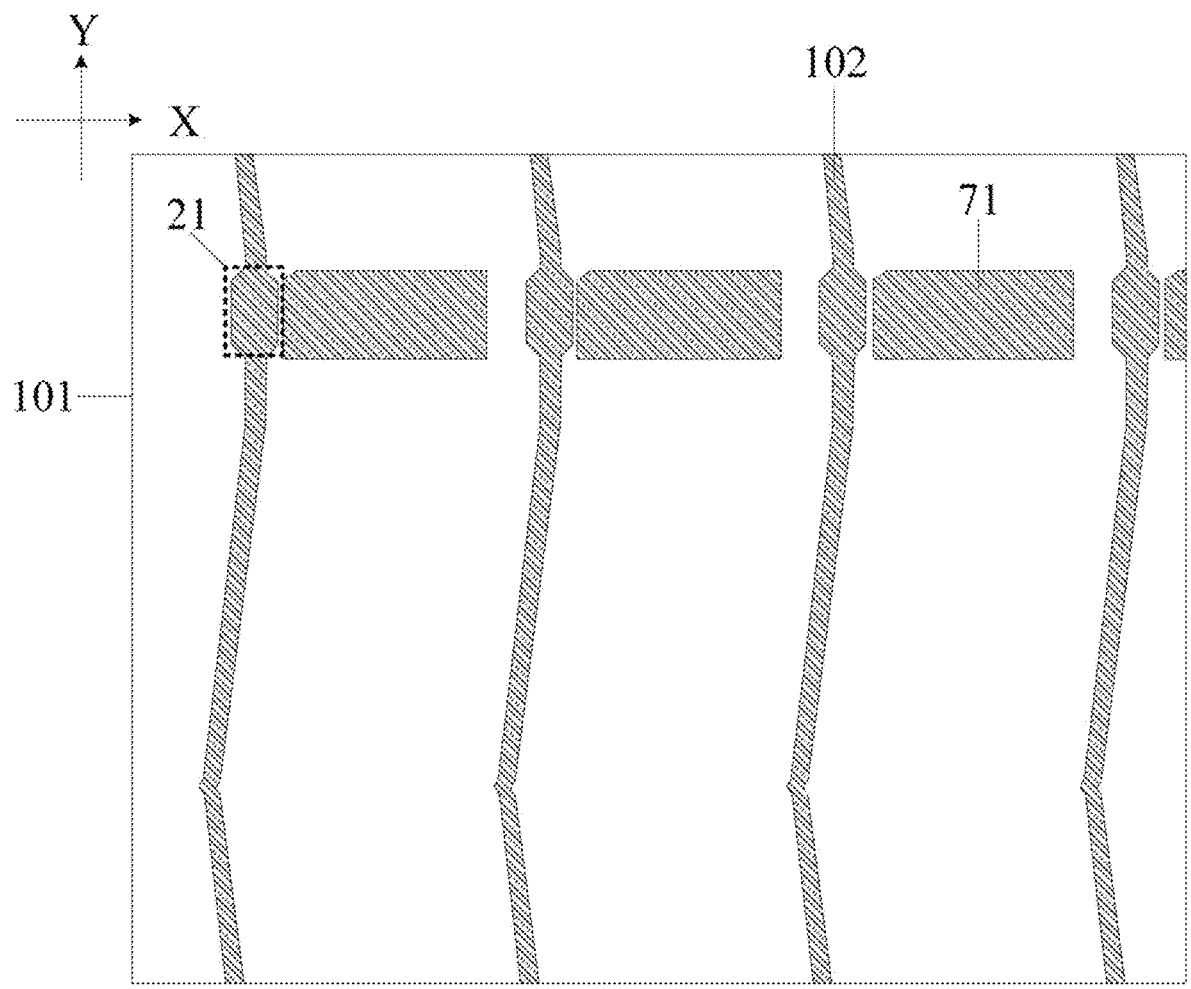
FIG. 20 is a schematic diagram illustrating a structure of a layer where the data lines are positioned shown in FIG. 7.
Figure 21:
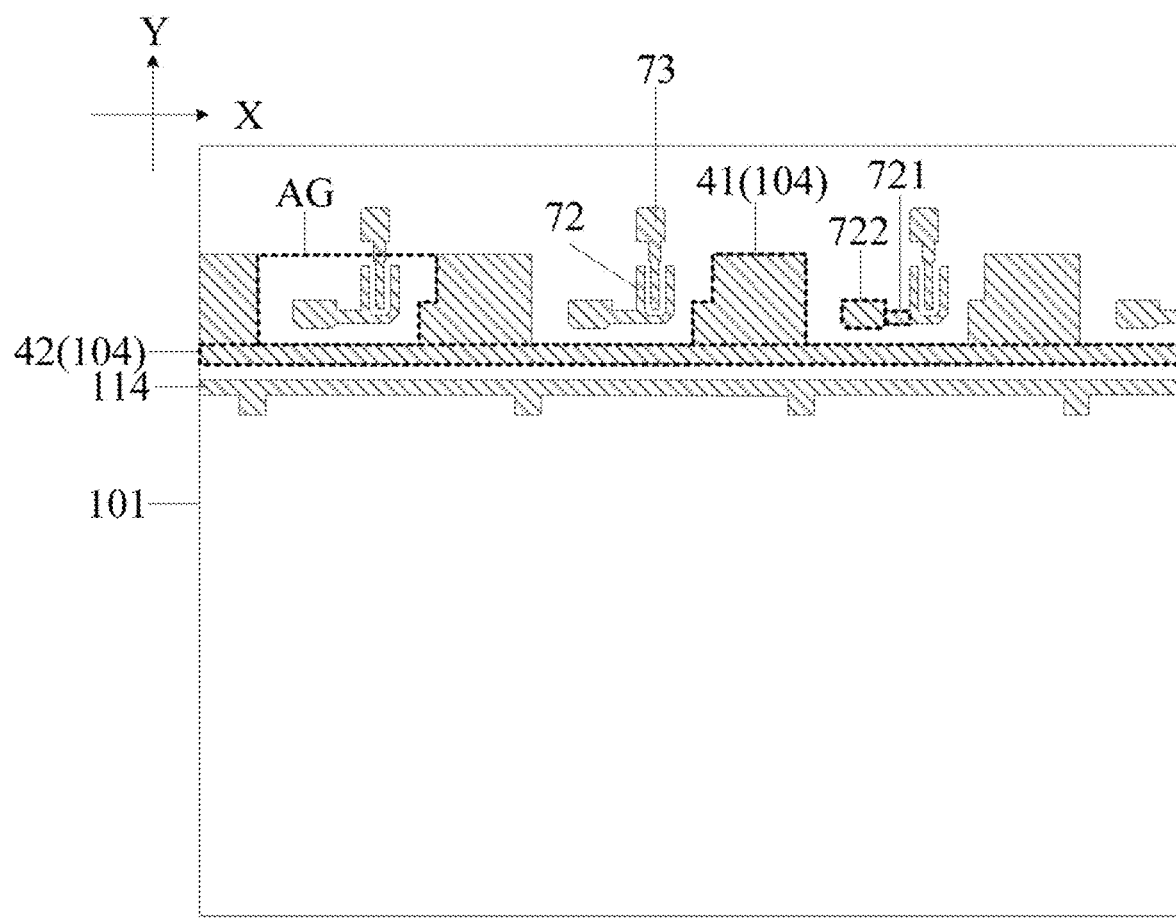
FIG. 21 is a schematic diagram illustrating a structure of a layer where the gate lines are positioned shown in FIG. 7.
Figure 22:
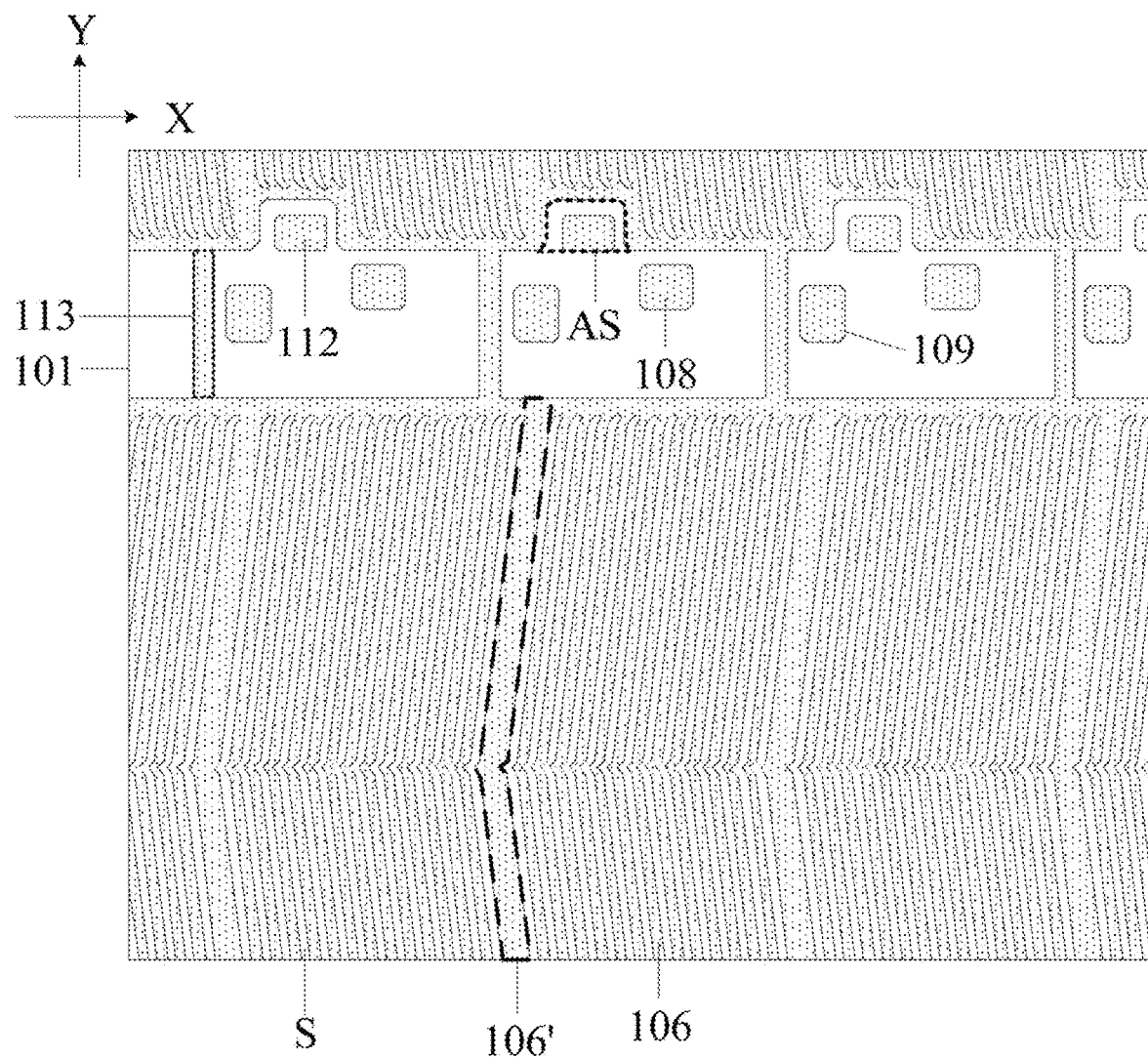
FIG. 22 is a schematic diagram illustrating a structure of a layer where the first electrode is positioned shown in FIG. 7.

In some embodiments, in the display substrate according to the embodiment of the present disclosure, as shown in FIGS. 8, 10 and 23, an orthographic projection of the second electrode 110 on the base substrate 101 is positioned within a region surrounded by orthographic projections of respective data lines 102 on the base substrate 101 and orthographic projections of respective gate lines 104 on the base substrate 101, and a distance d2 between the orthographic projection of the second electrode 110 on the base substrate 101 and the orthographic projection of the data line 102 on the base substrate 101 is greater than or equal to 6.4 µm. Under the condition that the distance d2 between the orthographic projection of the second electrode 110 on the base substrate 101 and the orthographic projection of the data line 102 on the base substrate 101 is greater than or equal to 6.4 µm, not only the second electrode 110 and the data line 102 can be prevented from being overlapped due to process fluctuation, but also the dark region at and near the data line 102 can be prevented from being too large, thereby avoiding a large transmittance loss.

In some embodiments, in the display substrate according to the embodiment of the present disclosure, as shown in FIG. 8, the second electrode 110 and the data line 102 may be disposed in the same layer and made of different materials. In this case, the pattern of the second electrode 110 may be first formed using one mask, and then the pattern of the data line 102 may be formed using another mask. Optionally, to ensure the transmittance, the second electrode 110 is made of a transparent conductive material such as indium tin oxide (ITO), indium zinc oxide (IZO), or zinc oxide (ZnO).

In some embodiments, in the display substrate according to the embodiment of the present disclosure, after a first conductive film layer for manufacturing the second electrode 110 and a second conductive film layer for manufacturing the data line 102 are sequentially formed, a mask may be used to pattern the first conductive film layer and the second conductive film layer to form a pattern of the second electrode 110 and the data line 102. In this case, the shielding effect of the data line 102 may cause the presence of the pattern of the first conductive film layer below the data line 102, specifically as shown in FIG. 10, the display substrate further includes a resistance reduction line 111, which is disposed in the same layer and made of the same material as the second electrode 110, and the resistance reduction line 111 is electrically connected to the data line 102 in a contact manner. In order to prevent short circuit between the resistance reduction line 111 and the second electrode 110, a distance d3 between an orthographic projection of the resistance reduction line 111 on the base substrate 101 and the orthographic projection of the second electrode 110 on the base substrate 101 may be set to be greater than or equal to 4.8 µm, that is, the orthographic projection of the resistance reduction line 111 on the base substrate 101 exceeds by a distance of 1.6 µm relative to one side of the orthographic projection of the data line 102 on the base substrate 101. Optionally, to ensure the transmittance, the second electrode 110 is made of a transparent conductive material such as indium tin oxide (ITO), indium zinc oxide (IZO), or zinc oxide (ZnO).

Figure 26:
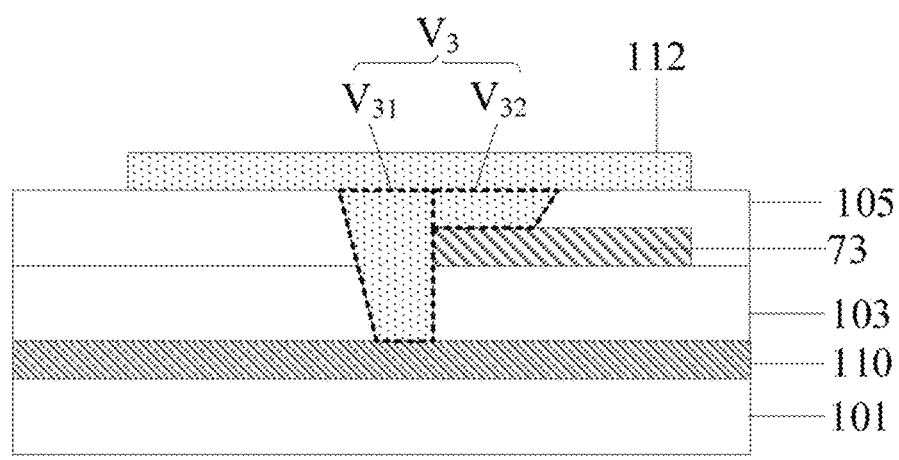
FIG. 26 is a cross-sectional view taken along line VI-VI' in FIG. 7.
Figure 29:
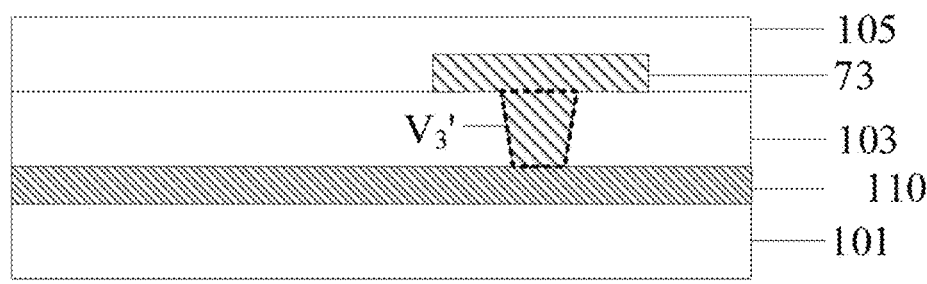
FIG. 29 is a schematic diagram illustrating the second electrode electrically connected to a second electrode of the transistor according to an embodiment of the present disclosure.

In some embodiments, in the display substrate according to the embodiment of the present disclosure, as shown in FIGS. 23 and 26, the second electrode 110 is a pixel electrode, and the display substrate further includes a third transfer electrode 112, which is disposed in the same layer and made of the same material as the first electrode 106. The third transfer electrode 112 is electrically connected to the second electrode 106 through a fifth via $V_{31}$ penetrating through the first insulating layer 103 and the second insulating layer 105, and is electrically connected to the second electrode 73 of the transistor 107 through a sixth via $V_{32}$ penetrating through the second insulating layer 105. In this case, the fabrication of the third transfer electrode 112 can be completed at the same time of fabricating the first electrode 106, thereby avoiding an additional process for fabricating the third transfer electrode 112. Furthermore, a sixth via $V_{32}$ penetrating through the second insulating layer 105 and used for electrically connecting the third transfer electrode 108 and the second electrode 73 and a fifth via $V_{31}$ penetrating through the first insulating layer 103 and the second insulating layer 105 and used for electrically connecting the third transfer electrode 103 and the second electrode 73 of the transistor 107 can be simultaneously formed by one patterning process, thereby avoiding an additional process of patterning the first insulating layer 103. It should be understood that in some embodiments, as shown in FIG. 29, the second electrode 110 may alternatively be electrically connected to the second electrode 73 of the transistor 107 by a ninth via $V_3'$ penetrating through the first insulating layer 103.

In some embodiments, in the display substrate according to the embodiment of the present disclosure, as shown in FIGS. 23 and 26, in order to ensure a small lap resistance between the third transfer electrode 112 and the second electrode 110 and a good topography of the fifth via $V_{31}$, an orthographic projection of the fifth via $V_{31}$ on the base substrate 101 may be positioned within the orthographic projection of the second electrode 110 on the base substrate 101. An aperture of the fifth via $V_{31}$ in the direction Z away from the base substrate 101 is gradually increased. The fifth via $V_{31}$ includes a fifth port close to the base substrate 101, a length m of the fifth port in the extension direction X of the gate line 104 is greater than or equal to 3 µm, and a width r of the fifth port in the extension direction Y of the data line 102 is greater than or equal to 6 µm. Optionally, the length m is 4.75 µm, and the width r is 6 µm.

In some embodiments, in the display substrate according to the embodiment of the present disclosure, as shown in FIGS. 23 and 26, in order to ensure a small lap resistance between the third transfer electrode 112 and the second electrode 73 of the transistor 107 and a good topography of the sixth via $V_{32}$, the orthographic projection of the sixth via $V_{32}$ on the base substrate 101 may be positioned within an orthographic projection of the second electrode 73 of the transistor 107 on the base substrate 101. An aperture of the sixth via $V_{32}$ in the direction Z away from the base substrate 101 is gradually increased. The sixth via $V_{32}$ includes a sixth port close to the base substrate 101, a length n of the sixth port in the extension direction X of the gate line 104 is greater than or equal to 3 µm, and a width r' of the sixth port in the extension direction Y of the data line 102 is greater than or equal to 8 µm. Optionally, the length n is 6.25 µm, and the width r' is 8 µm.

In some embodiments, in the display substrate according to the embodiment of the present disclosure, as shown in FIG. 23, to simplify the design of the via, the fifth via $V_{31}$ and the sixth via $V_{32}$ may be integrally provided as a third through hole $V_3$. Optionally, an orthographic projection of the third through hole $V_3$ on the base substrate 101 is positioned within the orthographic projection of the third transfer electrode 112 on the base substrate 101, and a one-side excess distance l/o/q/s of the orthographic projection of the third transfer electrode 112 on the base substrate 101 relative to the orthographic projection of the third through hole $V_3$ on the base substrate 101 in the extension direction Y of the data line 102 and/or the extension direction X of the gate line 104 is greater than or equal to 3 µm. Under such condition, even if process fluctuation occurs, the third transfer electrode 112 can still cover the third through hole $V_3$ well, which reduces the risk of corrosion of the second electrode 73 caused by moisture contact through the third through hole $V_3$.

In some embodiments, in the display substrate according to the embodiment of the present disclosure, as shown in FIG. 23, the first electrode 106 includes an avoidance slot AS. Optionally, an opening of the avoidance slot AS faces the accommodating groove AG, the third transfer electrode 112 is positioned in the avoidance slot AS, and a distance p between the third transfer electrode 112 and the avoidance slot AS is greater than or equal to 4 μm, so as to prevent short circuit between the third transfer electrode 112 and the first electrode 106 that are disposed in the same layer and made of the same material.

In some embodiments, as shown in FIG. 23, the display substrate according to the embodiment of the present disclosure may further include a first connection line 113, which is disposed in the same layer and made of the same material as the first electrode 106, and the first connection line 113 is electrically connected to a non-pixel electrode (such as the first electrode 106 in FIG. 23) in the extension direction Y of the data line 102, so that the overall resistance of the non-pixel electrode in the capacitor is relatively small, and meanwhile, the voltage uniformity and stability of the non-pixel electrode in the capacitor in the extension direction Y of the data line 102 are also improved.

In some embodiments, in the display substrate according to the embodiment of the present disclosure, as shown in FIG. 23, the first connection line 113 may cross over the accommodating groove AG along the extension direction Y of the data line 102. Optionally, the first connection line 113 crosses over the accommodating groove AG within a distance y, which is between the protrusion 41 and the widened portion 21 adjacent to and not electrically connected to the protrusion 41. Such setting can ensure a small coupling capacitance between the first connection line 113 and the gate line 104.

In some embodiments, in the display substrate according to the embodiment of the present disclosure, as shown in FIG. 23, a distance v between an orthographic projection of the first connection line 113 on the base substrate 101 and the orthographic projection of the protrusion 41 closest to the connection line 113 on the base substrate 101 is greater than or equal to 3 μm, so as to avoid overlapping of the first connection line 113 and the protrusion 41 caused by process fluctuation and the like.

In some embodiments, in the display substrate according to the embodiment of the present disclosure, as shown in FIG. 23, a distance x between the orthographic projection of the first connection line 113 on the base substrate 101 and the orthographic projection of a data line 102 (specifically, the widened portion 21 of the data line 102) closest to the connection line 113 on the base substrate 101 is greater than or equal to 4 μm, so as to avoid overlapping of the first connection line 113 and the data line 102 caused by process fluctuation and the like.

In some embodiments, in the display substrate according to the embodiment of the present disclosure, as shown in FIG. 23, the width w of the first connection line 113 in the extension direction Y of a gate line 104 is greater than or equal to 4 μm, so as to prevent the first connection line 113 from breaking.

In some embodiments, as shown in FIGS. 5 to 7, 11, 14, 15, 18, 19 and 22, the first electrode 106 and the second electrode 110 are overlapped in a region surrounded by the data lines 102 and the gate lines 104 to form a liquid crystal capacitor (Clc), the first electrode 106 is a common electrode (Com) of a slit shape, and the second electrode 110 is a pixel electrode of a block shape. In addition, as can be seen from FIGS. 16, 18, 20 and 22, the first electrode 106 may be a double domain electrode, and an extension direction of the remaining portion of the data line 102 other than the widened portion 21 may be the same as an extension direction of the double domain electrode, in which case, the extension direction Y of the data line 102 in the present disclosure refers to an overall extension direction of the data line 102, i.e., a column direction.

Figure 30:
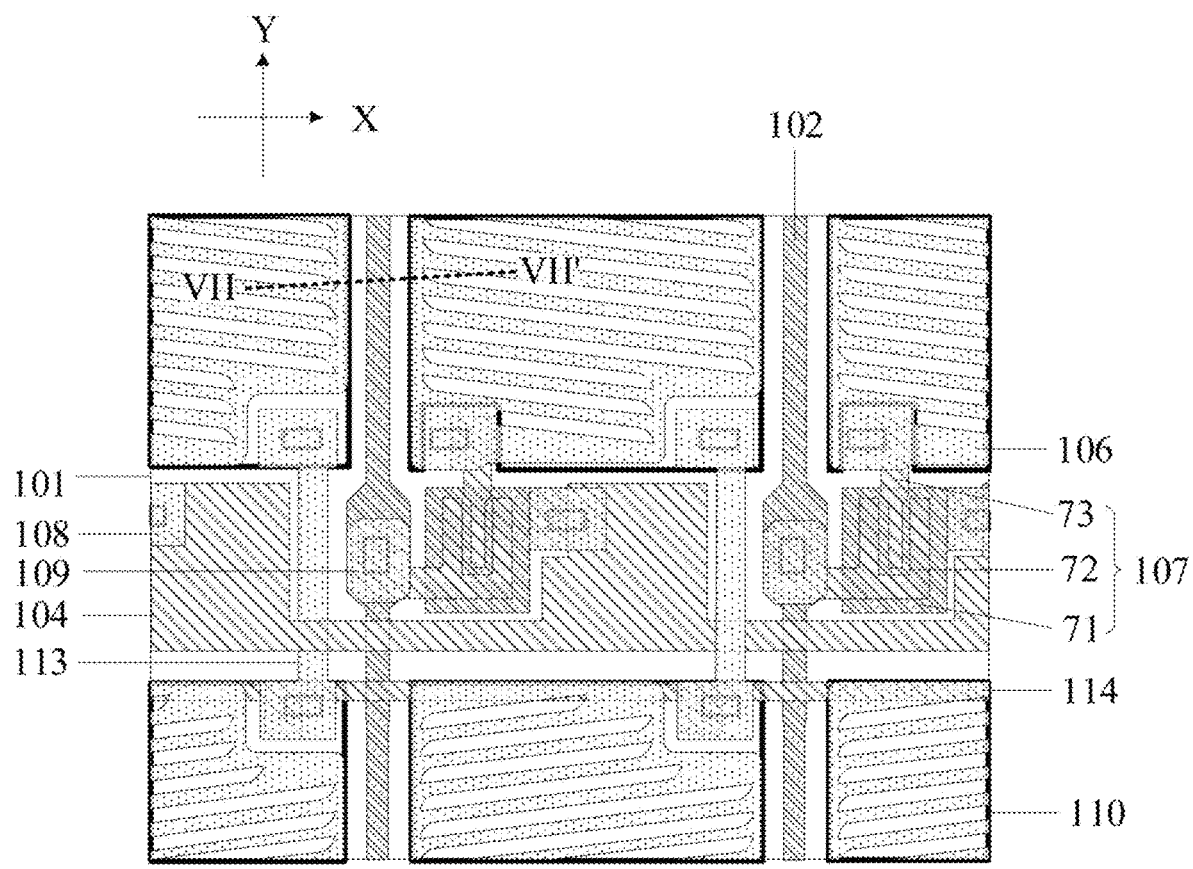
FIG. 30 is a schematic diagram illustrating another structure of the display substrate according to an embodiment of the present disclosure.
Figure 31:
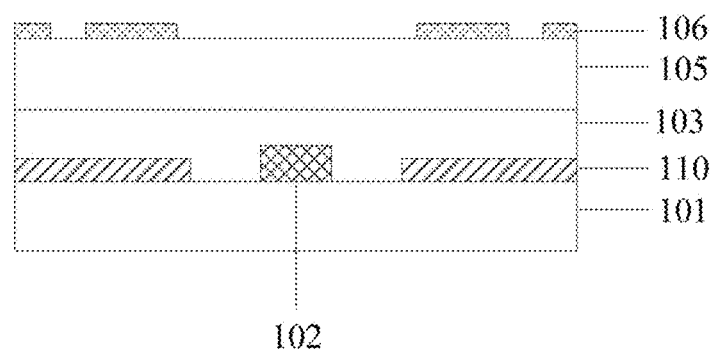
FIG. 31 is a cross-sectional view taken along line VII-VII' in FIG. 30.
Figure 32:
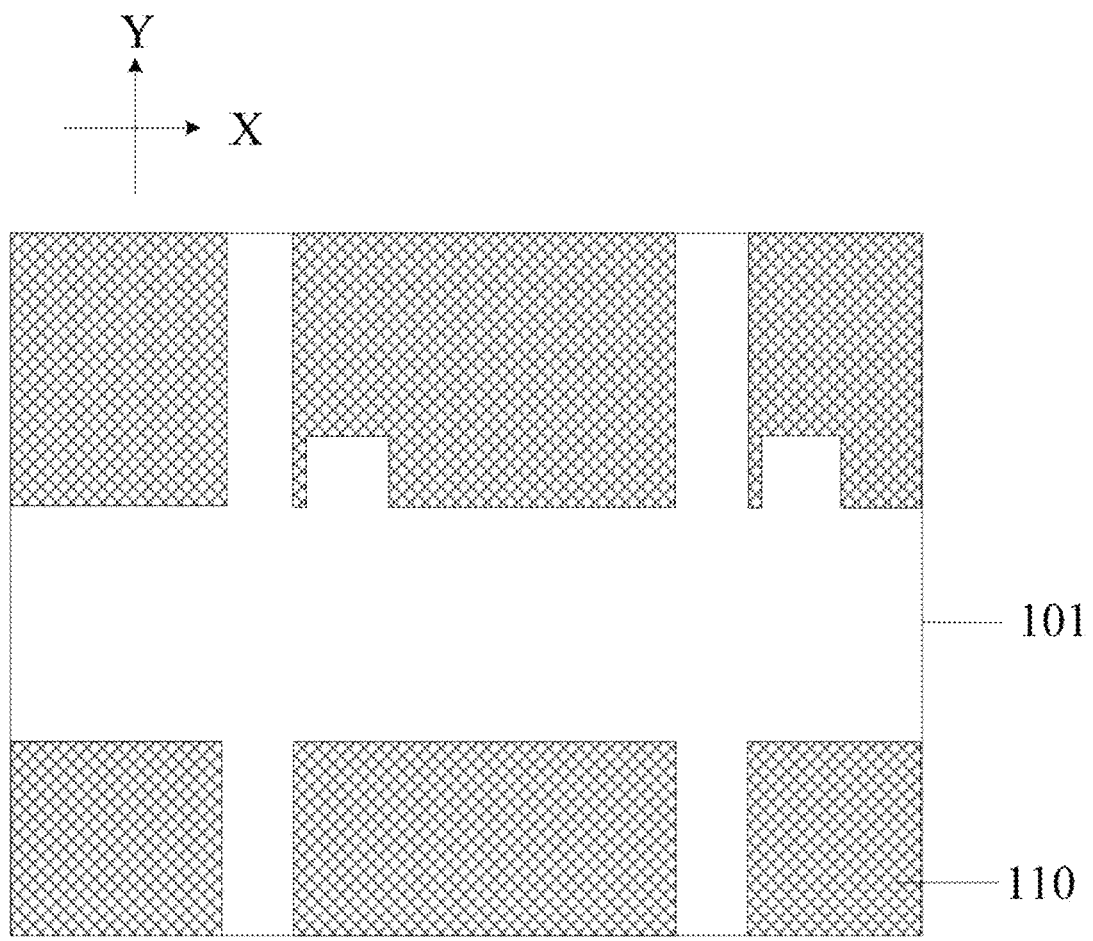
FIG. 32 is a schematic diagram illustrating a structure of a layer where the second electrode is positioned shown in FIG. 30.
Figure 33:
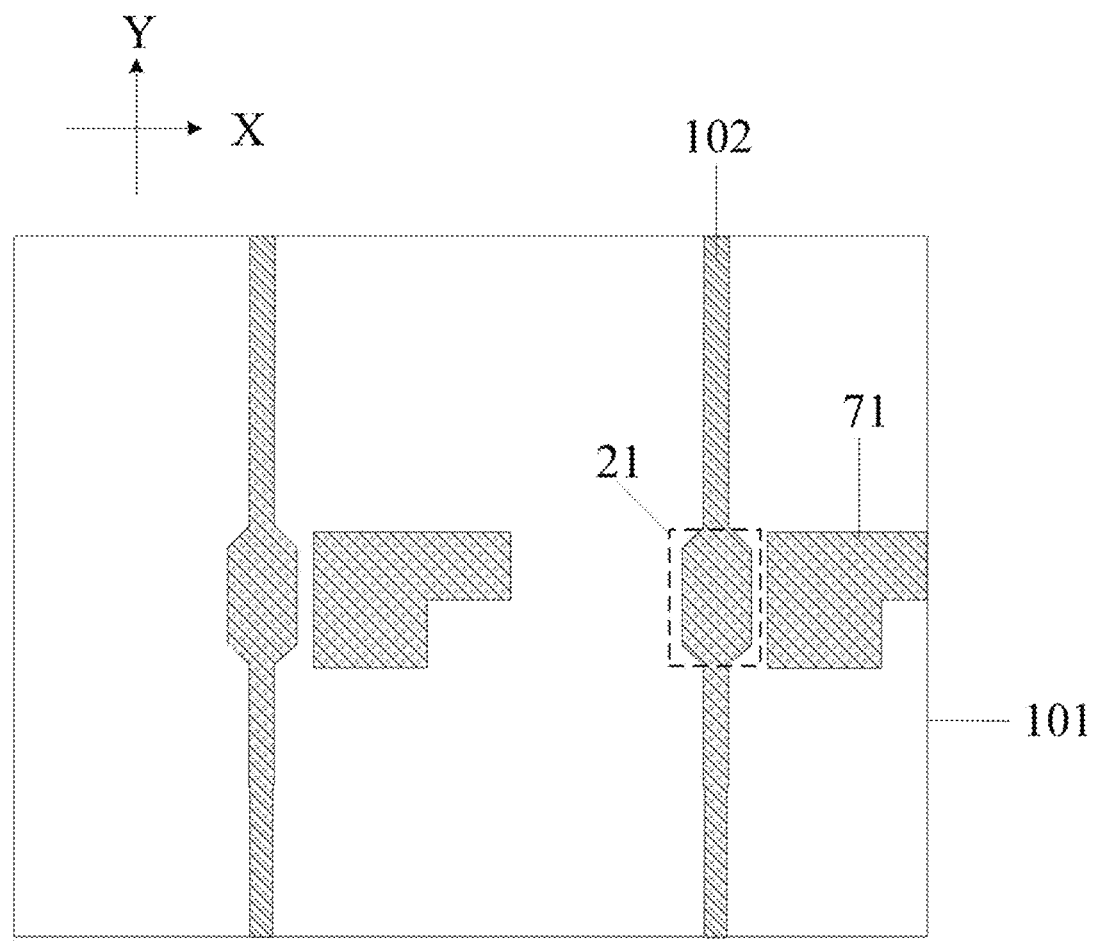
FIG. 33 is a schematic diagram illustrating a structure of a layer where the data lines are positioned shown in FIG. 30.
Figure 34:
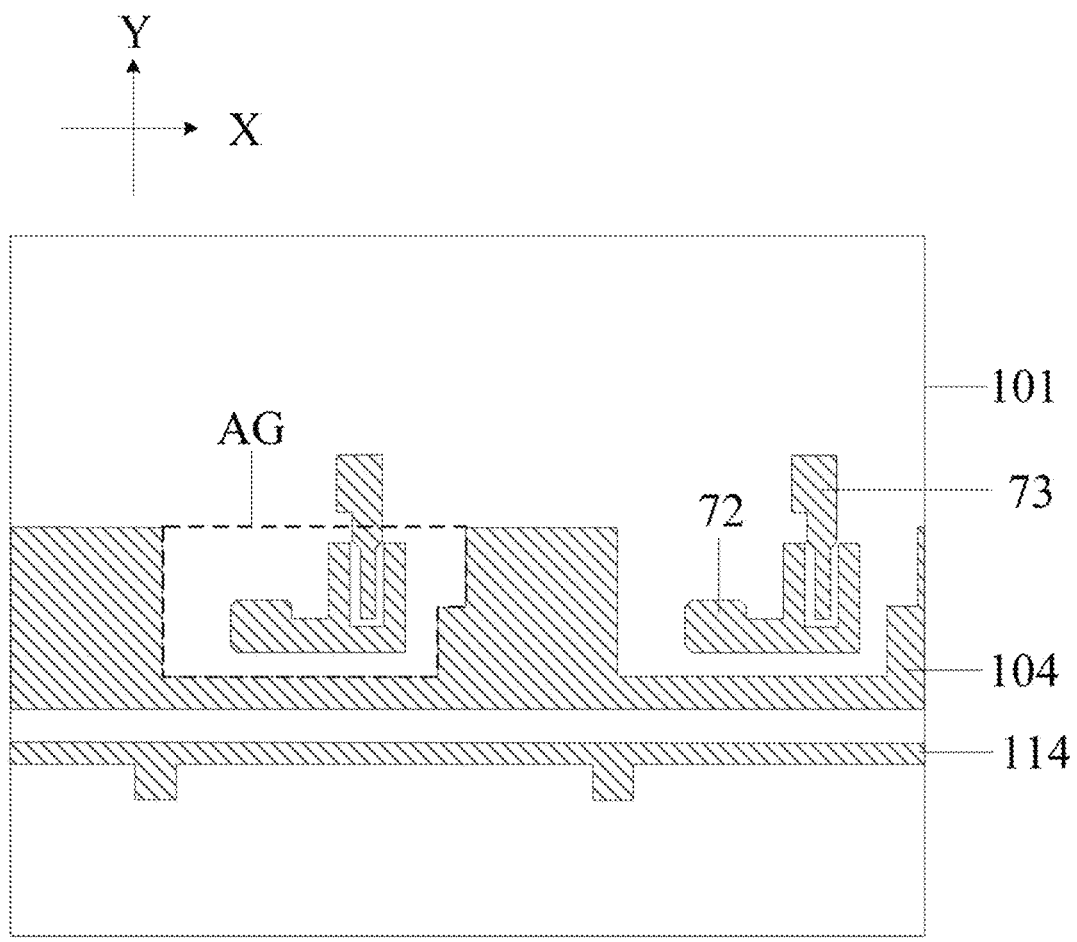
FIG. 34 is a schematic diagram illustrating a structure of a layer where the gate lines are positioned shown in FIG. 30.
Figure 35:
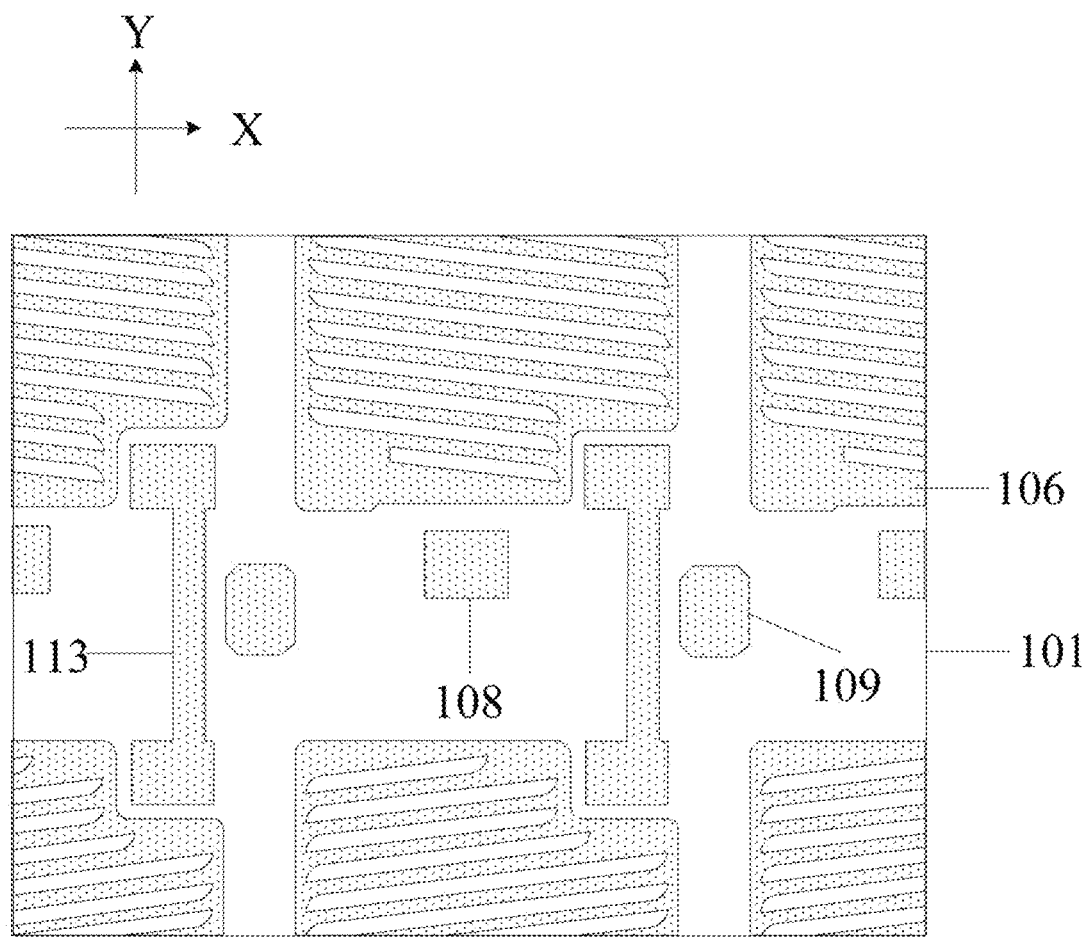
FIG. 35 is a schematic diagram illustrating a structure of a layer where the first electrode is positioned shown in FIG. 30.
Figure 36:
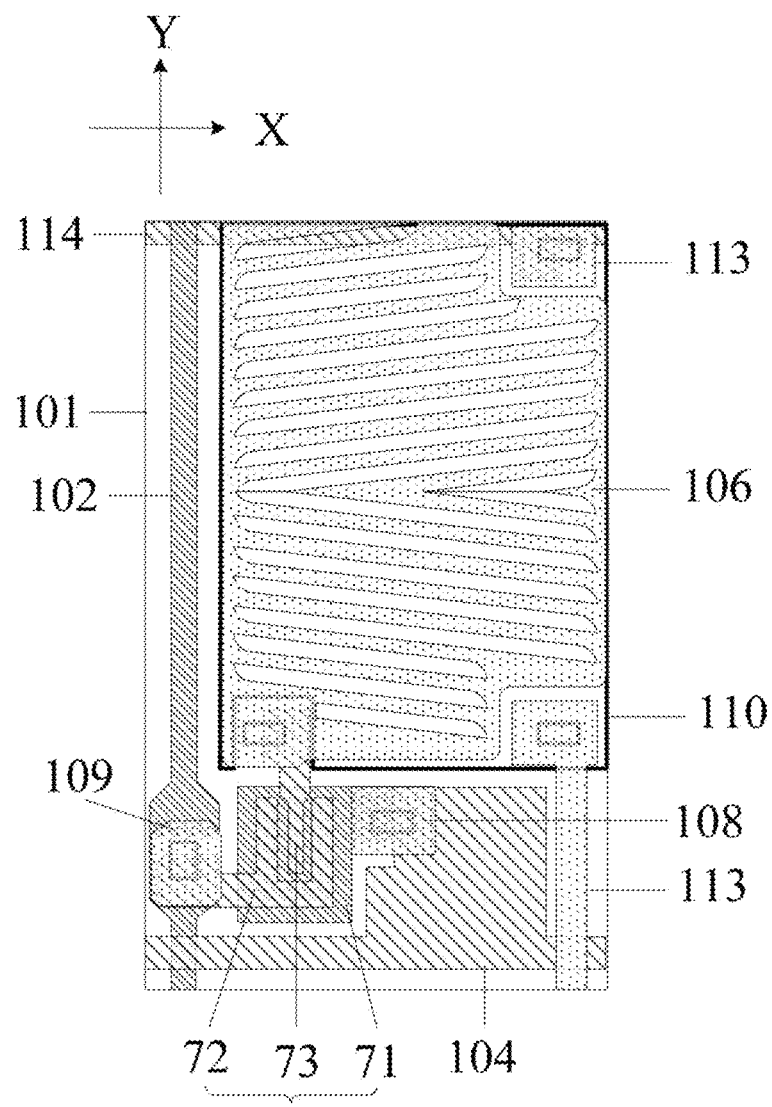
FIG. 36 is a schematic diagram illustrating another structure of the display substrate according to an embodiment of the disclosure.
Figure 37:
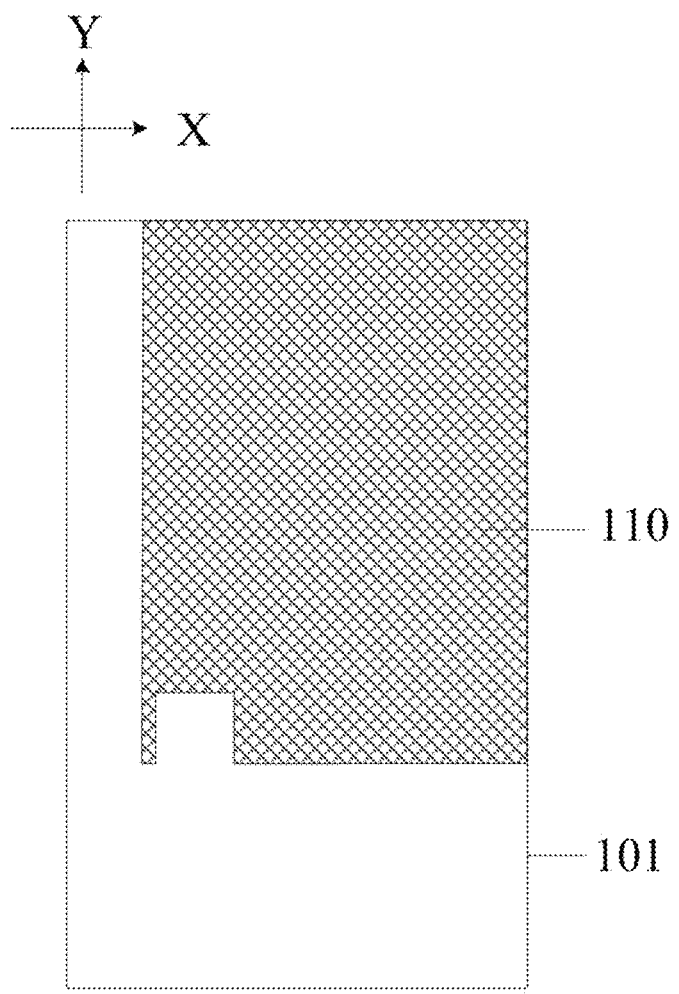
FIG. 37 is a schematic diagram illustrating a structure of a layer where the second electrode is positioned shown in FIG. 36.
Figure 38:
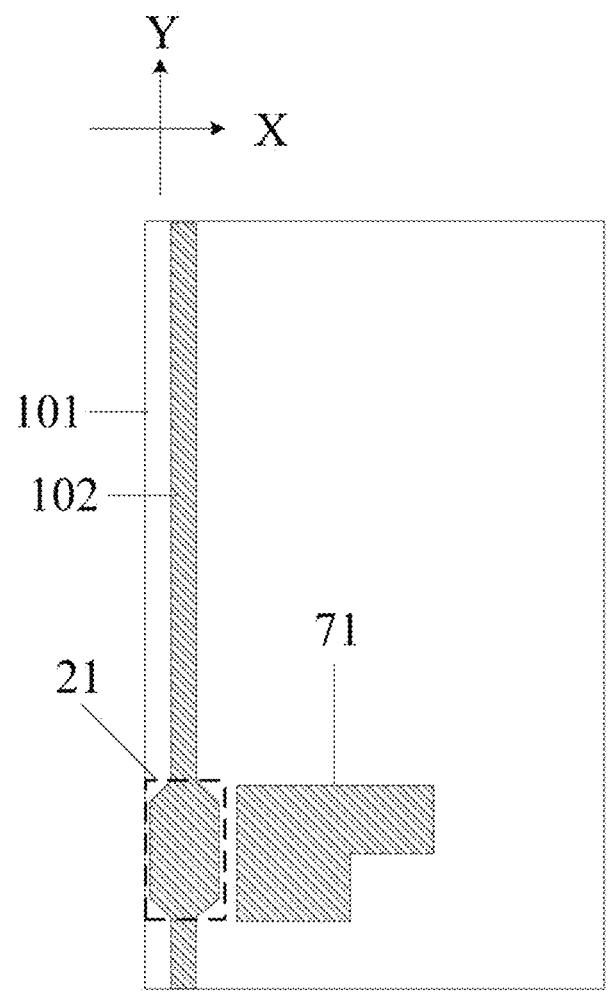
FIG. 38 is a schematic diagram illustrating a structure of a layer where the data lines are positioned shown in FIG. 36.
Figure 39:
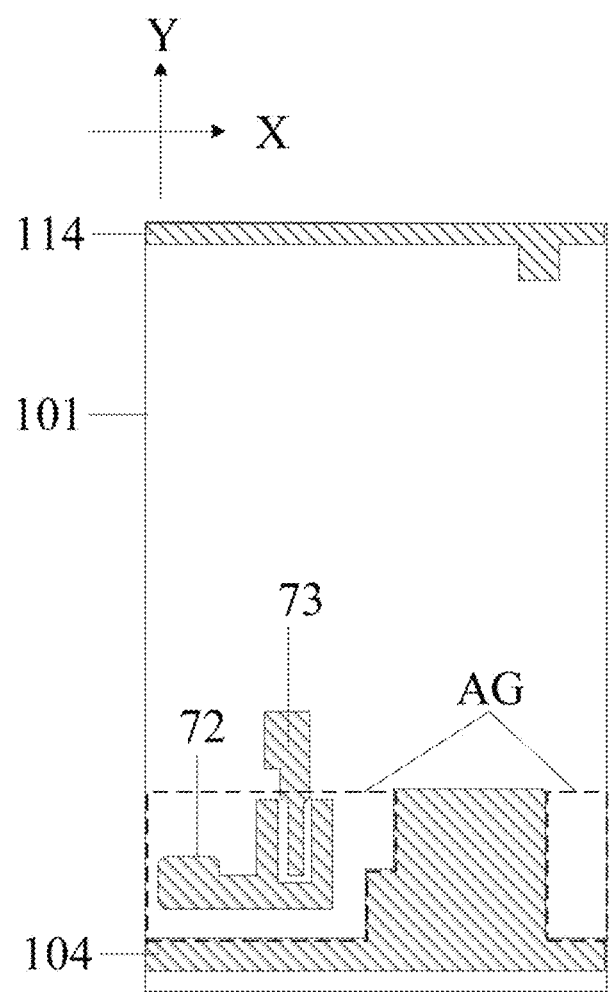
FIG. 39 is a schematic diagram illustrating a structure of a layer where the gate lines are positioned shown in FIG. 36.
Figure 40:
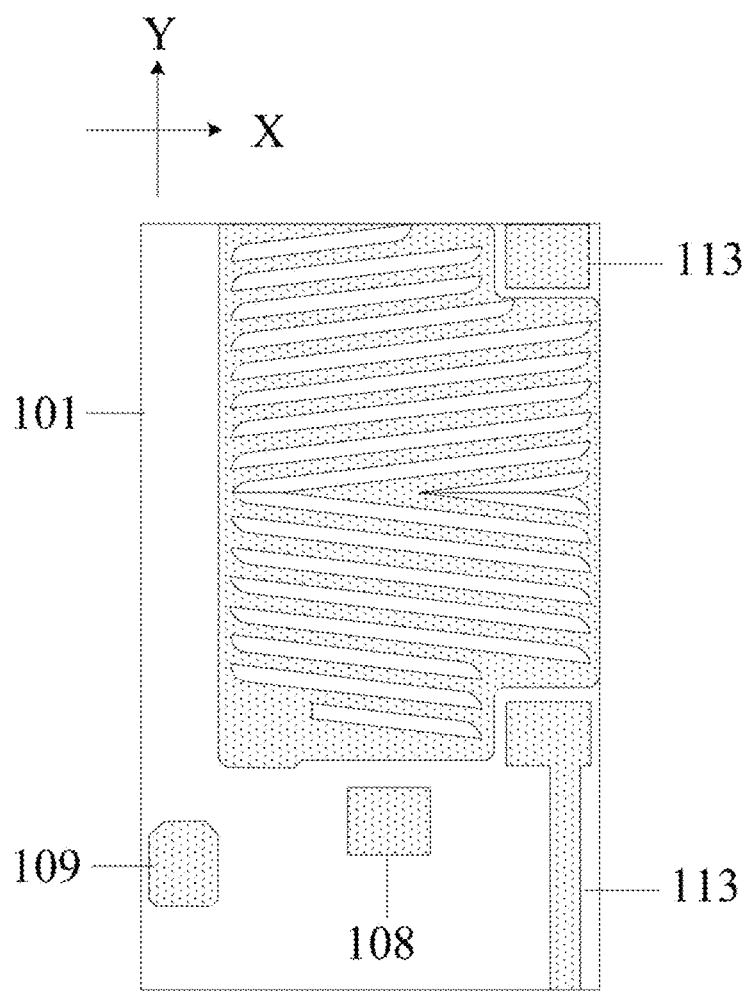
FIG. 40 is a schematic diagram illustrating a structure of a layer where the first electrode is positioned shown in FIG. 36.

In some embodiments, as shown in FIGS. 30 to 40, the first electrode 106 and the second electrode 110 are overlapped in a region surrounded by the data lines 102 and the gate lines 104 to form a liquid crystal capacitor (Clc), the first electrode 106 is a pixel electrode of a slit shape, the second electrode 110 is a common electrode of a block shape, and the orthographic projection of the first electrode 106 on the base substrate 101 and the orthographic projection of the second electrode 110 on the base substrate 101 are both positioned in only the region surrounded by the data lines 102 and the gate lines 104. In some embodiments, as shown in FIG. 31, the second electrode 110 and the data line 102 may be disposed in the same layer with a gap therebetween, and made of different materials. Compared to a scheme where the second electrode 110 and the data line 102 are disposed in different layers, the present disclosure can reduce the number of the film layers, which is favorable for achieving a light and thin product design.

In some embodiments, as shown in FIGS. 41 to 48, the first electrode 106 and the second electrode 110 are disposed in the same layer and made of the same material, and both the first electrode 106 and the second electrode 110 have a comb-shaped structure, and the comb-tooth portions of the first electrode 106 and the comb-tooth portions of the second electrode 110 are alternately arranged, so that the first electrode 106 and the second electrode 110 have side surfaces opposite to each other in the same layer to form a liquid crystal capacitor (Clc). Optionally, the first electrode 106 is a pixel electrode electrically connected to the second electrode 73 of the transistor 107, and the second electrode 110 is a common electrode. In some embodiments, the orthographic projection of the first electrode 106 on the base substrate 101 is only positioned in the region surrounded by the data lines 102 and the gate lines 104, and the orthographic projection of the second electrode 110 on the base substrate 101 is not only positioned in the region surrounded by the data lines 102 and the gate lines 104 but also covers the orthographic projection of most portion of the data line 102 except the widened portion 21 on the base substrate 101, so that the area of the second electrode 110 is larger, and more gaps between the comb-tooth portions can be formed in the second electrode 110 to improve the transmittance and the luminous efficiency. Optionally, the comb-tooth portion of the first electrode 106 and the comb-tooth portion of the second electrode 110 may have a zigzag-shape, for example, a V-shape with an obtuse angle. The extension direction of the remaining portion of the data line 102 other than the widened portion 21 may be the same as the extension direction of the comb-tooth portion, in which case, the extension direction Y of the data line 102 in the present disclosure refers to the overall extension direction of the data line 102, i.e., the column direction.

Figure 6:
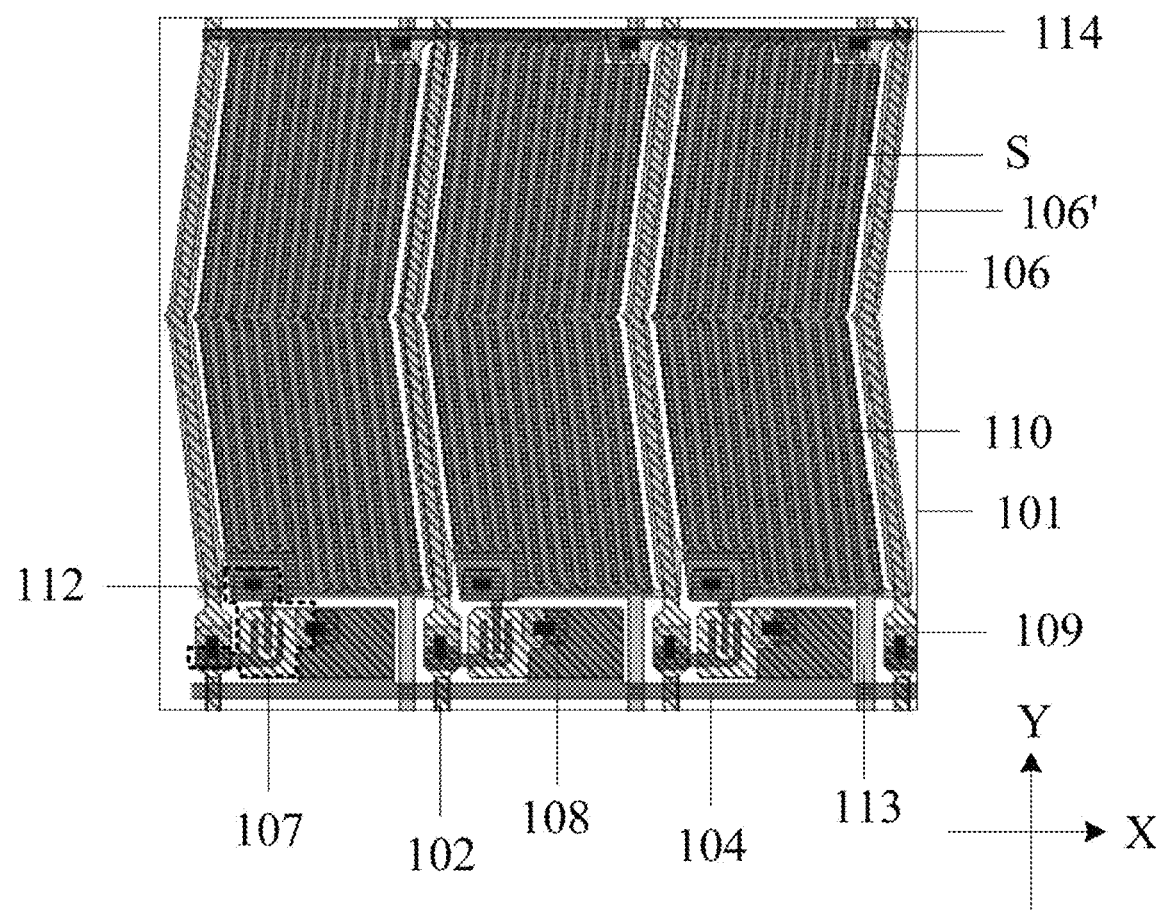
FIG. 6 is schematic diagram illustrating another structure of the display substrate according to an embodiment of the present disclosure.
Figure 7:
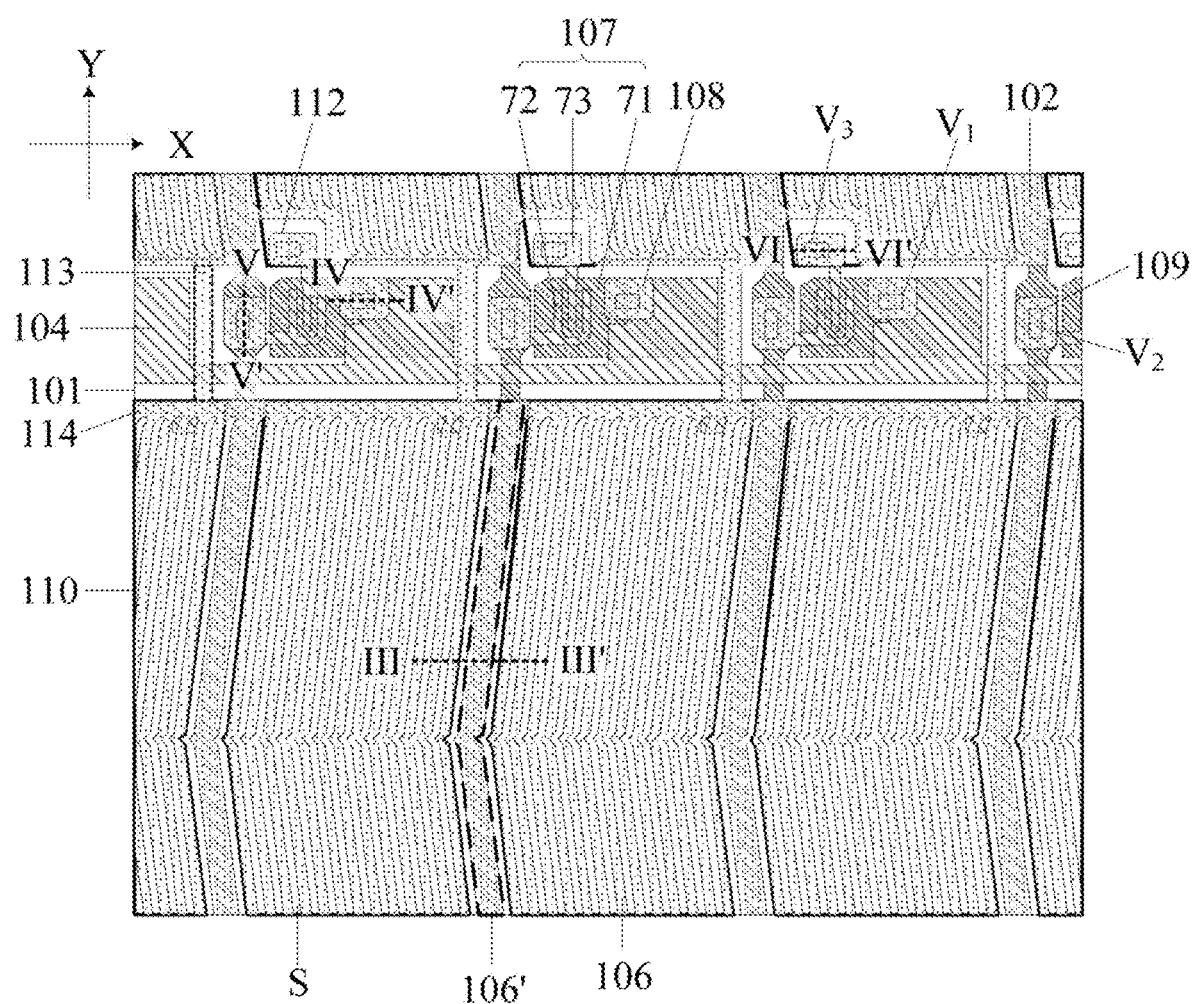
FIG. 7 is schematic diagram illustrating another structure of the display substrate according to an embodiment of the present disclosure.
Figure 41:
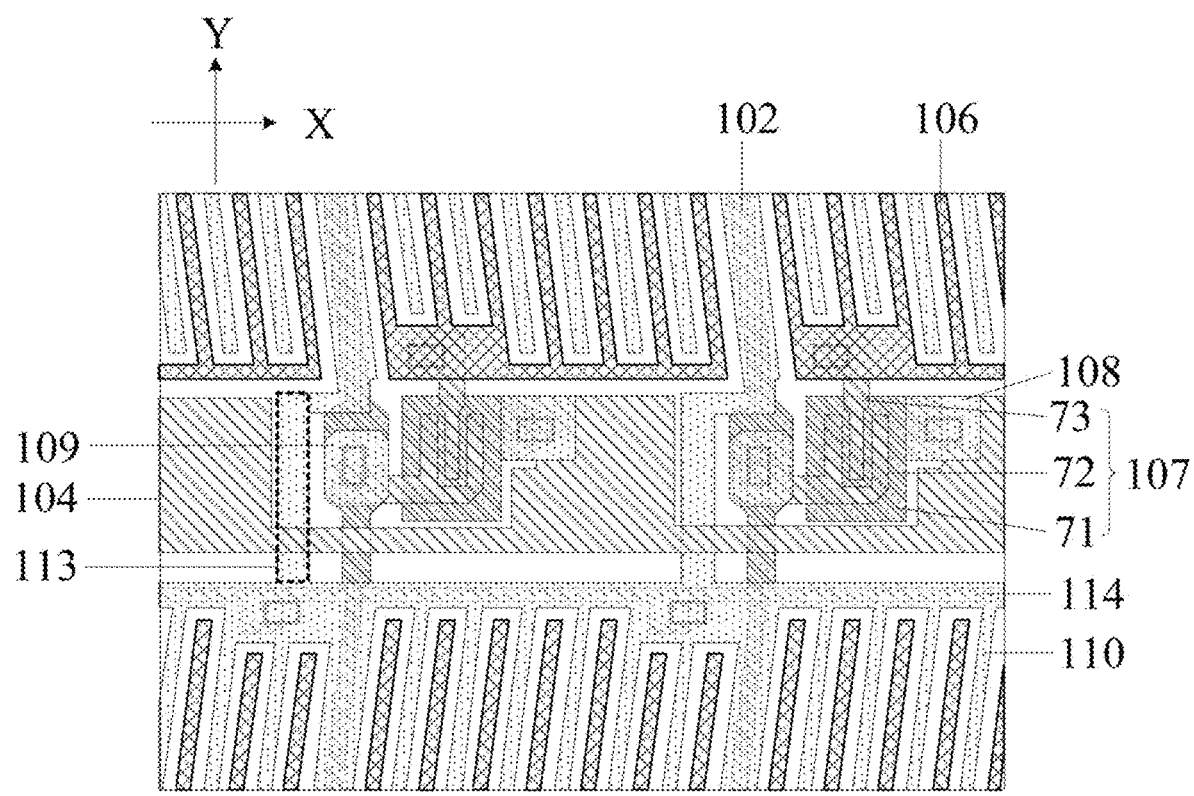
FIG. 41 is a schematic diagram illustrating another structure of the display substrate according to an embodiment of the present disclosure.
Figure 42:
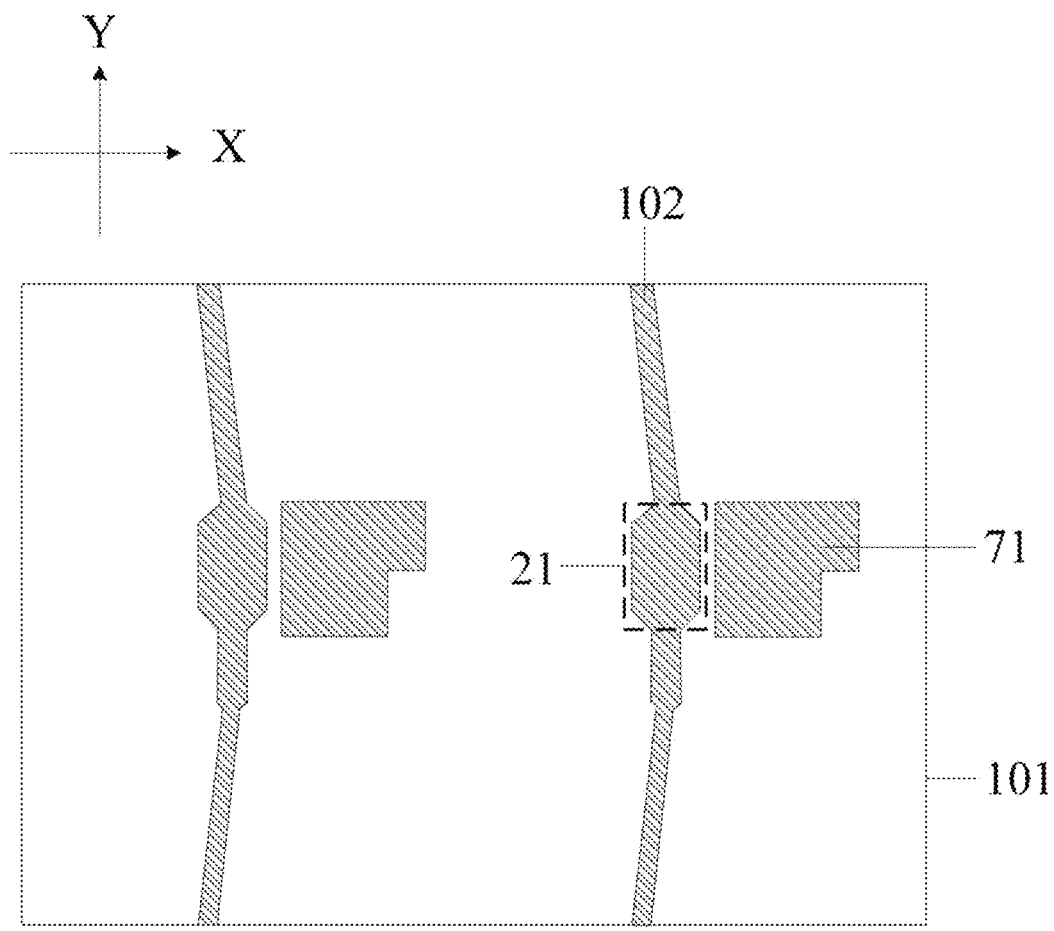
FIG. 42 is a schematic diagram illustrating a structure of a layer where the data lines are positioned shown in FIG. 41.
Figure 43:
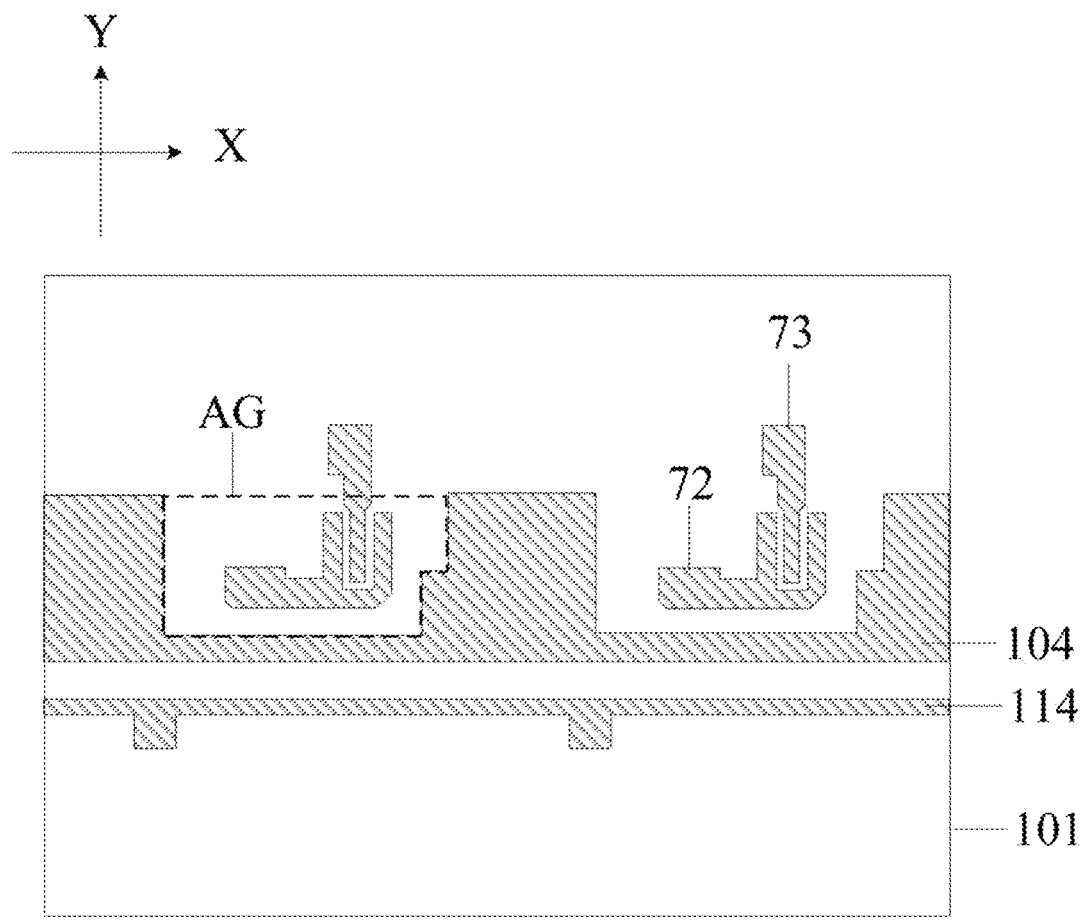
FIG. 43 is a schematic diagram illustrating a structure of a layer where the gate lines are positioned shown in FIG. 41.
Figure 44:
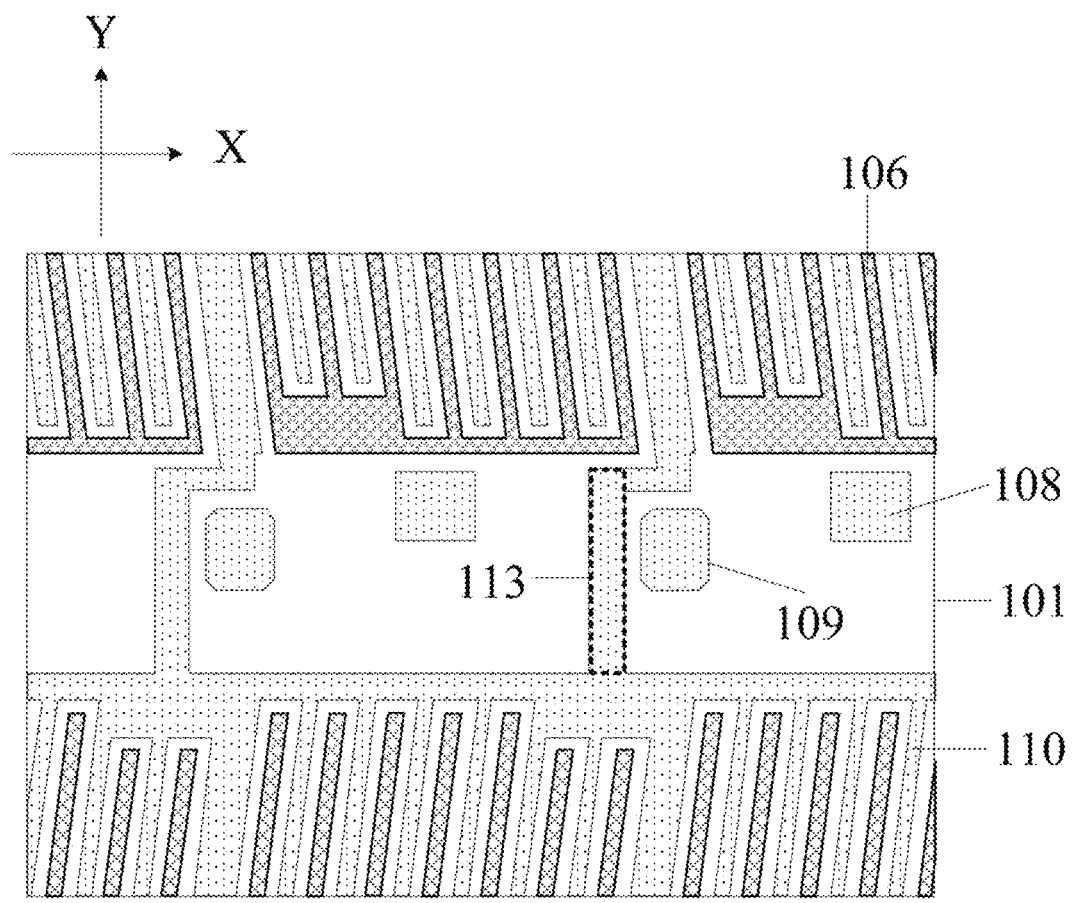
FIG. 44 is a schematic diagram illustrating a structure of a layer where the first electrode is positioned shown in FIG. 41.
Figure 45:
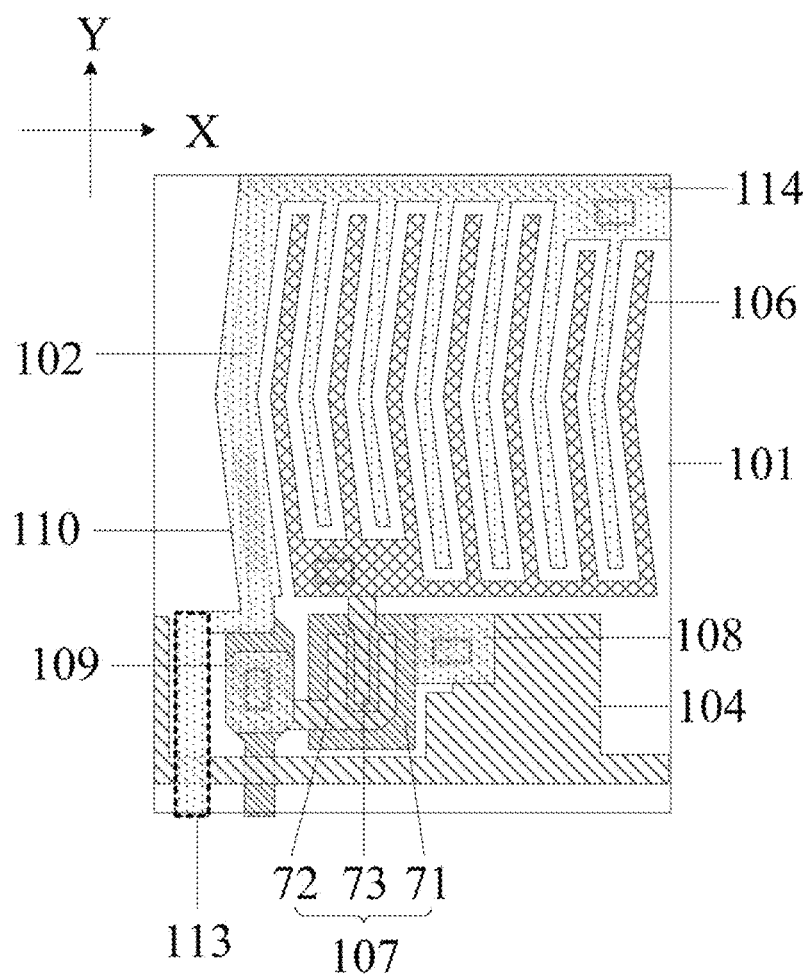
FIG. 45 is a schematic diagram illustrating another structure of the display substrate according to an embodiment of the present disclosure.
Figure 46:
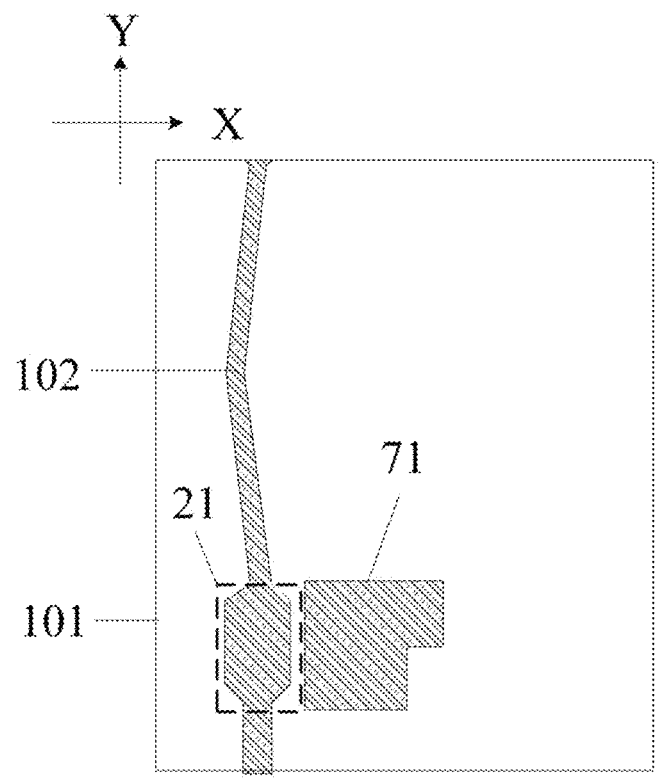
FIG. 46 is a schematic diagram illustrating a structure of a layer where the data lines are positioned shown in FIG. 48.
Figure 47:
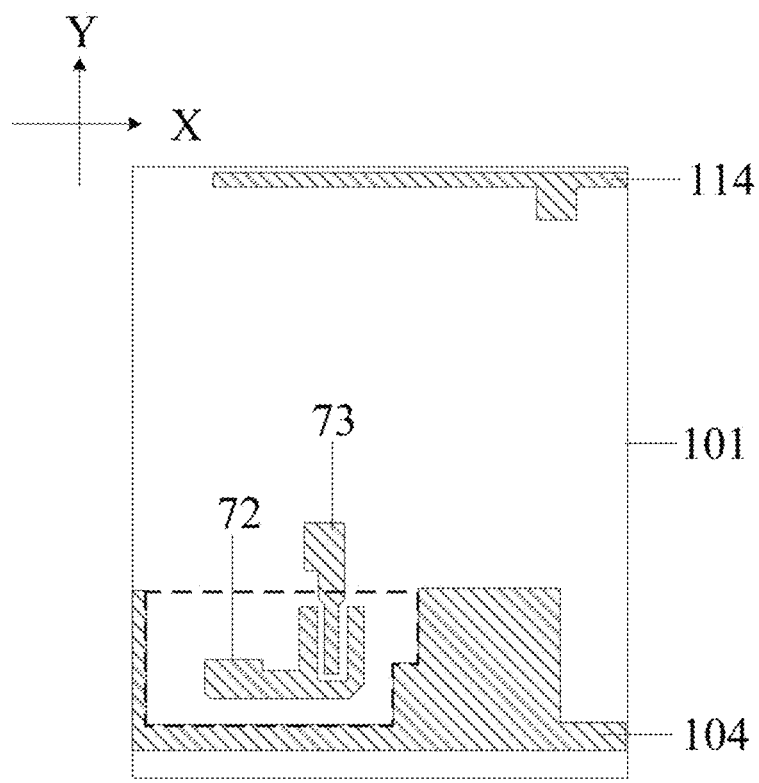
FIG. 47 is a schematic diagram illustrating a structure of a layer where the gate lines are positioned shown in FIG. 48.
Figure 48:
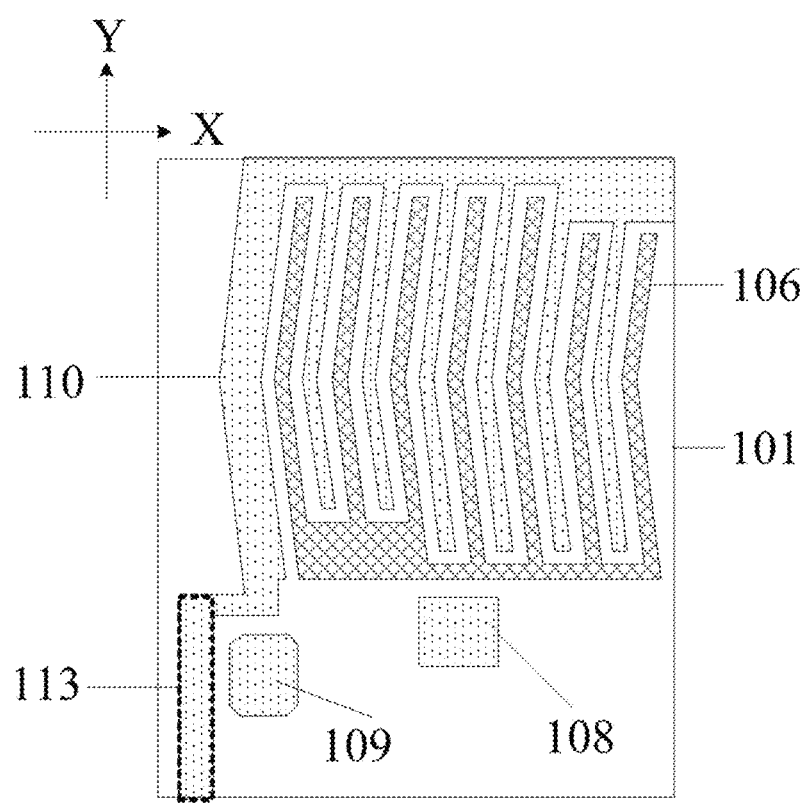
FIG. 48 is a schematic diagram illustrating a structure of a layer where the first electrode is positioned shown in FIG. 48.
Figure 49:
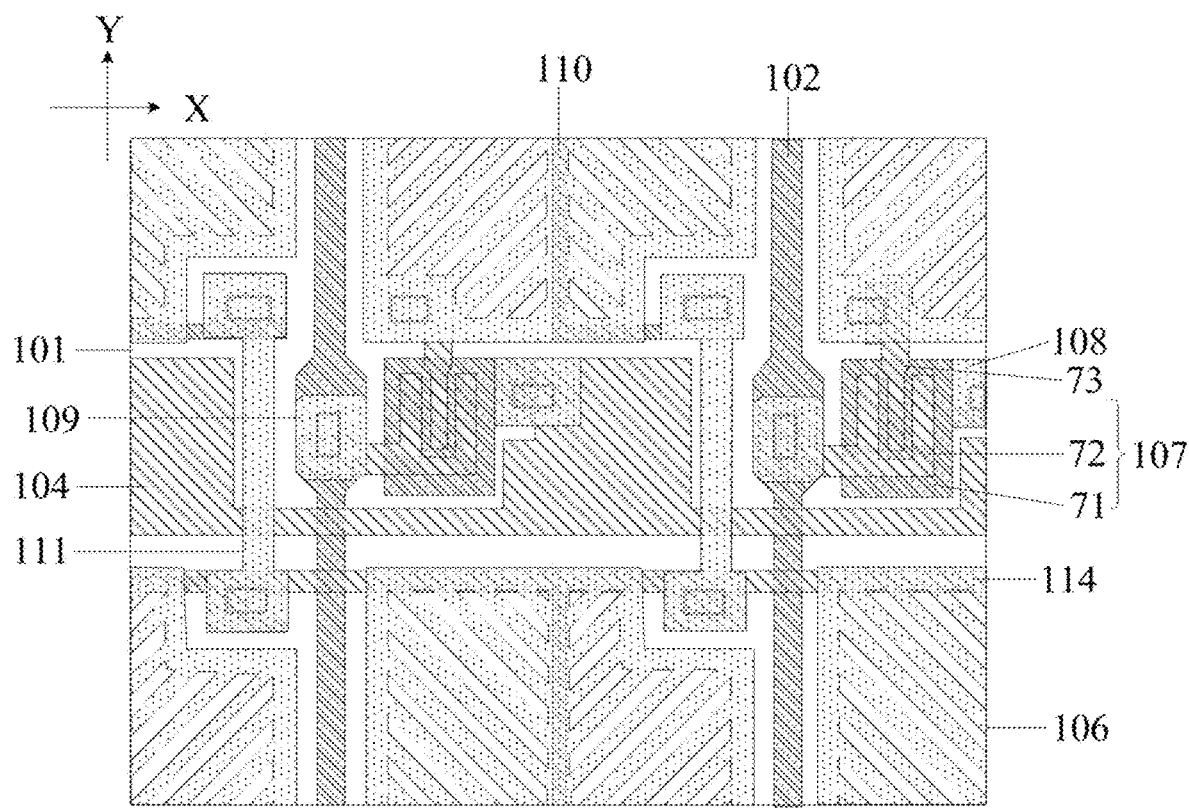
FIG. 49 is a schematic diagram illustrating another structure of the display substrate according to an embodiment of the disclosure.
Figure 50:
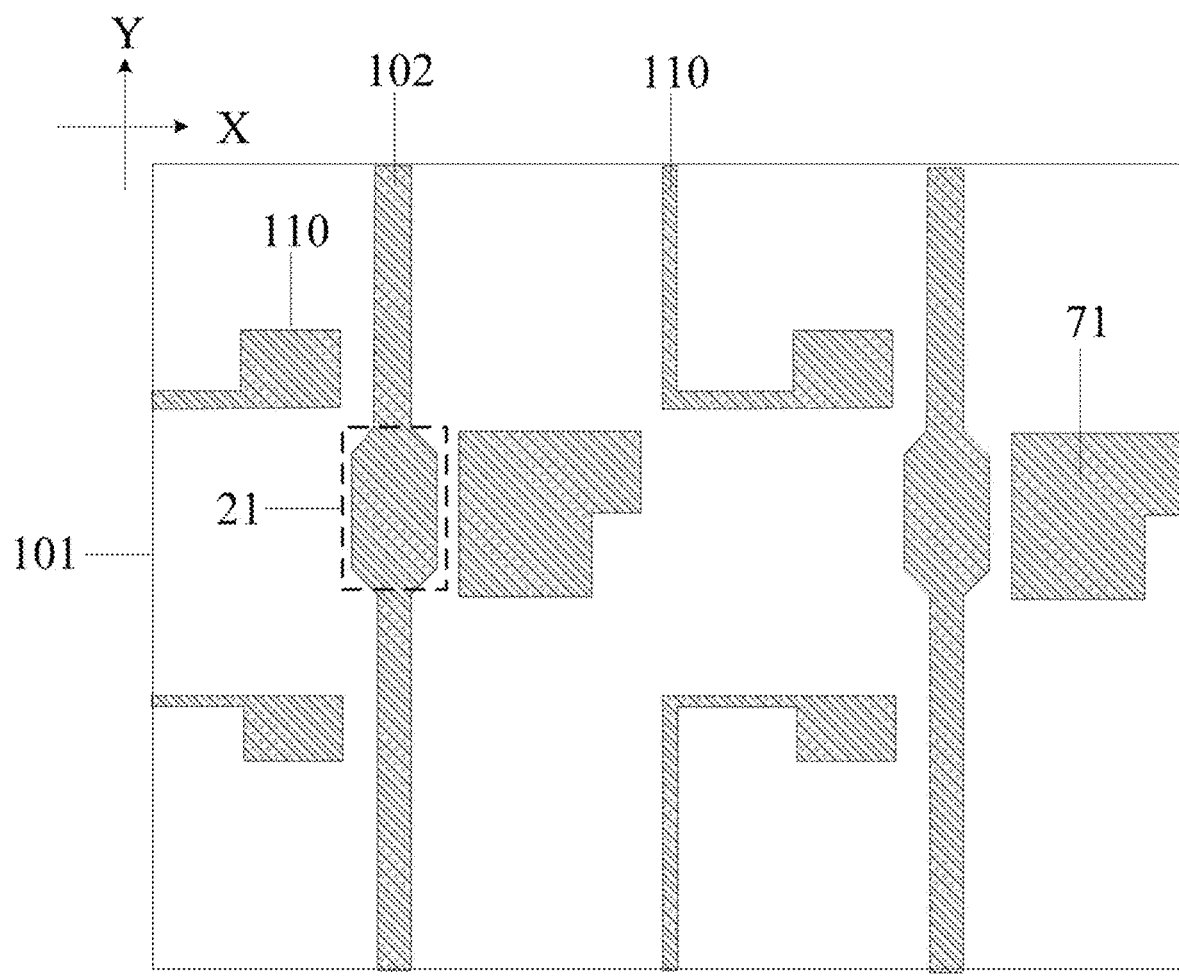
FIG. 50 is a schematic diagram illustrating a structure of a layer where the data lines are positioned shown in FIG. 49.
Figure 51:
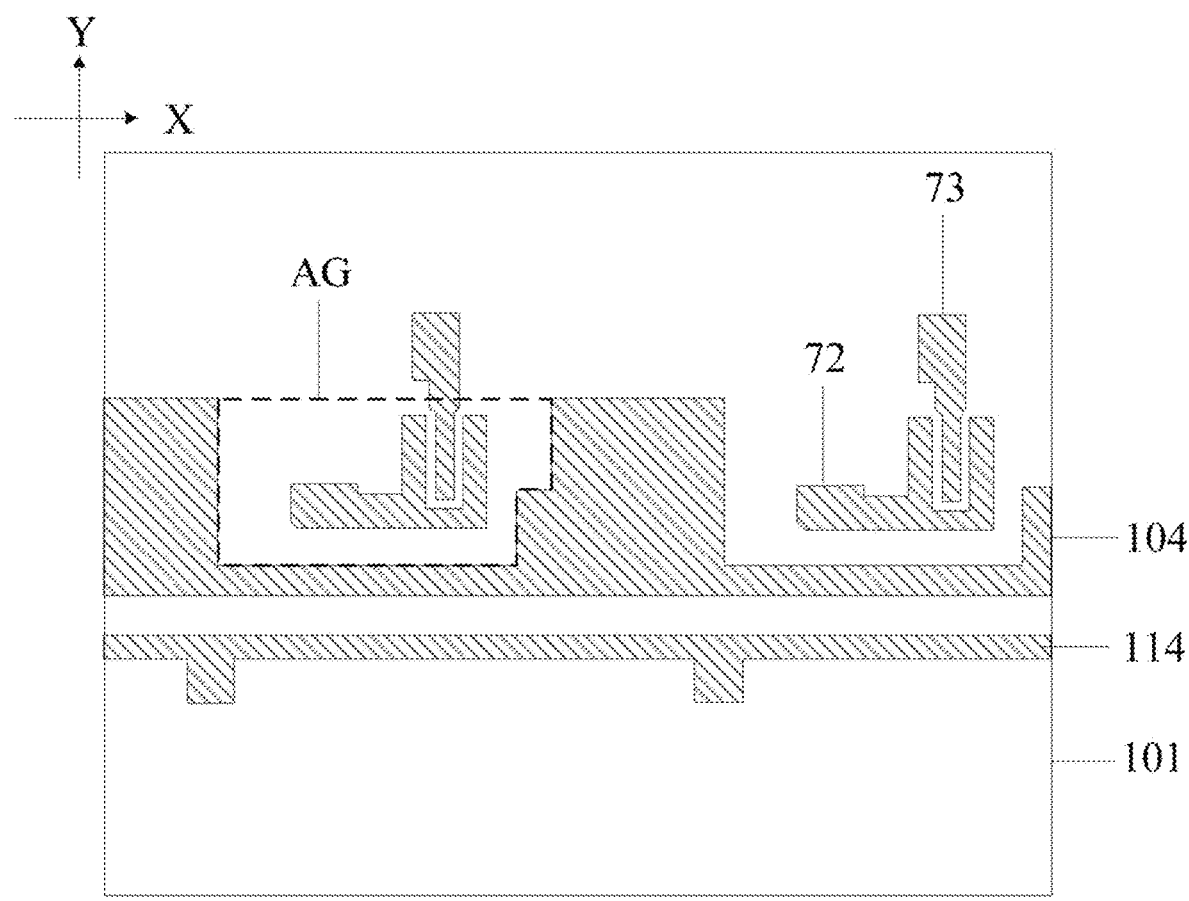
FIG. 51 is a schematic diagram illustrating a structure of a layer where the gate lines are positioned shown in FIG. 49.
Figure 52:
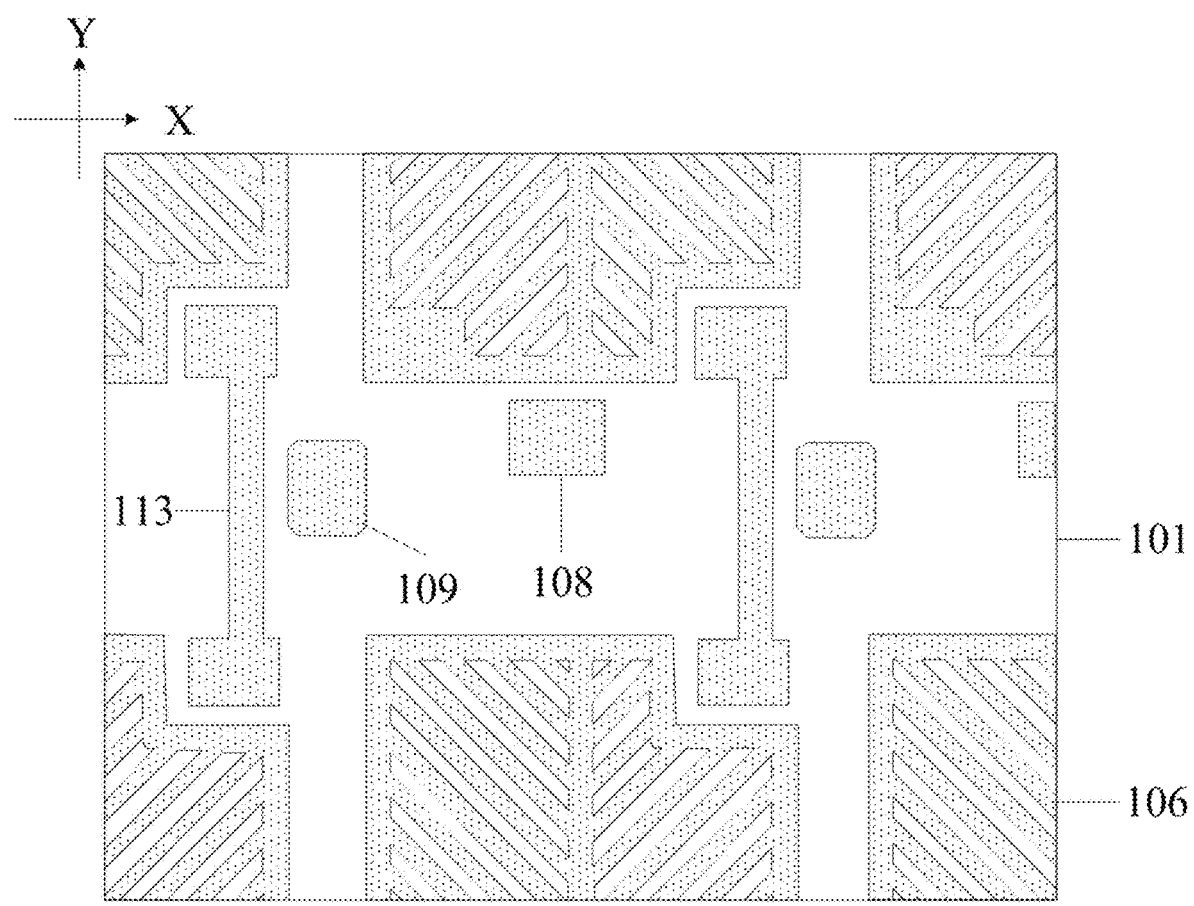
FIG. 52 is a schematic diagram illustrating a structure of a layer where the first electrode is positioned shown in FIG. 49.
Figure 53:
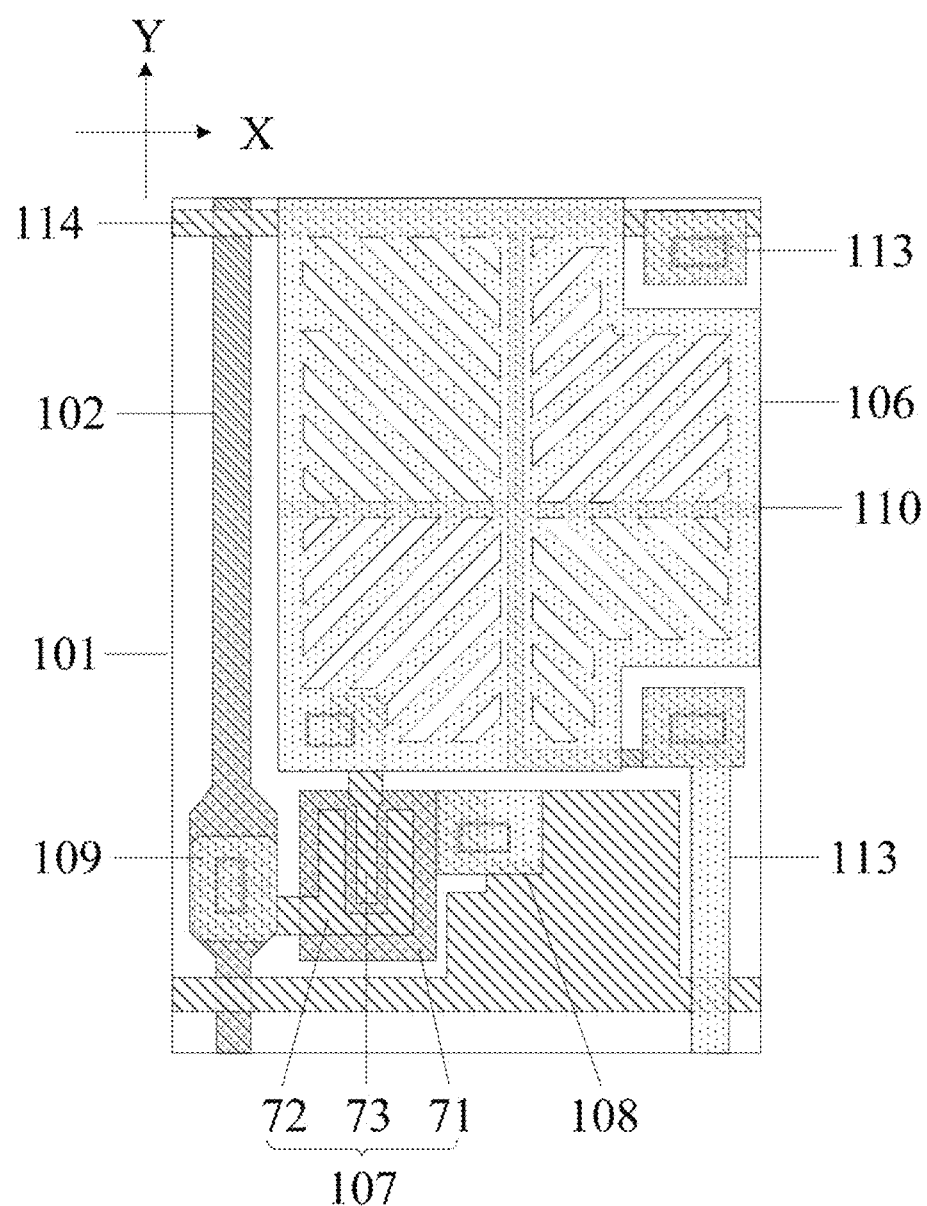
FIG. 53 is a schematic diagram illustrating another structure of the display substrate according to an embodiment of the present disclosure.
Figure 54:
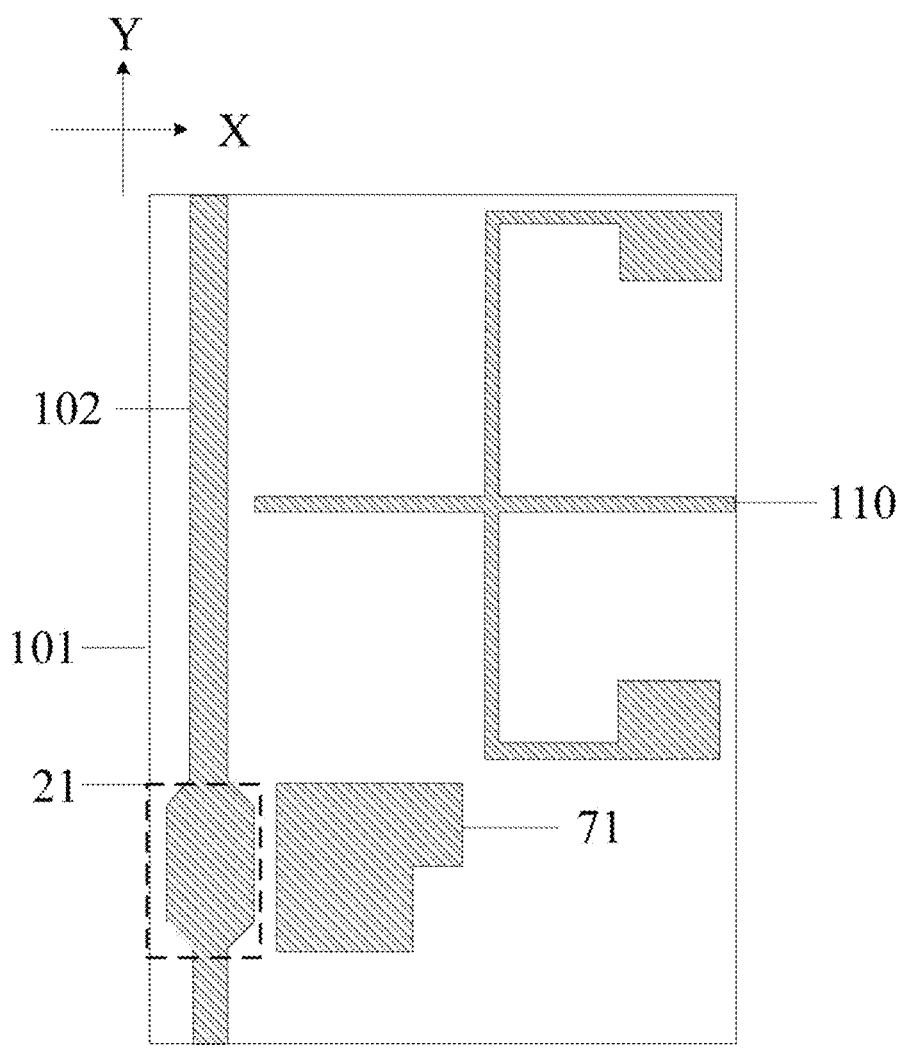
FIG. 54 is a schematic diagram illustrating a structure of a layer where the data lines are positioned shown in FIG. 53.
Figure 55:
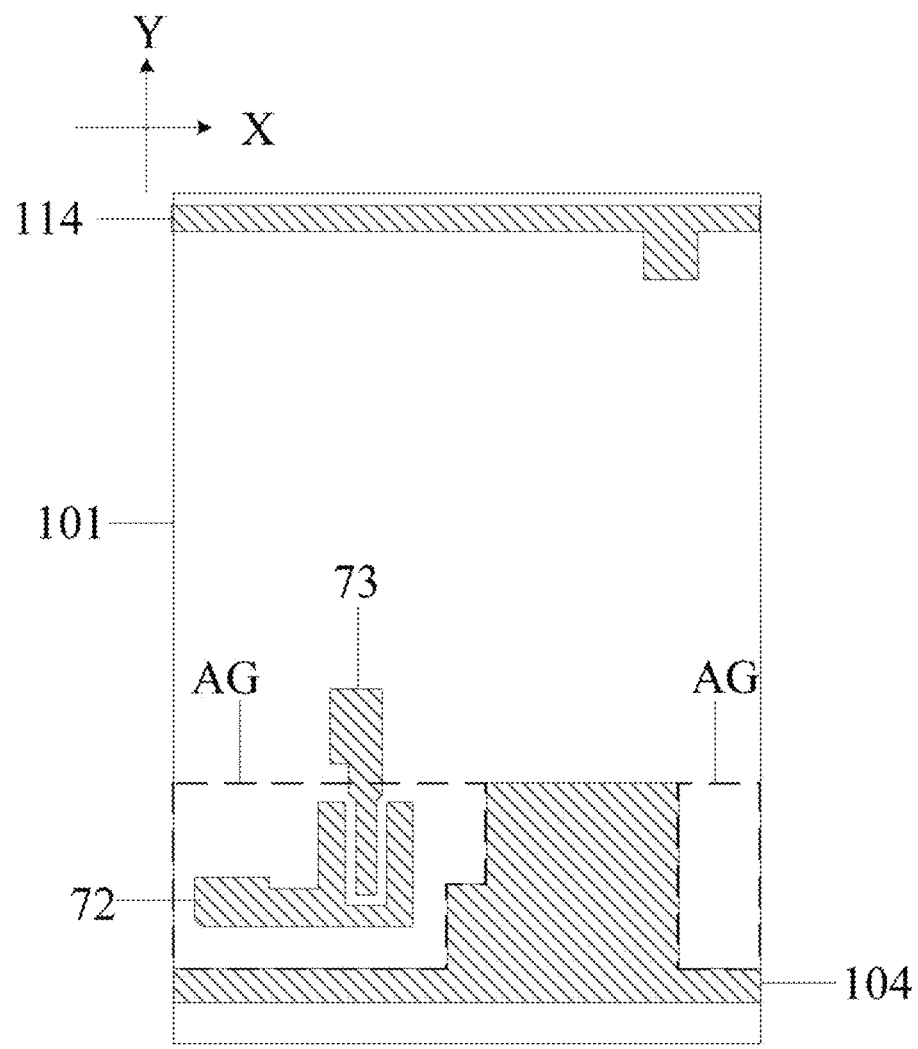
FIG. 55 is a schematic diagram illustrating a structure of a layer where the gate lines are positioned shown in FIG. 53.
Figure 56:
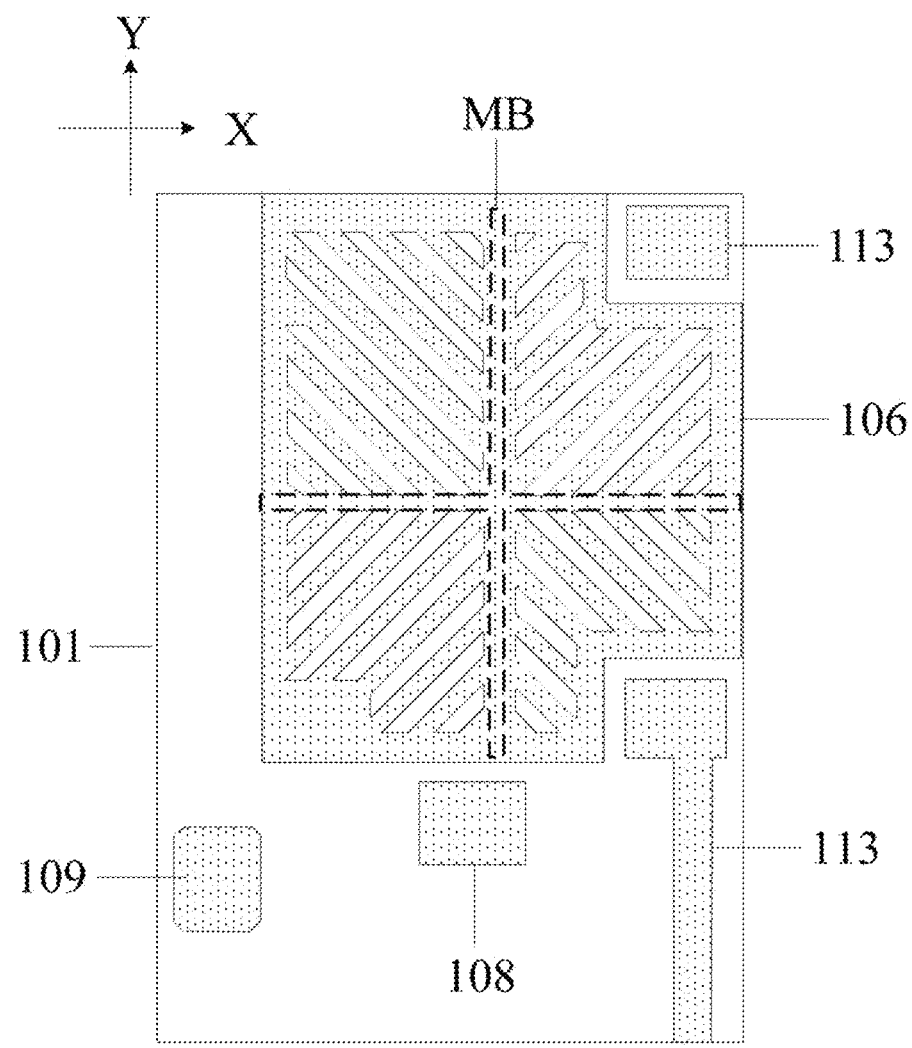
FIG. 56 is a schematic diagram illustrating a structure of a layer where the first electrode is positioned shown in FIG. 53.

Optionally, in FIGS. 5 to 7, 30 and 41, the common electrodes (i.e., the first electrodes 106 in FIGS. 5 to 7 and the second electrodes 110 in FIGS. 30 and 41) of the same row in the extension direction of the gate line 104 may be further connected by a second connection line 114 to reduce the overall resistance of the common electrodes, and meanwhile, the voltage uniformity and stability of the common electrodes in the extension direction X of the gate line 104 are improved. In some embodiments, as shown in FIGS. 13, 17, 21, 34, 39, 43, 47, 51, and 55, the second connection line 114 may be disposed in the same layer and made of the same material as the gate line 104. In the case where the common electrode is the first electrode 106 (as shown in FIGS. 5 to 7), or the common electrode is the second electrode 110 and is disposed in the same layer and made of the same material as the first electrode 106 (as shown in FIG. 41), the second connection line 114 is electrically connected to the common electrode through a via penetrating through the second insulating layer 105. In the case where the common electrode is the second electrode 110 (as shown in FIG. 30), the second connection line 114 is electrically connected to the common electrodes of the same row in the extension direction X of the gate line 104 through the a connection line 113 that is disposed in the same layer and made of the same material as the first electrode 106.

In some embodiments, as shown in FIGS. 49 to 56, the first electrode 106 and the second electrode 110 constitute a storage capacitor (Cst). The first electrode 106 is a slit electrode, and the first electrode 106 includes a cross-shaped main body portion MB, the slits of the first electrode 106 are distributed in four regions defined by the cross-shaped main body portion MB, the extension directions of slits in two regions in the diagonal direction are the same, and the extension directions of slits in two adjacent regions are intersected. The second electrode 110 and the data line 102 are disposed in the same layer and made of the same material, and the orthographic projection of the second electrode 110 on the base substrate 101 and an orthographic projection of the cross-shaped main body MB on the base substrate 101 are overlapped. In some embodiments, second electrodes 110 of the same row in the extension direction X of the gate line 104 may be electrically connected through the first connection line 113, so as to reduce the overall resistance of the second electrodes 110, and meanwhile, the voltage uniformity and stability of the second electrodes 110 in the extension direction X of the gate line 104 are improved.

Figure 57:
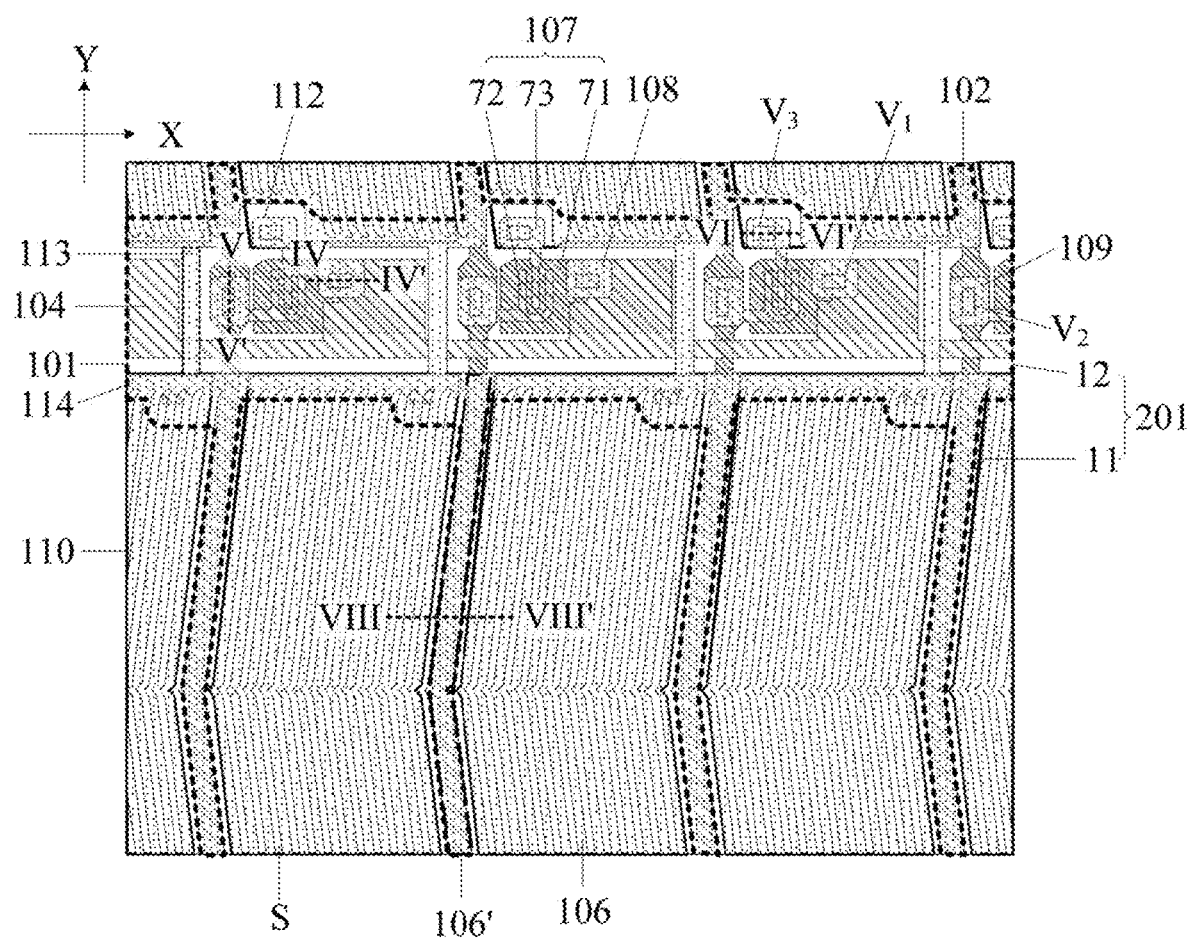
FIG. 57 is a schematic diagram illustrating a structure of a display panel according to an embodiment of the present disclosure.
Figure 58:
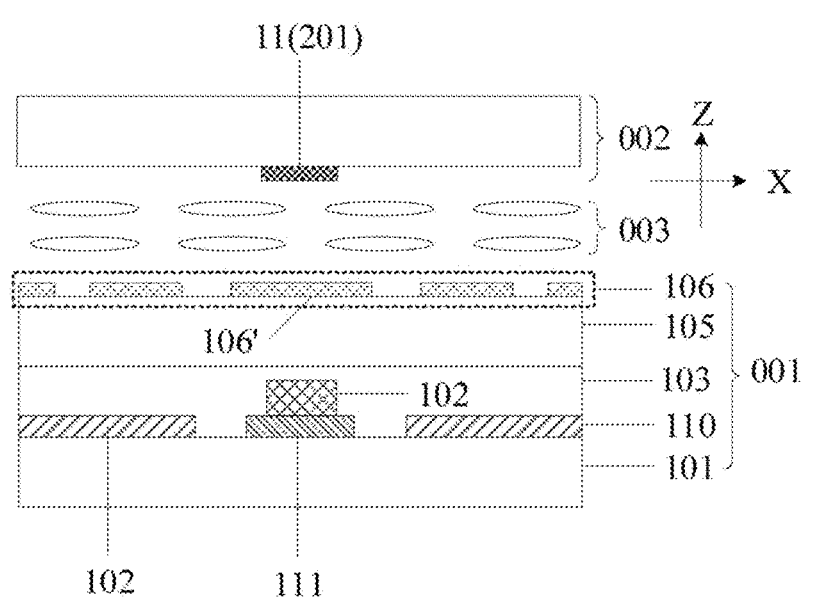
FIG. 58 is a cross-sectional view taken along line VIII-VIII' in FIG. 57.

Based on the same inventive concept, an embodiment of the present disclosure provides a display panel. As shown in FIGS. 57 and 58, the display panel includes a display substrate 001 and an opposite substrate 002 that are oppositely arranged, and a liquid crystal layer 003 positioned between the display substrate 001 and the opposite substrate 002, the display substrate 001 being the display substrate 001 according to the embodiment of the present disclosure. Since the problem-solving principle of the display panel is similar to that of the display substrate, the implementation of the display panel according to the embodiment of the present disclosure can refer to the implementation of the display substrate according to the embodiment of the present disclosure, and repeated descriptions are omitted.

In some embodiments, in the display panel according to the embodiment of the present disclosure, as shown in FIGS. 57 and 58, the first electrode 106 includes an electrode strip 106', an orthographic projection of the electrode strip 106' and the orthographic projection of the data line 102 are overlapped. The opposite substrate 002 includes a black matrix 201, the black matrix 201 including a first black matrix strip 11 extending along the extension direction Y of the data line 102. The orthographic projection of a part of the first black matrix strip 11 on the base substrate 101 is positioned within the orthographic projection of the electrode strip 106' on the base substrate 101. Since the location of the electrode strip 106' is a dark region, disposing the first black matrix strip 11 at the electrode strip 106' would not affect the transmittance. Optionally, the width of the first black matrix strip 11 in the extension direction X of the gate line 104 is greater than or equal to 8 µm, so that the problem of cross color at oblique viewing angles is avoided through the black matrix strip 11. In some embodiments, the black matrix 201 may further include a second black matrix strip 12 extending along the extension direction X of the gate line 104. Optionally, the orthographic projection of the gate line 104 on the base substrate 101 is positioned within an orthographic projection of the second black matrix strip 12 on the base substrate 101.

In some embodiments, the display panel according to the embodiment of the present disclosure may further include a sealant surrounding the liquid crystal layer 003 between the display substrate 001 and the opposite substrate 002, a first alignment layer positioned on a side of the display substrate close to the liquid crystal layer, a second alignment layer positioned on a side of the opposite substrate close to the liquid crystal layer, a first polarizer positioned on a side of the display substrate 001 away from the liquid crystal layer 003, a second polarizer positioned on a side of the opposite substrate 002 away from the liquid crystal layer 003, and the like, a polarization direction of the first polarizer being perpendicular to a polarization direction of the second polarizer. It should be understood by those skilled in the art that other essential components of the display panel are not described herein, and should not be construed as limitations of the present disclosure.

Based on the same inventive concept, an embodiment of the present disclosure provides a display device including the display panel according to the embodiment of the present disclosure. Since the problem-solving principle of the display device is similar to that of the display panel, the implementation of the display device according to the embodiment of the present disclosure can refer to the implementation of the display panel according to the embodiment of the present disclosure, and repeated descriptions are omitted.

In some embodiments, the display device according to the embodiment of the present disclosure may further include a backlight module, and the display panel is disposed at a light emitting side of the backlight module. The backlight module may be a direct-lit backlight module or an edge-lit backlight module. Optionally, the edge-lit backlight module may include a light bar, and a reflector, a light guide plate, a diffuser, a prism group, and the like that are provided in a stacked manner, the light bar being positioned on a side of the light guide plate in the thickness direction of the light guide. The direct-lit backlight module may include a matrix light source, and a reflector, a diffuser plate, a brightness enhancement film, and the like that are provided in a stacked manner at the light-emitting side of the matrix light source, the reflector including an opening disposed directly opposite to the position of each bead in the matrix light source. The beads in the light bar and the beads in the matrix light source may be light emitting diodes (LEDs), such as micro light emitting diodes (Mini LED, Micro LED, etc.).

Like organic light emitting diodes (OLEDs), micro light emitting diodes of sub-millimeter or even micron scale belong to self-light emitting devices. Like organic light emitting diodes, the micro light emitting diodes of sub-millimeter or even micron scale have a series of advantages of high brightness, ultralow delay, overlarge visual angle and the like. Furthermore, since the inorganic light emitting diodes emit light based on a metal semiconductor with more stable property and lower resistance, the inorganic light emitting diodes have the advantages of lower power consumption, higher high temperature resistance and low temperature resistance and longer service life, as compared to organic light emitting diodes that emit light based on organic matters. When the micro light emitting diodes serve as a backlight source, a more precise dynamic backlight effect can be achieved; the problem of glare between bright and dark regions on a screen caused by traditional dynamic backlight can be solved while effectively improving the screen brightness and the contrast ratio, thereby optimizing the visual experience.

In some embodiments, the display device according to the embodiment of the present disclosure may be a projector, a 3D printer, a virtual reality device, a mobile phone, a tablet computer, a television, a display, a notebook computer, a digital photo frame, a navigator, an intelligent watch, a fitness wrist strap, a personal digital assistant and any other product or component with a display function. The display device includes and is not limited to a radio frequency unit, a network module, an audio output & input unit, a sensor, a display unit, a user input unit, an interface unit, a control chip, or the like. Optionally, the control chip is a central processing unit, a digital signal processor, a system on chip (SoC), or the like. For example, the control chip may further include a memory, a power module, and the like, and power supply and signal input and output functions are realized through additionally arranged wires, signal lines, and the like. For example, the control chip may also include a hardware circuit, a computer executable code, and the like. The hardware circuit may include a conventional Very Large Scale Integration (VLSI) circuit or gate array, and conventional semiconductors such as logic chips, transistors, or other discrete components; the hardware circuit may also include a field-programmable gate array, programmable array logic, a programmable logic device, or the like. In addition, it may be understood by those skilled in the art that the above-described structure does not constitute a limitation on the above-described display device according to the embodiments of the present disclosure, in other words, the above-described display device according to the embodiments of the present disclosure may include more or less components than the components described above, or some components may be combined, or different component arrangements may be provided.

While the disclosure has described preferred embodiments, it will be understood that various changes and modifications may be made to the disclosed embodiments by those skilled in the art without departing from the spirit and scope of the disclosed embodiments. Thus, if such modifications and variations of the embodiments of the present disclosure are within the scope of the claims of the present disclosure and their equivalents, the present disclosure is also intended to encompass such modifications and variations.

What is claimed is:

1. A display substrate, comprising: a base substrate; a plurality of data lines on the base substrate; a first insulating layer on a side of a layer where the plurality of data lines are positioned away from the base substrate; a plurality of gate lines a side of the first insulating layer away from the layer where the plurality of data lines are positioned, wherein an extension direction of each of the plurality of gate lines and an extension direction of each of the plurality of data lines are intersected; a second insulating layer on a side of a layer where the plurality of gate lines are positioned away from the first insulating layer; and a first electrode on a side of the second insulating layer away from the layer where the plurality of gate lines are positioned, wherein at least a portion of an orthographic projection of the first electrode on the base substrate is within an region surrounded by orthographic projections of two adjacent ones of the plurality of data lines on the base substrate and orthographic projections of two adjacent ones of the plurality of gate lines on the base substrate, wherein the display substrate further comprises: a transistor, wherein a gate of the transistor is in the same layer and made of the same material as the data line, a first electrode and a second electrode of the transistor are in the same layer and made of the same material as the gate line; the gate of the transistor is electrically connected to the gate line, and the first electrode of the transistor is electrically connected to the data line; and a first transfer electrode, which is in the same layer and made of the same material as the first electrode; wherein the first transfer electrode is electrically connected to the gate of the transistor through a first via penetrating through the first insulating layer and the second insulating layer, and is electrically connected to the gate line through a second via penetrating through the second insulating layer.

2. The display substrate of claim 1, wherein an orthographic projection of a portion of each of at least a part of the plurality of data lines on the base substrate is within the orthographic projection of the first electrode on the base substrate, the first electrode comprises a plurality of slits, and a minimum distance between each of the plurality of slits and the data line in the extension direction of the gate line is greater than 1.5 pm.

3. The display substrate of claim 1, wherein an orthographic projection of the first via on the base substrate is within an orthographic projection of the gate of the transistor on the base substrate, an aperture of the first via in a direction away from the base substrate is gradually increased, the first via comprises a first port close to the base substrate, a length of the first port in the extension direction of the gate line is greater than or equal to 3 pm, and a width of the first port in the extension direction of the data line is greater than or equal to 6 pm, and/or an orthographic projection of the second via on the base substrate is within the orthographic projection of the gate line on the base substrate, an aperture of the second via in the direction away from the base substrate is gradually increased, the second via comprises a second port close to the base substrate, a length of the second port in the extension direction of the gate line is greater than or equal to 3 pm, and a width of the second port in the extension direction of the data line is greater than or equal to 8 pm.

4. The display substrate of claim 1, wherein the gate line comprises a protrusion disposed side arranged by side with the first electrode of the transistor, the orthographic projection of the first via on the base substrate is not overlapped with an orthographic projection of the protrusion on the base substrate, and the orthographic projection of the second via on the substrate is within the orthographic projection of the protrusion on the base substrate, and a minimum distance between the first electrode of the transistor and the protrusion is greater than or equal to 5 pm.

5. The display substrate of claim 4, wherein the gate line comprises a wiring portion that is integrally provided with the protrusion, a line width of the wiring portion in the extension direction of the data line is greater than or equal to 5 pm, and the wiring portion and the protrusion form an accommodating groove, the first electrode of the transistor is in the accommodating groove.

6. The display substrate of claim 5, wherein the orthographic projection of the gate of the transistor on the base substrate is partially overlapped with an orthographic projection of the accommodating groove on the base substrate, and/or wherein the first electrode of the transistor comprises a first subsection extending along the extension direction of the gate line, an orthographic projection of the first subsection on the base substrate is partially overlapped with the orthographic projection of the gate of the transistor on the base substrate, and is not overlapped with the orthographic projection of the data line on the substrate, and a distance between the first subsection and the wiring portion is greater than or equal to 5 pm, and a width of the first subsection in the extension direction of the data line is greater than or equal to 3 pm.

7. The display substrate of claim 1, wherein the first via and the second via are integrally provided as a first through hole, an orthographic projection of the first through hole on the base substrate is within the orthographic projection of the first transfer electrode on the base substrate, and a one-side excess distance of the orthographic projection of the first transfer electrode on the base substrate relative to the orthographic projection of the first through hole on the base substrate in the extension direction of the data line is greater than or equal to 3 pm, and/or, a one-side excess distance of the orthographic projection of the first transfer electrode on the base substrate relative to the orthographic projection of the first through hole on the base substrate in the extension direction of the gate line is greater than or equal to 3 pm, and/or a minimum distance between the orthographic projection of the first electrode of the transistor on the base substrate and the orthographic projection of the first transfer electrode on the base substrate is greater than or equal to 3 pm.

8. The display substrate of claim 1, further comprising a second transfer electrode, which is in the same layer and made of the same material as the first transfer electrode; wherein the second transfer electrode is electrically connected to the data line through a third via penetrating through the first insulating layer and the second insulating layer, and is electrically connected to the first electrode of the transistor through a fourth via penetrating through the second insulating layer.

9. The display substrate of claim 8, wherein the data line comprises a widened portion, an orthographic projection of the third via on the base substrate is within an orthographic projection of the widened portion on the base substrate, an aperture of the third via in a direction away from the base substrate is gradually increased, the third via comprises a third port close to the base substrate, a length of the third port in the extension direction of the gate line is greater than or equal to 6 pm, and a width of the third port in the extension direction of the data line is greater than or equal to 3 pm.

10. The display substrate of claim 9, wherein the first electrode of the transistor comprises a second subsection, an orthographic projection of the second subsection on the base substrate is within the orthographic projection of the widened portion on the base substrate, an orthographic projection of the fourth via on the base substrate is within the orthographic projection of the second subsection on the base substrate, an aperture of the fourth via in the direction away from the base substrate is gradually increased, the fourth via comprises a fourth port close to the base substrate, a length of the fourth port in the extension direction of the date line is greater than or equal to 8 pm, and a width of the fourth port in the extension direction of the data line is greater than or equal to 3 pm, and/or a distance between the widened portion and the gate of the transistor electrically connected to the widened portion is greater than or equal to 4.8 pm, and/or a distance between the widened portion and a gate of a transistor adjacent to and not connected to the widened portion is greater than or equal to 11 pm, and/or an orthographic projection of the second transfer electrode on the base substrate is within the orthographic projection of the widened portion on the base substrate, and/or the gate line comprises a wiring portion having a substantially uniform line width and a protrusion integrally provided with the wiring portion, the wiring portion and the protrusion form an accommodating groove, and the orthographic projection of the widened portion on the base substrate is within an orthographic projection of the accommodating groove on the base substrate, and/or the third via and the fourth via are integrally provided as a second through hole, an orthographic projection of the second through hole on the base substrate is within the orthographic projection of the second transfer electrode on the base substrate, and a one-side excess distance of the orthographic projection of the second transfer electrode on the base substrate relative to the orthographic projection of the second through hole on the base substrate in the extension direction of the data line is greater than or equal to 3 pm, and/or, a one-side excess distance of the orthographic projection of the second transfer electrode on the base substrate relative to the orthographic projection of the second through hole on the base substrate in the extension direction of the gate line is greater than or equal to 3 pm.

11. The display substrate of claim 1, further comprising a second electrode, which forms a capacitor together with the first electrode, wherein the first electrode or the second electrode is the pixel electrode, and the pixel electrode is electrically connected to the second electrode of the transistor, and an orthographic projection of the second electrode on the base substrate is within the region surrounded by the orthographic projections of the two adjacent data lines on the base substrate and the orthographic projections of two adjacent gate lines on the base substrate, and a distance between the orthographic projection of the second electrode on the base substrate and the orthographic projection of the data line on the substrate is greater than or equal to 6.4 pm.

12. The display substrate of claim 11, wherein the second electrode is in the same layer as the data line and is made of a different material from the data line, or the display substrate further comprises a resistance reduction line, which is in the same layer and made of the same material as the second electrode, wherein the resistance reduction line being electrically connected to the data line in a contact manner, and a distance between an orthographic projection of the resistance reduction line on the base substrate and the orthographic projection of the second electrode on the base substrate is greater than or equal to 4.8 pm.

13. The display substrate of claim 11, wherein the second electrode is the pixel electrode, and the display substrate further comprises a third transfer electrode, which is in the same layer and made of the same material as the first electrode; and the third transfer electrode is electrically connected to the second electrode through a fifth via penetrating through the first insulating layer and the second insulating layer, and is electrically connected to the second electrode of the transistor through a sixth via penetrating through the second insulating layer, and/or an orthographic projection of the fifth via on the base substrate is within the orthographic projection of the second electrode on the base substrate, an aperture of the fifth via in a direction away from the base substrate is gradually increased, the fifth via comprises a fifth port close to the base substrate, a length of the fifth port in the extension direction of the gate line is greater than or equal to 3 pm, and a width of the fifth port in the extension direction of the data line is greater than or equal to 6 pm, and/or an orthographic projection of the sixth via on the base substrate is within an orthographic projection of the second electrode of the transistor on the base substrate, an aperture of the sixth via in a direction away from the base substrate is gradually increased, the sixth via comprises a sixth port close to the base substrate, a length of the sixth port in the extension direction of the gate line is greater than or equal to 3 pm, and a width of the sixth port in the extension direction of the data line is greater than or equal to 8 pm, and/or the fifth via and the sixth via are integrally provided as a third through hole, an orthographic projection of the third through hole on the base substrate is within an orthographic projection of the third transfer electrode on the base substrate, and a one-side excess distance of the orthographic projection of the third transfer electrode on the base substrate relative to the orthographic projection of the third through hole on the base substrate in the extension direction of the data line is greater than or equal to 3 pm, and/or, a one-side excess distance of the orthographic projection of the third transfer electrode on the base substrate relative to the orthographic projection of the third through hole on the base substrate in the extension direction of the gate line is greater than or equal to 3 pm, and/or the first electrode comprises an avoidance slot, the third transfer electrode is in the avoidance slot, and a distance between the third transfer electrode and the avoidance slot is greater than or equal to 4 pm.

14. The display substrate of claim 11, further comprising a connection line, which is in the same layer and made of the same material as the first electrode, and the connection line is electrically connected to a non-pixel electrode in the extension direction of the data line, the gate line comprises a wiring portion having a substantially uniform line width and a protrusion integrally provided with the wiring portion, the wiring portion and the protrusion form an accommodating groove, and the connection line crosses over the accommodating groove along the extension direction of the data line, a distance between an orthographic projection of the connection line on the base substrate and an orthographic projection of the protrusion closest to the wiring portion on the base substrate is greater than or equal to 3 pm, and/or a distance between the orthographic projection of the connection line on the base substrate and the orthographic projection of the data line closest to the connection line on the base substrate is greater than or equal to 4 pm, and/or a width of the connection line in the extension direction of the gate line is greater than or equal to 4 pm.

15. The display substrate of claim 1, wherein a gate of the transistor is electrically connected to the gate line through a seventh via penetrating through the first insulating layer, and/or the first electrode of the transistor is electrically connected to the data line through an eighth via penetrating through the first insulating layer, and/or the first insulating layer has a thickness greater than or equal to 3500 A and less than or equal to 4500 A, and the second insulating layer has a thickness greater than or equal to 2000 A and less than or equal to 7000 A.

16. A display panel, comprising: a display substrate and an opposite substrate which are opposite to each other, and a liquid crystal layer between the display substrate and the opposite substrate, wherein the display substrate is the display substrate of claim 1.

17. The display panel of claim 16, wherein the first electrode comprises an electrode strip, an orthographic projection of the electrode strip is overlapped with the data line; the opposite substrate comprises a black matrix, the black matrix comprises a black matrix strip extending in the extension direction of the data line, an orthographic projection of a part of the black matrix strip on the base substrate is within the orthographic projection of the electrode strip on the base substrate, and a width of the black matrix strip in the extension direction of the gate line is greater than or equal to 8 pm.

18. A display device, comprising the display panel of claim 16.

* * * * *